(12) United States Patent
Park

(10) Patent No.: US 12,178,115 B2
(45) Date of Patent: Dec. 24, 2024

(54) LIGHT EMITTING ELEMENT, DISPLAY DEVICE INCLUDING THE SAME, AND METHOD FOR MANUFACTURING THE LIGHT EMITTING ELEMENT

(71) Applicant: Samsung Display Co., Ltd., Yongin-si (KR)

(72) Inventor: Junwoo Park, Daejeon (KR)

(73) Assignee: Samsung Display Co., Ltd., Yongin-si (KR)

( * ) Notice: Subject to any disclaimer, the term of this patent is extended or adjusted under 35 U.S.C. 154(b) by 304 days.

(21) Appl. No.: 17/450,160

(22) Filed: Oct. 6, 2021

(65) Prior Publication Data

US 2022/0216416 A1 Jul. 7, 2022

(30) Foreign Application Priority Data

Jan. 4, 2021 (KR) .................. 10-2021-0000336

(51) Int. Cl.
*H10K 85/10* (2023.01)
*H10K 71/13* (2023.01)
(Continued)

(52) U.S. Cl.
CPC ......... *H10K 85/114* (2023.02); *H10K 71/135* (2023.02); *H10K 50/11* (2023.02);
(Continued)

(58) Field of Classification Search
CPC ............................. H10K 85/114; H10K 50/11
See application file for complete search history.

(56) References Cited

U.S. PATENT DOCUMENTS 10,418,145 B2 9/2019 Lessing et al.
10,717,870 B1 7/2020 Gubbels et al.
(Continued)

FOREIGN PATENT DOCUMENTS

CN 111354860 A 6/2020
KR 10-1103488 B1 1/2012
(Continued)

OTHER PUBLICATIONS

Jiajie Liang, et al., Elastomeric polymer light-emitting devices and displays, Article in Nature Photonics, Sep. 22, 2013, pp. 817-824, vol. 7, Macmillan Publishers Limited.

*Primary Examiner* — Joshua Benitez Rosario
*Assistant Examiner* — Christopher A Culbert
(74) *Attorney, Agent, or Firm* — Lewis Roca Rothgerber Christie LLP

(57) ABSTRACT

A light emitting element includes a first electrode, a hole transport region on the first electrode, an emission layer on the hole transport region and containing a light emitting polymer compound derived from a mixture of a polyphenylene vinylene-based compound having a weight average molecular weight of about $1.3 \times 10^6$ to about $1.6 \times 10^6$ and an organic compound represented by Formula 1, and a second electrode on the emission layer, wherein, the mixture contains the polyphenylene vinylene-based compound and the organic compound in a molar ratio of about 9:1 to about 8:2, and the light emitting element may thus include an emission layer having improved flexibility and strength.

Formula 1

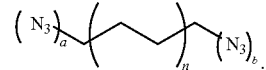

15 Claims, 13 Drawing Sheets

(51) Int. Cl.
    *H10K 50/11*    (2023.01)
    *H10K 50/15*    (2023.01)
    *H10K 50/16*    (2023.01)
    *H10K 50/17*    (2023.01)
    *H10K 71/00*    (2023.01)

(52) U.S. Cl.
    CPC ............ *H10K 50/15* (2023.02); *H10K 50/16* (2023.02); *H10K 50/171* (2023.02); *H10K 71/00* (2023.02)

(56) References Cited

U.S. PATENT DOCUMENTS

| | | | |
|---|---|---|---|
| 2003/0008991 A1* | 1/2003 | Holmes | C08G 61/02 |
| | | | 526/260 |
| 2011/0163304 A1* | 7/2011 | Pan | G03G 7/008 |
| | | | 257/E51.027 |
| 2016/0141541 A1* | 5/2016 | Noda | H10K 59/221 |
| | | | 438/46 |
| 2018/0108863 A1* | 4/2018 | Kajiyama | G09G 3/3233 |
| 2019/0140205 A1* | 5/2019 | Cole | H10K 71/12 |
| 2020/0203612 A1 | 6/2020 | Park et al. | |

FOREIGN PATENT DOCUMENTS

| | | |
|---|---|---|
| KR | 10-2062268 B1 | 1/2020 |
| KR | 10-2020-0078804 A | 7/2020 |

\* cited by examiner

LIGHT EMITTING ELEMENT, DISPLAY DEVICE INCLUDING THE SAME, AND METHOD FOR MANUFACTURING THE LIGHT EMITTING ELEMENT

CROSS-REFERENCE TO RELATED APPLICATION

This application claims priority to and the benefit of Korean Patent Application No. 10-2021-0000336, filed on Jan. 4, 2021, the entire content of which is hereby incorporated by reference.

BACKGROUND

1. Field

The present disclosure herein relates to a light emitting element, a display device including the same, and a method for manufacturing the light emitting element.

2. Description of Related Art

Various suitable kinds (e.g., types) of display devices utilized for multimedia devices such as a television set, a mobile phone, a tablet computer, a navigation system, and/or a game console are being developed. In such display devices, a so-called self-luminescent element (or light emitting element) is utilized which accomplishes display by causing an organic compound-containing light emitting material to emit light.

In addition, in recent years, to make sure that display devices are flexible, it is required that light emitting elements be equipped with flexibility. That is, in order to provide flexible display devices, it is desirable to have flexible light emitting elements. Accordingly, research has been variously conducted in order to achieve the flexibility of the light emitting elements.

SUMMARY

Aspects according to one or more embodiments of the present disclosure are directed toward a light emitting element including an emission layer containing a crosslinked polymer to have improved flexibility and strength, and a display device including the same.

Aspects according to one or more embodiments of the present disclosure are directed toward a method for manufacturing a light emitting element including an emission layer having improved flexibility and strength by including a mixture containing a polymer material and a crosslinking agent to form an emission layer.

According to an embodiment of the present disclosure, a light emitting element includes a first electrode, a hole transport region on the first electrode, an emission layer on the hole transport region and including a light emitting polymer compound derived from a mixture of a polyphenylene vinylene-based compound having a weight average molecular weight of about $1.3 \times 10^6$ to about $1.6 \times 10^6$ and an organic compound represented by Formula 1, and a second electrode on the emission layer, wherein, in the mixture, the polyphenylene vinylene-based compound and the organic compound have a molar ratio of about 9:1 to about 8:2.

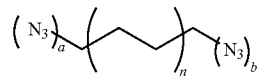

Formula 1

In Formula 1 above, n is an integer of 5 to 20, and a and b are each independently 1 or 2. The light emitting polymer compound may be formed when the polyphenylene vinylene-based compound is cross-linked with the organic compound.

The polyphenylene vinylene-based compound may be poly(1,4-phenylene vinylene).

The hole transport region may include a hole transport polymer compound derived from a mixture of a hole-transporting polymer and an organic compound.

The hole transport region may include a hole injection layer, and a hole transport layer on the hole injection layer, wherein at least one of the hole injection layer or the hole transport layer may include the hole transport polymer compound.

The light emitting element may further include an electron transport region between the emission layer and the second electrode, wherein the electron transport region may include an electron transport polymer compound derived from a mixture of an electron-transporting polymer and an organic compound.

The electron transport region may include an electron injection layer, and an electron transport layer on the electron injection layer, wherein at least one of the electron injection layer or the electron transport layer may include the electron transport polymer compound.

In an embodiment of the present disclosure, a display device includes a base layer and a light emitting element on the base layer, wherein the light emitting element includes a first electrode, a hole transport region on the first electrode, an emission layer on the hole transport region and containing a light emitting polymer compound derived from a mixture of a polyphenylene vinylene-based compound having a weight average molecular weight of about $1.3 \times 10^6$ to about $1.6 \times 10^6$ and an organic compound represented by Formula 1, and a second electrode on the emission layer, and the polyphenylene vinylene-based compound and the organic compound have a molar ratio of about 9:1 to about 8:2.

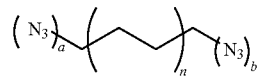

Formula 1

In Formula 1 above, n is an integer of 5 to 20, and a and b are each independently 1 or 2.

The light emitting polymer compound may be formed when the polyphenylene vinylene-based compound and the organic compound are cross-linked.

The polyphenylene vinylene-based compound may be poly(1,4-phenylene vinylene).

The hole transport region may include a hole transport polymer compound derived from a mixture of a hole transport material and an organic compound.

The hole transport region may include a hole injection layer, and a hole transport layer on the hole injection layer, wherein at least one of the hole injection layer or the hole transport layer may include the hole transport polymer compound.

The display device may include a first state having a first area on a plane, and a second state having a second area larger than the first area on a plane.

The display device may have a folded state and a non-folded state, and, in the folded state, the display device may include a folding area that is folded with respect to a folding axis, which is a virtual line extending in a first direction, and a first non-folding area and a second non-folding area spaced apart from each other in a second direction crossing the first direction with respect to the folding area.

The emission layer may have flexibility.

In an embodiment of the present disclosure, a method for manufacturing a light emitting element includes providing a first electrode, forming a hole transport region on the first electrode, providing a mixture containing a polyphenylene vinylene-based compound and an organic compound represented by Formula 1 in a molar ratio of about 9:1 to about 8:2 on the hole transport region to form an emission layer, and forming a second electrode on the emission layer.

[Formula 1]

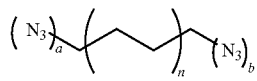

In Formula 1 above, n is an integer of 5 to 20, and a and b are each independently 1 or 2.

The forming of the emission layer may include depositing the mixture through inkjet printing.

The forming of the emission layer may include depositing the mixture, and providing heat or ultraviolet light to the mixture.

The providing of heat or ultraviolet light to the mixture may include crosslinking the polyphenylene vinylene-based compound and the organic compound.

The polyphenylene vinylene-based compound may be poly(1,4-phenylene vinylene).

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
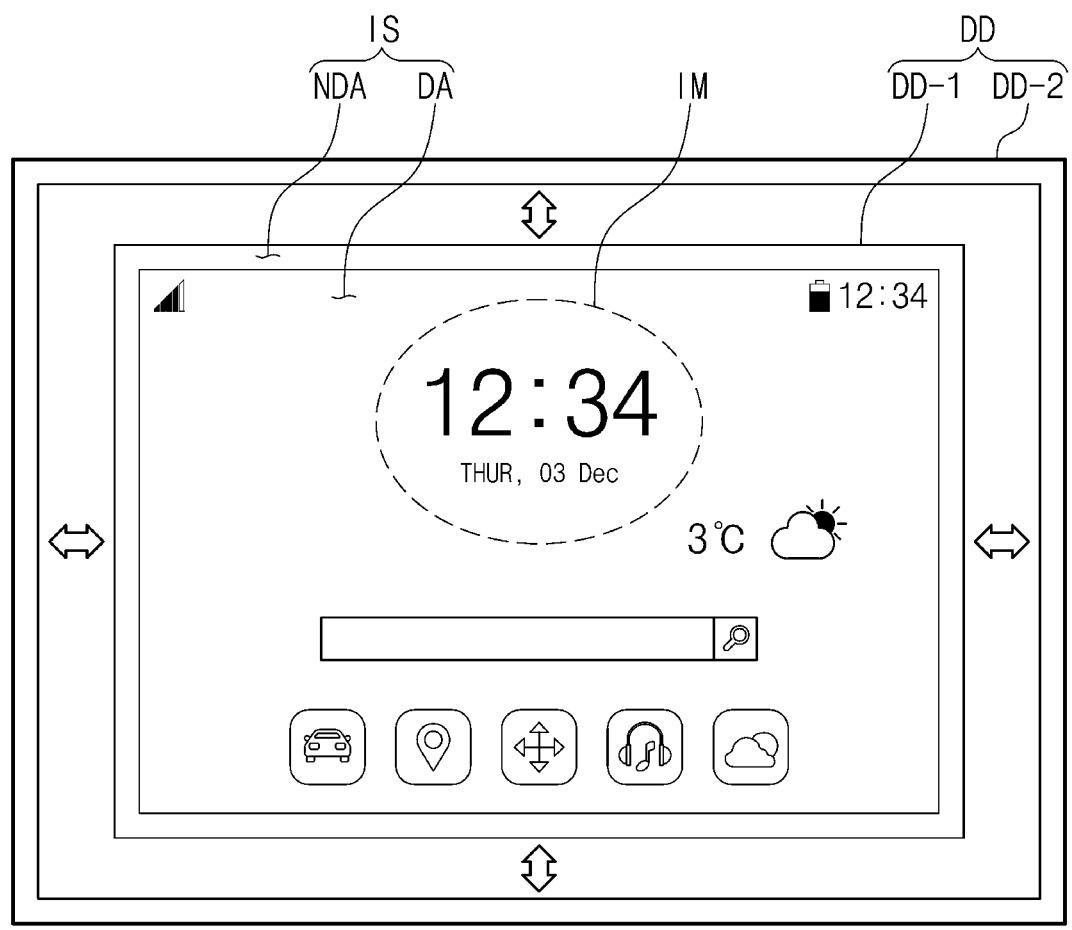
FIG. 1A is a plan view of a display device according to an embodiment.
Figure 1A:
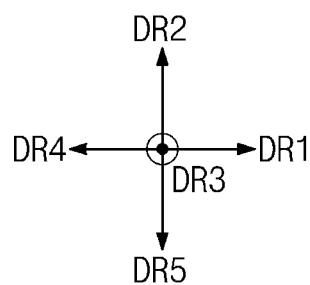

The present disclosure may be modified in many alternate forms, and thus specific embodiments will be illustrated in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it refers to that the element may be directly on (e.g., disposed on)/connected to/coupled to the other element, or that a third element may be disposed therebetween.

In the present description, the term "directly disposed" or "directly on" may indicate that there is no layer, film, region, plate and/or the like added between a portion of a layer, a film, a region, a plate and/or the like and other portions. For example, "directly disposed" or "directly on" may indicate no additional members such as an adhesive member exist between two layers or two members.

Like reference numerals refer to like elements. Also, in the drawings, the thickness, the ratio, and the dimensions of elements may be exaggerated for an effective description of technical contents. The term "and/or," includes any and all combinations of one or more of the associated listed items.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. The terms of a singular form may include plural forms unless the context clearly indicates otherwise.

In addition, terms such as "below," "lower," "above," "upper," and/or the like are used to describe the relationship between the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and should not be interpreted in an ideal or overly formal sense unless they are expressly defined herein.

In the present description, the term "substituted or unsubstituted" may indicate that a group is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or as a phenyl group substituted with a phenyl group.

In the present description, the term "bonded to an adjacent group to form a ring" may indicate that a group is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the present description, the term "an adjacent group" may refer to a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". In addition, two methyl groups in 4,5-dimethylphenanthrene may be interpreted as mutually "adjacent groups".

In the present description, examples of a halogen atom may include a fluorine atom, a chlorine atom, a bromine atom, and an iodine atom.

In the present description, an alkyl group may be a linear, branched or cyclic alkyl group. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the present disclosure is not limited thereto.

In the present description, a hydrocarbon ring group refers to any functional groups or substituents derived from an aliphatic hydrocarbon ring. The hydrocarbon ring group may be a saturated hydrocarbon ring group having 5 to 20 ring-forming carbon atoms.

In the present description, an aryl group refers to any functional groups or substituents derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but the present disclosure is not limited thereto.

In the present description, a fluorenyl group may be substituted, and two substituents may be bonded to each other to form a spiro structure. An example that the fluorenyl group is substituted is as follows. However, the present disclosure is not limited thereto.

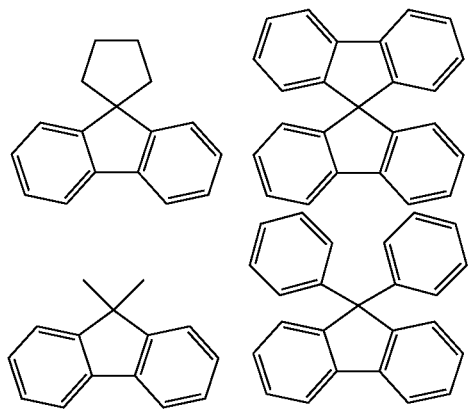

In the present description, a heterocyclic group refers to any functional groups or substituents derived from a ring containing at least one of B, O, N, P, Si, or S as a hetero atom. The heterocyclic group includes an aliphatic heterocyclic group and an aromatic heterocyclic group. The aromatic heterocyclic group may be a heteroaryl group. The aliphatic heterocyclic group and the aromatic heterocyclic group may be monocyclic or polycyclic.

In the present description, the heterocyclic group may contain at least one of B, O, N, P, Si or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and include a heteroaryl group. The number of ring-forming carbon atoms in the heterocyclic group may be 2 to 30, 2 to 20, or 2 to 10.

In the present description, the aliphatic heterocyclic group may contain at least one of B, O, N, P, Si or S as a hetero atom. The number of ring-forming carbon atoms in the aliphatic heterocyclic group may be 2 to 30, 2 to 20, or 2 to 10. Examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but the present disclosure is not limited to thereto In the present description, a heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the present disclosure is not limited thereto.

In the present description, the above description of the aryl group may be applied to an arylene group, except that the arylene group is a divalent group. The above description of the heteroaryl group may be applied to a heteroarylene group, except that the heteroarylene group is a divalent group.

In the present description, a silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but the present disclosure is not limited thereto.

In the present description, the number of carbon atoms in an amino group is not particularly limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but the present disclosure is not limited thereto.

In the present description, the number of carbon atoms in a carbonyl group is not particularly limited, but may be 1 to 40, 1 to 30, or 1 to 20. For example, the carbonyl group may have a structure shown below, but the present disclosure is not limited thereto.

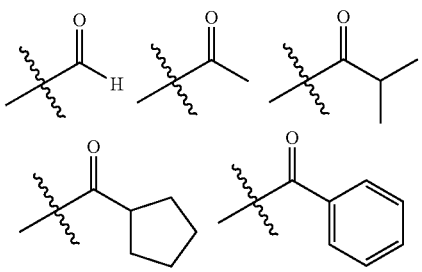

In the present description, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the present description, a thio group may include an alkyl thio group and an aryl thio group. The thio group may refer to a group in which a sulfur atom is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but the present disclosure is not limited to thereto.

In the present description, an oxy group may refer to a group in which an oxygen atom is bonded to an alkyl group or aryl group as defined above. The oxy group may include an alkoxy group and an aryl oxy group. The alkoxy group may be linear, branched or cyclic. The number of carbon atoms in the alkoxy group is not particularly limited, but may be, for example, 1 to 20, or 1 to 10. Examples of the oxy group include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc., but the present disclosure is not limited thereto.

In the present description, a boron group may refer to a group in which a boron atom is bonded to an alkyl group or aryl group as defined above. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., but the present disclosure is not limited thereto.

In the present description, an alkenyl group may be linear or branched. The number of carbon atoms is not particularly limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but the present disclosure is not limited thereto.

In the present description, the number of carbon atoms in an amine group is not particularly limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., but the present disclosure is not limited thereto.

In the present description, examples of the alkyl group may include an alkylthio group, an alkyl sulfoxy group, an alkylaryl group, an alkylamino group, an alkyl boron group, an alkyl silyl group, and an alkyl amine group.

In the present description, examples of the aryl group may include an aryloxy group, an arylthio group, an aryl sulfoxy group, an arylamino group, an aryl boron group, an aryl silyl group, and an aryl amine group.

In the present description, a direct linkage may refer to a single bond.

Meanwhile, in the present description,

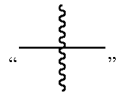

and "—*" each indicate a position to be connected.

Hereinafter, a light emitting element according to an embodiment, a display device including the same, and a method for manufacturing the light emitting element will be described with reference to the accompanying drawings.

FIG. 1A is a perspective view of a display device DD according to an embodiment.

FIG. 1A illustrates, as an example, a portable electronic device as the display device DD. However, the display device DD may not only be utilized for large-sized display devices such as a television set, a monitor, and/or an outdoor billboard, but also utilized for small- and/or medium-sized electronic devices such as a personal computer, a laptop computer, a personal digital terminal, a car navigation unit, a game console, a smartphone, a tablet, and/or a camera. In addition, these are merely presented as an example, and the display device may thus be adopted for other electronic devices without departing from the subject matter of the present disclosure.

A display surface IS may include a display area DA in which an image IM is displayed, and a non-display area NDA adjacent to the display area DA. The non-display area NDA is an area adjacent to the display area DA, and is an area in which the image IM is not displayed. A bezel area of the display device DD may be defined by the non-display area NDA. In FIG. 1A, a clock window and application icons are presented as an example of the image IM.

The display area DA on which the image IM is displayed may be parallel to a plane defined by a first direction DR1 and a second direction DR2. A fourth direction DR4 indicates a direction opposite to the first direction DR1, and a fifth direction DR5 indicates a direction opposite to the second direction DR2.

A normal direction of the display area DA, that is, a thickness direction of the display device DD is indicated by a third directional axis DR3. A front surface (or an upper surface) and a rear surface (or a lower surface) of respective members are defined by the third directional axis DR3. However, the directions indicated by the first to fifth directional axes DR1, DR2, DR3, DR4, and DR5 are relative concepts, and may thus be changed to other directions. Hereinafter, the first to fifth directions correspond to directions indicated by the first to fifth directional axes DDR1, DR2, DR3, DR4, and DR5, respectively, and are given the same reference numerals.

The display area DA may have a rectangular shape. The non-display area NDA may surround the display area DA. However, the present disclosure is not limited thereto, and the shape of the display area DA and the shape of the non-display area NDA may be relatively designed. In addition, the non-display area NDA may not be present on a front surface of the display device DD.

The display device DD according to an embodiment may extend in at least one of the first, second, fourth, or fifth directions DR1, DR2, DR4, or DR5 due to (e.g., in response to) an external force. For example, the display device DD according to an embodiment may be a stretchable display device. The display device DD according to an embodiment may have a first state DD-1 before being stretched and a second state DD-2 after being stretched in a set or predetermined direction due to an external force. The display device DD may be restored from the second state DD-2 to the first state DD-1. However, this is presented as an example, and the present disclosure is not limited thereto, and for example, the display device DD may be a flexible display device such as a rollable display device and/or a foldable display device.

Figure 1B:
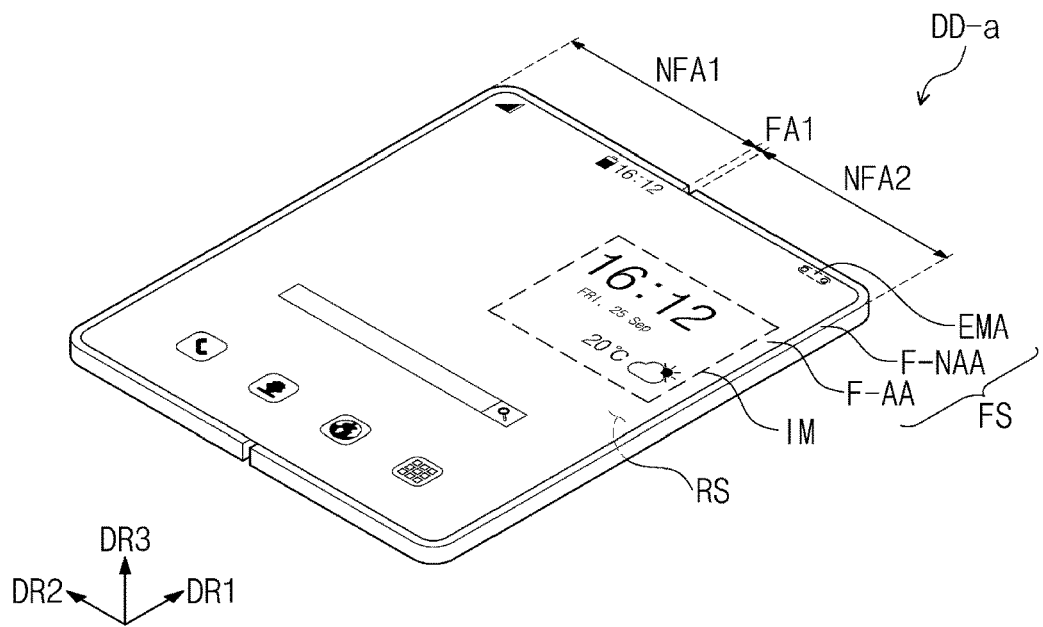
FIG. 1B is a perspective view illustrating a display device in an unfolded state according to an embodiment.
Figure 1C:
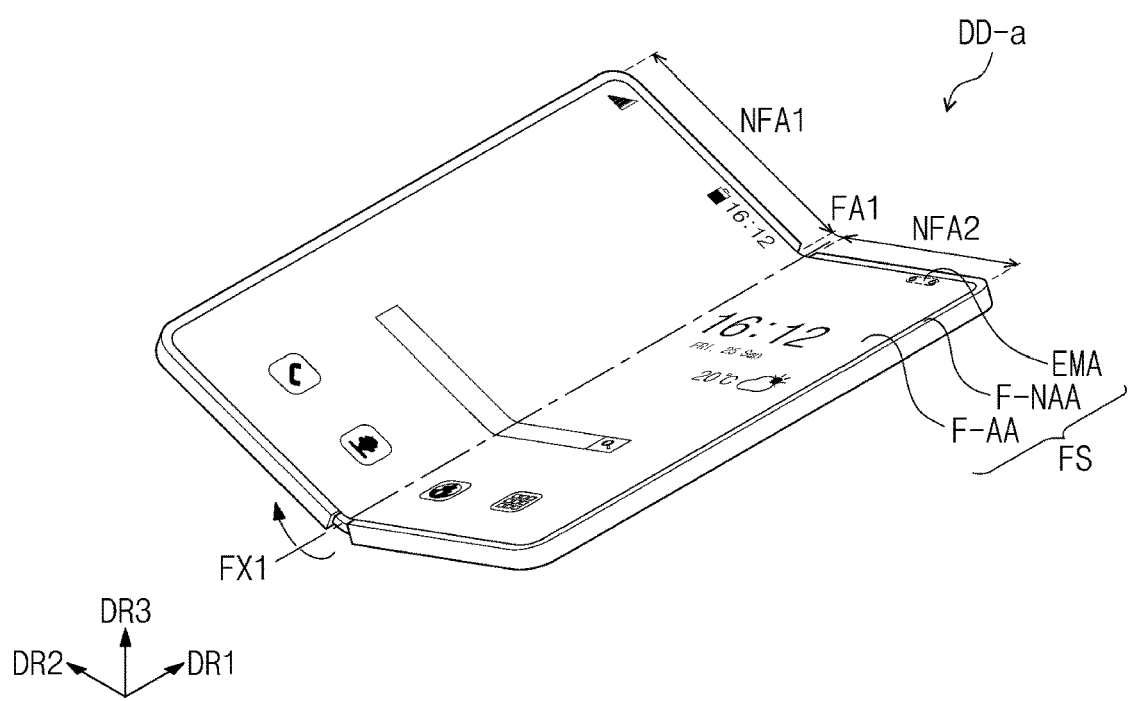
FIG. 1C is a perspective view illustrating an in-folding process of the display device shown in FIG. 1B.
Figure 1D:
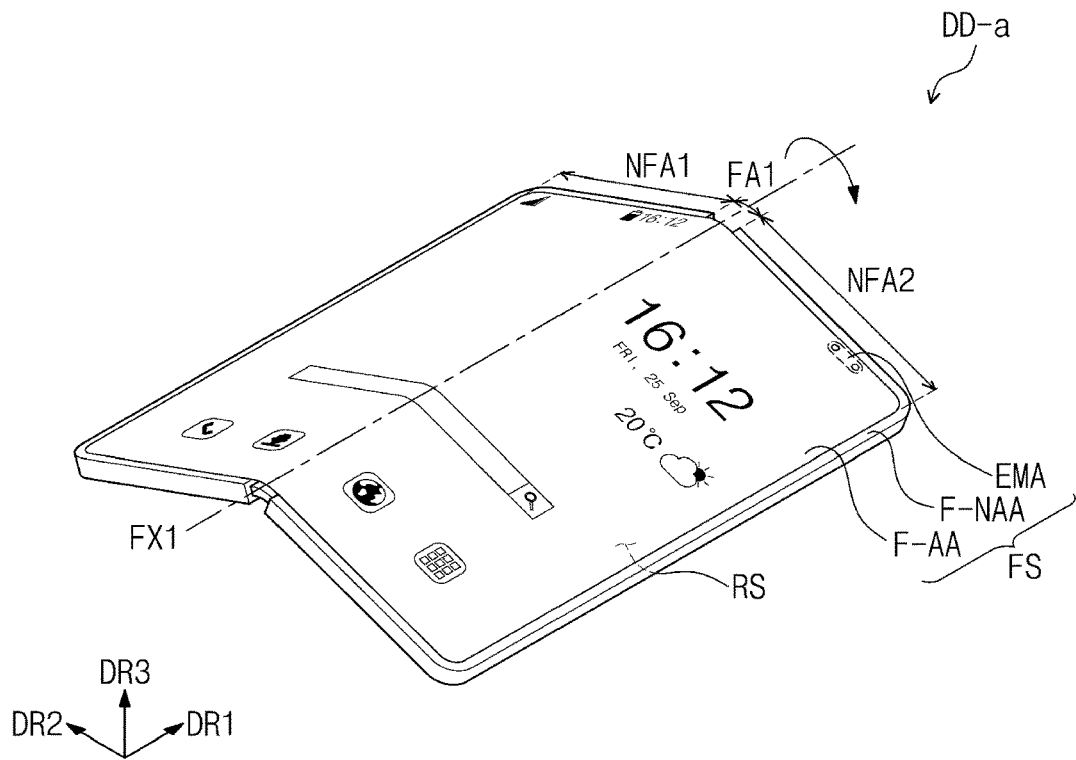
FIG. 1D is a perspective view illustrating an out-folding process of a display device according to an embodiment.
Figure 1E:
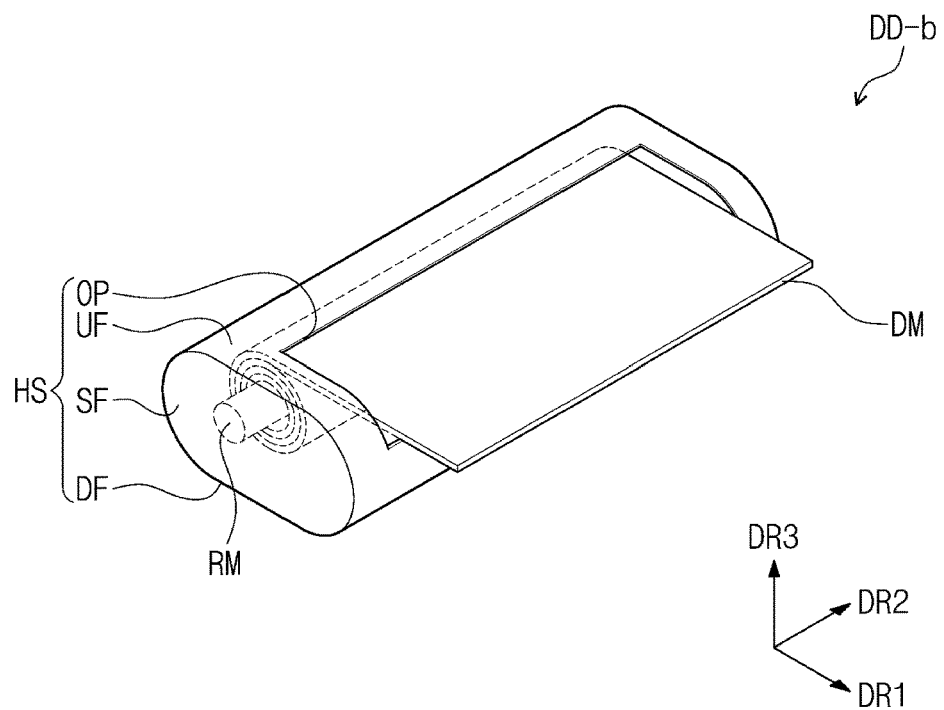
FIG. 1E is a perspective view illustrating a display device in a rolled state according to an embodiment.
Figure 1F:
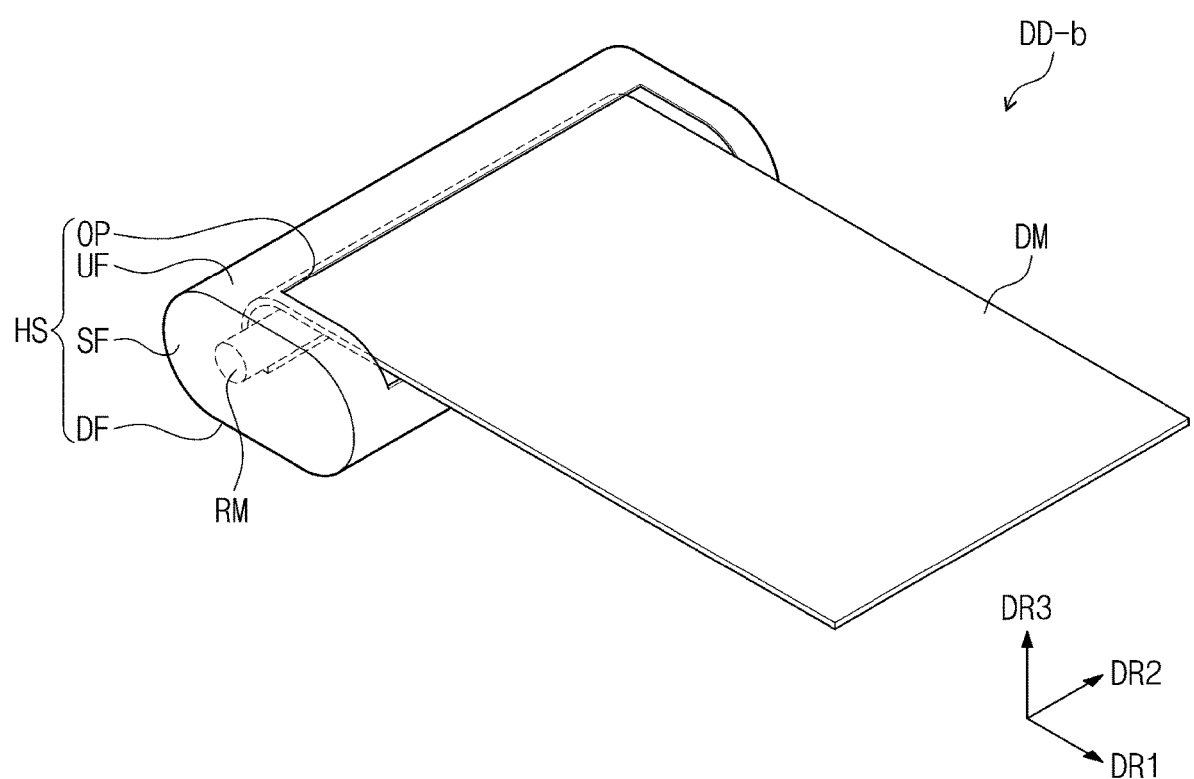
FIG. 1F is a perspective view illustrating a display device in an unfolded state according to an embodiment.

FIG. 1B is a perspective view illustrating a display device in an unfolded state according to an embodiment; FIG. 1C is a perspective view illustrating an in-folding process of the display device shown in FIG. 1B; FIG. 1D is a perspective view illustrating an out-folding process of a display device according to an embodiment; FIG. 1E is a perspective view illustrating a display device in a rolled state according to an embodiment; and FIG. 1F is a perspective view illustrating a display device in an unfolded state according to an embodiment.

In FIGS. 1B to 1F, display devices DD-a and DD-b are illustrated as a mobile phone by way of example.

Referring to FIGS. 1B and 1C, the display device DD-a according to an embodiment may include a first display surface FS defined by the first directional axis DR1 and the second directional axis DR2 crossing the first directional axis DR1. The display device DD-a may provide an image IM to users through the first display surface FS. The display device DD-a according to an embodiment may display the image IM towards the third directional axis DR3 on the first display surface FS parallel to each of the first directional axis DR1 and the second directional axis DR2.

The display device DD-a according to an embodiment may include the first display surface FS and a second display surface RS. The first display surface FS may include a first active area F-AA and a first peripheral area F-NAA. The first active area F-AA may include an electronic module area EMA. The second display surface RS may be defined as a surface facing at least a portion of the first display surface FS. That is, the second display surface RS may be defined as a portion of the rear surface of the display device DD-a.

The display device DD-a according to an embodiment may detect external inputs applied from the outside. The external inputs may include various suitable forms of inputs provided from outside of the display device DD-a. For example, the external inputs may include external inputs applied when an object is approaching the display device DD-a or adjacent by a set or predetermined distance (e.g., hovering over the display device DD-a), as well as when a part of a body such as a user's hand contacts the display device DD-a. In addition, the external inputs may have various suitable forms such as force, pressure, temperature, light, etc.

The first display surface FS of the display device DD-a may include a first active area F-AA and a first peripheral area F-NAA. The first active area F-AA may be an area activated according to electrical signals. The display device DD-a according to an embodiment may display the image IM through the first active area F-AA. In addition, the first active area F-AA may detect various suitable forms of external inputs. The first peripheral area F-NAA is adjacent to the first active area F-AA. The first peripheral area F-NAA may have a set or predetermined color. The first peripheral area F-NAA may surround (e.g., may be around) the first active area F-AA. Accordingly, the shape of the first active area F-AA may be substantially defined by the first peripheral area F-NAA. However, this is illustrated as an example, and the first peripheral area F-NAA may be disposed adjacent to only one side of the first active area F-AA, or may be omitted. The display device DD-a according to an embodiment of the present disclosure may include various suitable forms of active areas and is not limited to any one embodiment.

The display device DD-a may include a folding area FA1 and non-folding areas NFA1 and NFA2. The display device DD-a may include a plurality of non-folding areas NFA1 and NFA2. The display device DD-a according to an embodiment may include a first non-folding area NFA1 and a second non-folding area NFA2 disposed with the folding area FA1 therebetween. Meanwhile, FIGS. 1A to 1D illustrate an embodiment of the display device DD-a including one folding area FA1, but the present disclosure is not limited thereto, and in the display device DD-a, a plurality of folding areas may be defined.

Referring to FIG. 1C, the display device DD-a according to an embodiment may be folded with respect to a first folding axis FX1. The first folding axis FX1 is a virtual axis extending in a direction of the first directional axis DR1, and the first folding axis FX1 may be parallel to a long side direction of the display device DD-a. The first folding axis FX1 may extend along the first directional axis DR1 on the first display surface FS.

In an embodiment, the non-folding areas NFA1 and NFA2 may be disposed adjacent to the folding area FA1 with the folding area FA1 therebetween. For example, the first non-folding area NFA1 may be disposed at one side of the folding area FA1 in the second direction DR2, and the second non-folding area NFA2 may be disposed at the other side of the folding area FA1 in the second direction DR2.

The display device DD-a may be folded with respect to the first folding axis FX1 to become in-folded (e.g., to be in an in-folded state) such that one area overlapping the first non-folding area NFA1 and the other area overlapping the second non-folding area NFA2 on the first display surface FS face each other.

Referring to FIG. 1D, the display device DD-a may be folded with respect to the first folding axis FX1 to become out-folded (e.g., to be in an out-folded state) such that one area overlapping the first non-folding area NFA1 and the other area overlapping the second non-folding area NFA2 on the second display surface RS face each other.

However, the present disclosure is not limited thereto, and the display device DD-a may be folded with respect to a plurality of folding axes such that portions of each of the first display surface FS and the second display surface RS may face each other, and the number of folding axes and the number of corresponding non-folding areas are not particularly limited.

The electronic module area EMA may have various suitable electronic modules disposed thereon. For example, the electronic module may include at least one of a camera, a speaker, a light detection sensor, or a heat detection sensor. The electronic module area EMA may detect an external input (e.g., an external subject) received through the first and second display surfaces FS and RS, and/or provide sound signals such as voice to the outside through the first and/or second display surfaces FS and RS. The electronic module may include a plurality of components, and is not limited to any one embodiment.

The electronic module area EMA may be surrounded by the first active area F-AA and the first peripheral area F-NAA. However, the present disclosure is not limited thereto, and the electronic module area EMA may be disposed in the first active area F-AA.

Referring to FIGS. 1E and 1F, the display device DD-b according to an embodiment may be a rollable display device DD-b. The display device DD-b may include a display module DM, a housing HS, and at least one roller RM. The display module DM may provide images.

The housing HS may accommodate the display module DM. The display module DM may be inserted into or drawn out from the housing HS. The housing HS may include a lower frame DF, a side frame SF, an upper frame UF, and at least one roller RM.

The lower frame DF may be parallel to a plane defined by the first direction DR1 from (or along) which the display module DM is drawn out and a second direction DR2 crossing the first direction DR1. The upper frame UF may face the lower frame DF. An opening OP having the display module DM inserted into and drawn out therefrom may be defined in the upper frame UF. The side frame SF may be disposed between the upper frame UF and the lower frame DF. The side frame SF may extend from the lower frame DF to the upper frame UF to connect the lower frame DF and the upper frame UF. For example, the side frame SF may extend in the third direction DR3 (normal direction) perpendicular to (or crossing) a plane defined by the first direction DR1 and the second direction DR2. The description of the housing HS described above is presented as an example, and the shape of the housing HS is not limited to the shape described above. The frames DF, SF, and UF constituting the housing HS may have other various suitable shapes.

The roller RM may be disposed inside the housing HS. The roller RM may be in the form of a cylinder or an elliptic cylinder extending in the second direction DR2, but the present disclosure is not limited thereto. The roller RM may rotate clockwise or counterclockwise around a rotation axis extending in the second direction DR2. FIGS. 1E and 1F illustrate one roller RM, but the present disclosure is not limited thereto.

One end of the display module DM may be attached to the roller RM. The roller RM rotates clockwise or counterclockwise to wind the display module DM. In some embodiments, one end of the display module DM may be attached to the roller RM, utilizing a pressure sensitive adhesive.

Figure 2:
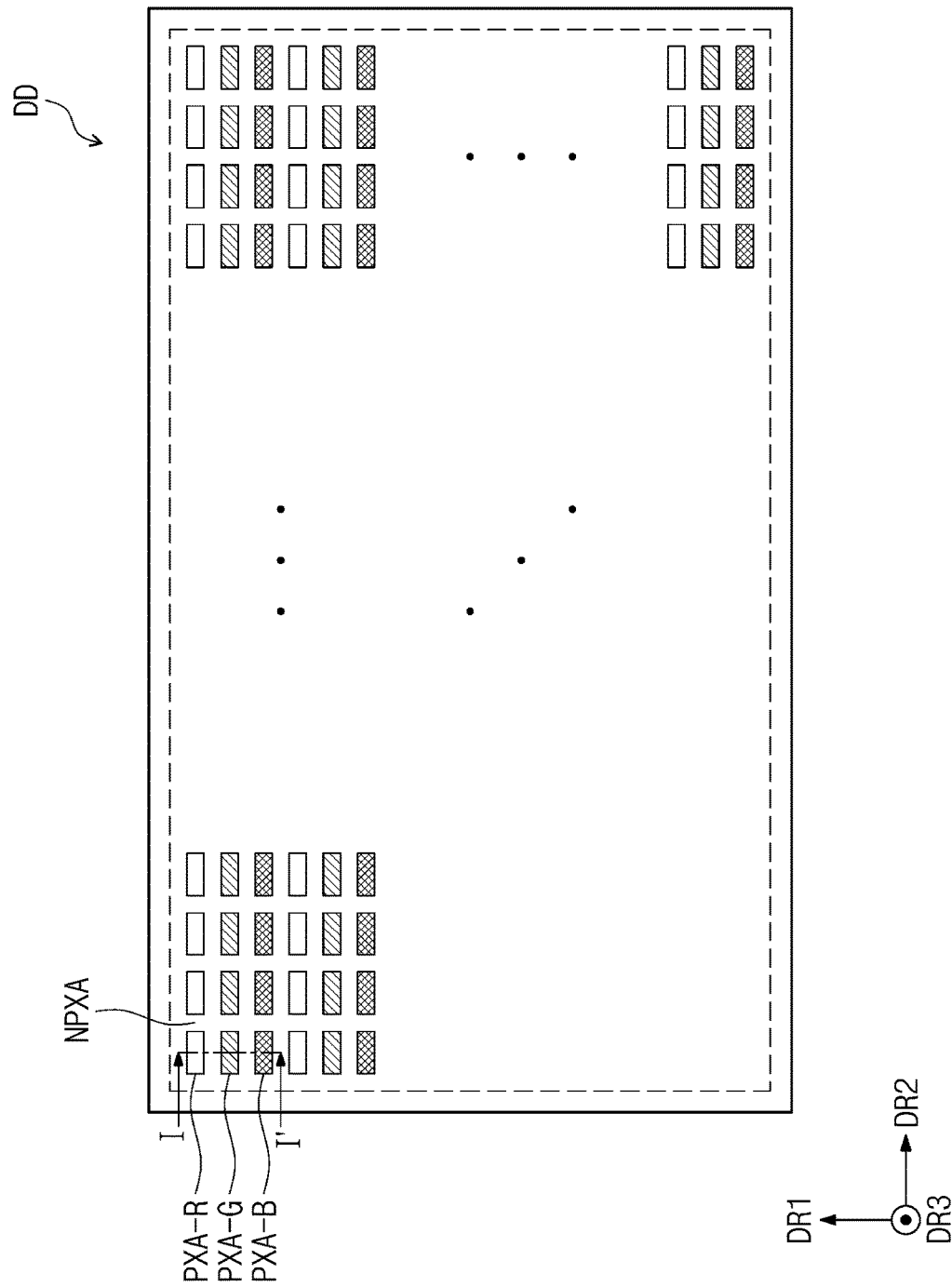
FIG. 2 is a plan view of a display device according to an embodiment.
Figure 3:
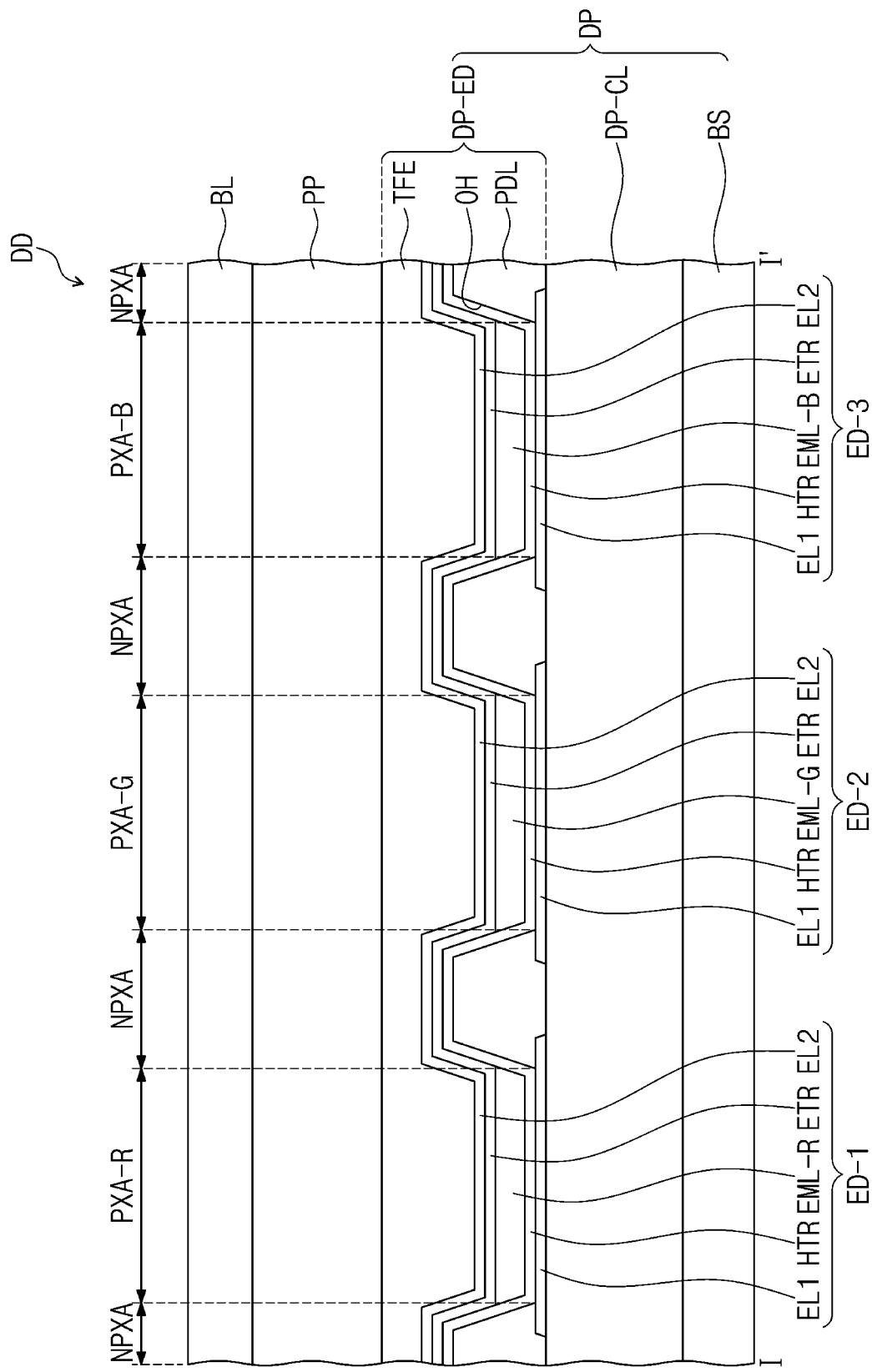
FIG. 3 is a cross-sectional view of a display device according to an embodiment.

FIG. 2 is a plan view illustrating an embodiment of a display device DD. FIG. 3 is a cross-sectional view of a display device DD according to an embodiment. In particular, FIG. 3 is a cross-sectional view showing a portion corresponding to the line I-I' of FIG. 2.

The display device DD may include a display panel DP and an optical layer PP disposed on the display panel DP.

The display panel DP may include light emitting elements ED-1, ED-2, and ED-3. The display device DD may include a plurality of light emitting elements ED-1, ED-2, and ED-3. The optical layer PP may be disposed on the display panel DP to control reflected light in the display panel DP due to external light. The optical layer PP may include, for example, a polarizing layer and/or a color filter layer. Meanwhile, unlike the one in the drawings, the optical layer PP may be omitted in the display device DD of an embodiment.

A base substrate BL may be disposed on the optical layer PP. The base substrate BL may be a member providing a base surface on which the optical layer PP is disposed. The base substrate BL may be a glass substrate, a metal substrate, a plastic substrate, etc. However, the present disclosure is not limited thereto, and the base substrate BL may be an inorganic layer, an organic layer, or a composite material (e.g., including an inorganic material and an organic material) layer. In addition, unlike the one shown, the base substrate BL may be omitted in an embodiment.

The display device DD according to an embodiment may further include a filling layer. The filling layer may be disposed between a display element layer DP-ED and the base substrate BL. The filling layer may be an organic material layer. The filling layer may include at least one among an acrylic-based resin, a silicone-based resin, or an epoxy-based resin.

The display panel DP may include a base layer BS, a circuit layer DP-CL provided on the base layer BS, and a display element layer DP-ED. The display element layer DP-ED may include a pixel defining film PDL, a plurality of light emitting elements ED-1, ED-2, and ED-3 disposed between the pixel defining film PDL, and an encapsulation layer TFE disposed on the plurality of light emitting elements ED-1, ED-2, and ED-3.

The base layer BS may be a member providing a base surface in which the display element layer DP-ED is disposed. The base layer BS may be a glass substrate, a metal substrate, a plastic substrate, etc. However, the present disclosure is not limited thereto, and the base layer BS may be an inorganic layer, an organic layer, or a composite material (e.g., including an inorganic material and an organic material) layer.

In an embodiment, the circuit layer DP-CL may be disposed on the base layer BS, and the circuit layer DP-CL may include a plurality of transistors. The transistors each may include a control electrode, an input electrode, and an output electrode. For example, the circuit layer DP-CL may include a switching transistor and a driving transistor for driving a plurality of light emitting elements ED-1, ED-2 and ED-3 of the display element layer DP-ED.

The light emitting elements ED-1, ED-2, and ED-3 each may have a structure of a light emitting element ED according to an embodiment shown in FIGS. 4 to 7, which will be described in more detail later. The light emitting elements ED-1, ED-2, and ED-3 each may include a first electrode EL1, a hole transport region HTR, emission layers EML-R, EML-G, and EML-B, an electron transport region ETR, and a second electrode EL2.

FIG. 3 illustrates an embodiment in which the emission layers EML-R, EML-G, and EML-B of the light emitting elements ED-1, ED-2, and ED-3 are disposed in an opening OH defined in the pixel defining film PDL, and the hole transport region HTR, the electron transport region ETR, and the second electrode EL2 are provided as a common layer throughout the light emitting elements ED-1, ED-2, and ED-3. However, the present disclosure is not limited thereto, and unlike the one shown in FIG. 3, in an embodiment, the hole transport region HTR and the electron transport region ETR may be provided to be patterned inside the opening OH defined in the pixel defining film PDL. For example, in an embodiment, the hole transport region HTR, the emission layers EML-R, EML-G, and EML-B, and the electron transport region ETR, etc. of the light emitting elements ED-1, ED-2, and ED-3 may be provided to be patterned through an inkjet printing method.

An encapsulation layer TFE may cover the light emitting elements ED-1, ED-2 and ED-3. The encapsulation layer TFE may seal the display element layer DP-ED. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE according to an embodiment may include at least one inorganic film (hereinafter, an encapsulation inorganic film). In addition, the encapsulation layer TFE according to an embodiment may include at least one organic film (hereinafter, an encapsulation organic film) and at least one encapsulation inorganic film.

The encapsulation inorganic film protects the display element layer DP-ED from moisture/oxygen, and the encapsulation organic film protects the display element layer DP-ED from foreign substances such as dust particles. The encapsulation inorganic film may include silicon nitride, silicon oxy nitride, silicon oxide, titanium oxide, aluminum oxide, etc., but is not particularly limited thereto. The encapsulation organic layer may include an acrylic-based compound, an epoxy-based compound, etc. The encapsulation organic layer may include a photopolymerizable organic material, and is not particularly limited.

The encapsulation layer TFE may be disposed on the second electrode EL2, and may be disposed to fill the opening OH.

Referring to FIGS. 2 and 3, the display device DD may include a non-light emitting area NPXA and light emitting areas PXA-R, PXA-G, and PXA-B. The light emitting areas PXA-R, PXA-G, and PXA-B each may be an area emitting light generated from each of the light emitting elements ED-1, ED-2, and ED-3. The light emitting areas PXA-R, PXA-G, and PXA-B may be spaced apart from each other on a plane (e.g., in a plan view).

Each of the light emitting areas PXA-R, PXA-G, and PXA-B may be an area separated by the pixel defining film PDL. The non-light emitting areas NPXA may be an area between neighboring light emitting areas PXA-R, PXA-G, and PXA-B, and may correspond to the pixel defining film PDL. Meanwhile, in the present description, each of the light emitting areas PXA-R, PXA-G, and PXA-B may correspond to a pixel. The pixel defining film PDL may separate the light emitting elements ED-1, ED-2 and ED-3. The emission layers EML-R, EML-G, and EML-B of the light emitting elements ED-1, ED-2 and ED-3 may be disposed and separated in an opening OH defined by the pixel defining film PDL.

The light emitting areas PXA-R, PXA-G, and PXA-B may be divided into a plurality of groups according to the color of light generated from the light emitting elements ED-1, ED-2, and ED-3. In the display device DD of an embodiment shown in FIGS. 2 and 3, three light emitting areas PXA-R, PXA-G, and PXA-B which emit red light, green light, and blue light, respectively, are illustrated as an example. For example, the display device DD of an embodiment may include a red light emitting area PXA-R, a green light emitting area PXA-G, and a blue light emitting area PXA-B, which are distinct from one another.

In the display device DD according to an embodiment, the light emitting elements ED-1, ED-2, and ED-3 may emit light having different wavelength ranges. For example, in an embodiment, the display device DD may include a first light emitting element ED-1 emitting red light, a second light emitting element ED-2 emitting green light, and a third light emitting element ED-3 emitting blue light. That is, the red light emitting area PXA-R, the green light emitting area PXA-G, and the blue light emitting area PXA-B of the display device DD may correspond to the first light emitting element ED-1, the second light emitting element ED-2, and the third light emitting element ED-3, respectively.

However, the present disclosure is not limited thereto, and the first to third light emitting elements ED-1, ED-2 and ED-3 may emit light in the same wavelength range or emit light in at least one different wavelength range. For example, the first to third light emitting elements ED-1, ED-2, and ED-3 all may emit blue light.

The light emitting areas PXA-R, PXA-G, and PXA-B in the display device DD according to an embodiment may be arranged in the form of a stripe. Referring to FIG. 2, a plurality of red light emitting areas PXA-R, a plurality of green light emitting areas PXA-G, and a plurality of blue light emitting areas PXA-B each may be arranged along a second directional axis DR2. In addition, the red light emitting area PXA-R, the green light emitting area PXA-G, and the blue light emitting area PXA-B may be alternately arranged in turn along the first directional axis DR1.

FIGS. 2 and 3 illustrate that the light emitting areas PXA-R, PXA-G, and PXA-B are all similar in size, but the present disclosure is not limited thereto, and the light emitting areas PXA-R, PXA-G and PXA-B may be different in size from each other according to wavelength ranges of emitted light. Meanwhile, the areas of the light emitting areas PXA-R, PXA-G, and PXA-B may refer to an area when viewed on a plane defined by the first directional axis DR1 and the second directional axis DR2.

Meanwhile, the arrangement of the light emitting areas PXA-R, PXA-G, and PXA-B is not limited to the one shown in FIG. 2, and the order that the red light emitting area PXA-R, the green light emitting area PXA-G, and the blue light emitting area PXA-B are arranged may have varied combination according to display quality characteristics required for the display device DD. For example, the light emitting areas PXA-R, PXA-G, and PXA-B may be arranged in the form of a Pentile™ or a diamond shape.

In addition, an area of each of the light emitting areas PXA-R, PXA-G, and PXA-B may be different in size from one another. For example, in an embodiment, the green light emitting area PXA-G may be smaller than the blue light emitting area PXA-B in size, but the present disclosure is not limited thereto.

Hereinafter, FIGS. 4 to 7 are cross-sectional views schematically illustrating a light emitting element according to an embodiment of the present disclosure. The light emitting element ED according to an embodiment may include a first electrode EL1, a hole transport region HTR, an emission layer EML, an electron transport region ETR, and a second electrode EL2.

Figure 4:
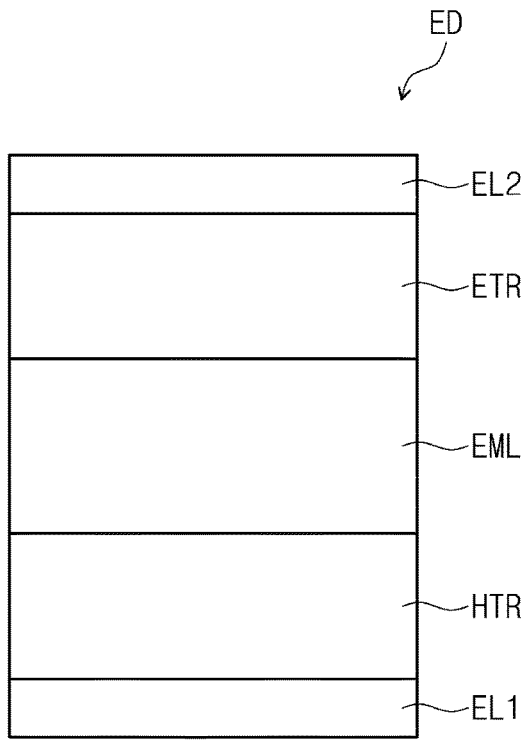
FIG. 4 is a cross-sectional view of a light emitting element according to an embodiment.
Figure 5:
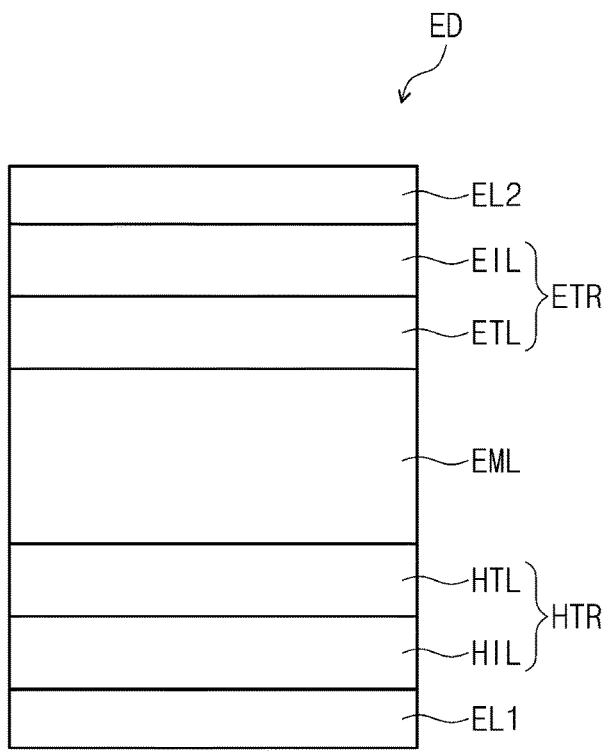
FIG. 5 is a cross-sectional view of a light emitting element according to an embodiment.
Figure 6:
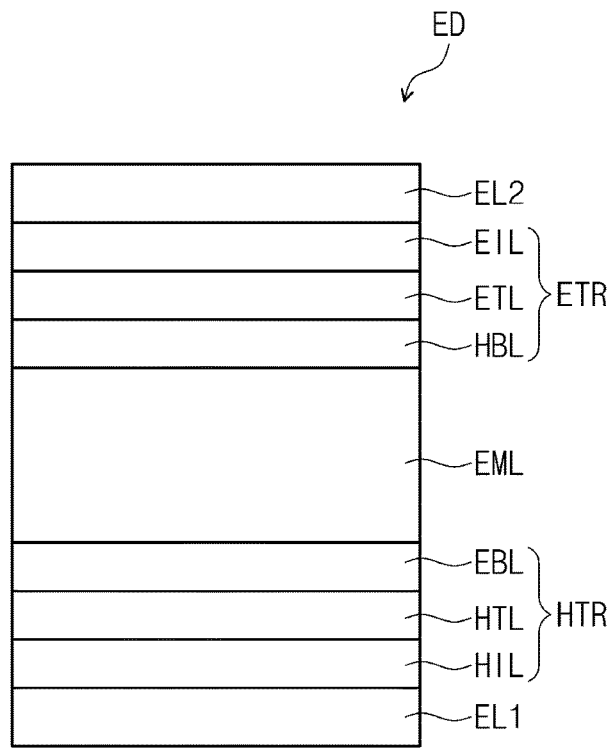
FIG. 6 is a cross-sectional view of a light emitting element according to an embodiment.
Figure 7:
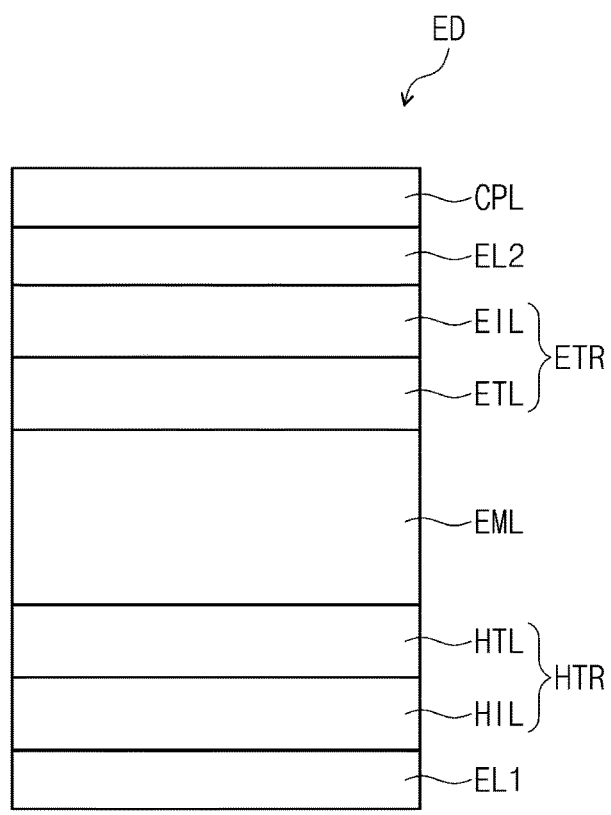
FIG. 7 is a cross-sectional view of a light emitting element according to an embodiment.

FIG. 5 illustrates, compared with FIG. 4, a cross-sectional view of a light emitting element ED of an embodiment in which the hole transport region HTR includes a hole injection layer HIL and a hole transport layer HTL, and the electron transport region ETR includes an electron injection layer EIL and an electron transport layer ETL. In addition, FIG. 6 illustrates, compared with FIG. 4, a cross-sectional view of a light emitting element ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 7 illustrates, compared with FIG. 4, a cross-sectional view of a light emitting element ED of an embodiment, which includes a capping layer CPL disposed on the second electrode EL2.

The first electrode EL1 has electrical conductivity. The first electrode EL1 may be formed of a metal material, a metal alloy and/or a conductive compound. The first electrode EL1 may be an anode or a cathode. However, the present disclosure is not limited thereto. In addition, the first electrode EL1 may be a pixel electrode. The first electrode EL1 may be a transmissive electrode, a transflective electrode, or a reflective electrode. When the first electrode EU is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EU is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but the present disclosure is not limited thereto. In one or more embodiments, the first electrode EU may include the above-described metal materials, a combination of two or more metal materials selected from the above-described metal materials, and/or oxides of the above-described metal materials. The first electrode EL1 may have a thickness of about 700 Å to about 10000 Å. For example, the first electrode EL1 may have a thickness of 1000 Å to about 3000 Å.

The emission layer EML is provided on the first electrode EL1. The emission layer EML may have, for example, a thickness of about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

In an embodiment, the emission layer EML may include a light emitting polymer compound derived from a mixture of a polyphenylene vinylene-based compound and an organic compound represented by Formula 1.

Formula 1

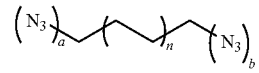

In Formula 1, n may be an integer of 5 to 20. In Formula 1, a and b may be each independently 1 or 2. For example, the organic compound may be one that one or two of azide ($N_3$) are each independently substituted at one end and the other end of a main chain. For example, the organic compound may be 1,1,7,7-tetraazidoheptane.

The organic compound may be a crosslinking agent. The vinylene of the polyphenylene vinylene-based compound may be bonded to carbon atoms to which the azide of the organic compound is bonded. A plurality of (e.g., two or more) polyphenylene vinylene-based compounds may be bonded to one organic compound. That is, the polyphenylene vinylene-based compound and the organic compound may be crosslinked. The polyphenylene vinylene-based compound and the organic compound may be crosslinked, thereby providing flexibility and strength to the emission layer EML.

In the mixture of an embodiment, the polyphenylene vinylene-based compound and the organic compound may have a molar ratio of about 9:1 to about 8:2. When the organic compound in the mixture has a molar ratio of less than 1 (e.g., based on a total molar amount of 10 for both the polyphenylene vinylene-based compound and the organic compound), crosslinking between the polyphenylene vinylene-based compound and the organic compound may be (e.g., is) insufficient, and the emission layer EML may thus secure (e.g., have suitable) flexibility, but may fail to secure (e.g., may not have) satisfactory strength. When the organic compound in the mixture has a molar ratio of greater than 2, crosslinking between the polyphenylene vinylene-based compound and the organic compound may be (e.g., is) overly performed, and the emission layer EML may thus secure (e.g., have suitable) strength, but may fail to secure (e.g., may not have suitable) flexibility.

The polyphenylene vinylene-based compound may have a weight average molecular weight of about $1.3 \times 10^6$ to about $1.6 \times 10^6$. In an embodiment, the polyphenylene vinylene-based compound may be poly(1,4-phenylene vinylene). However, this is only presented as an example, and the present disclosure is not limited thereto, and any polyphenylene-based compounds capable of forming a crosslinking bond with organic compounds may be variously suitably applied.

In an embodiment, in the polyphenylene vinylene-based compound, the phenylene may be a substituted or unsubstituted phenylene. In the polyphenylene vinylene-based compound, the phenylene may be one substituted with a substituted or unsubstituted alkyl group having 4 to 10 carbon atoms, an alkoxy group, a cyano group, a substituted or unsubstituted amine group, or a substituted or unsubstituted silyl group. In an embodiment, in the polyphenylene vinylene-based compound, the vinylene may be a substituted or unsubstituted vinylene. In the polyphenylene vinylene-based compound, the substituted vinylene may be one substituted with a cyano group. However, this is only presented as an example, and the present disclosure is not limited thereto, and the substituents of the phenylene and the vinylene in the polyphenylene vinylene-based compound are not limited thereto as long as the substituents are crosslinked with the organic compounds. In an embodiment, the polyphenylene vinylene-based compound may be a compound represented by Formulas PP1 to PP25 below.

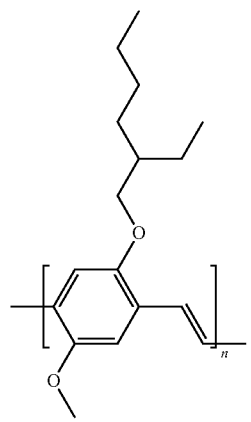

PP1

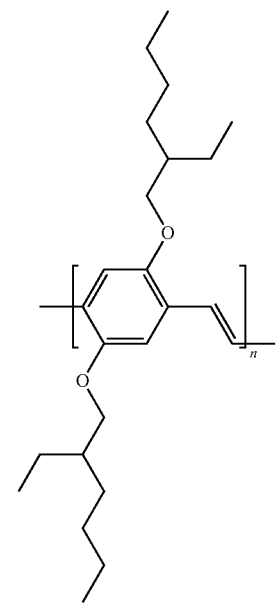

PP2

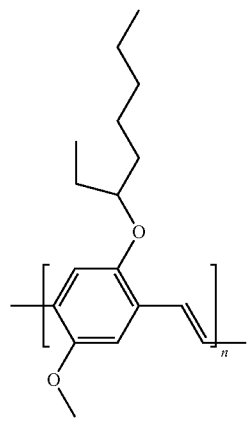
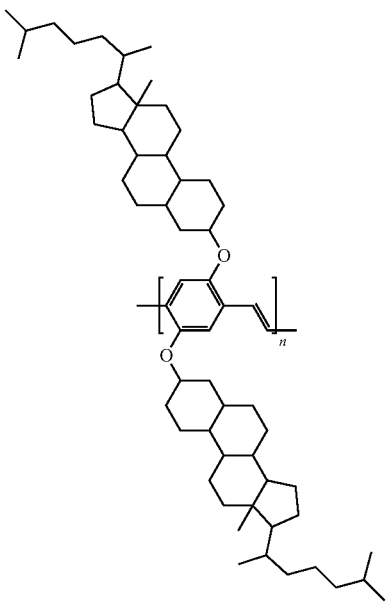
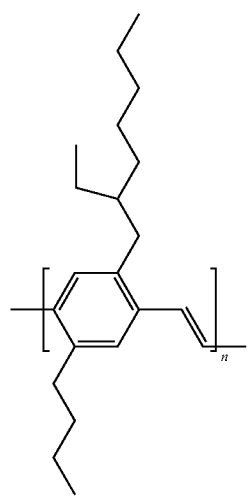
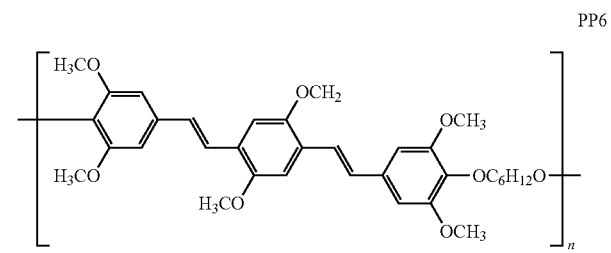
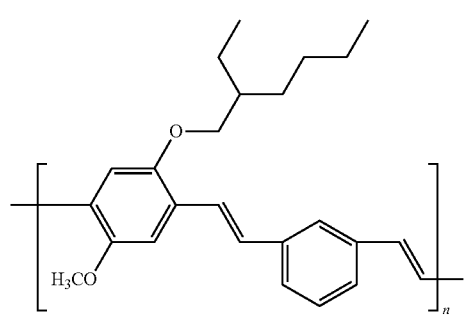
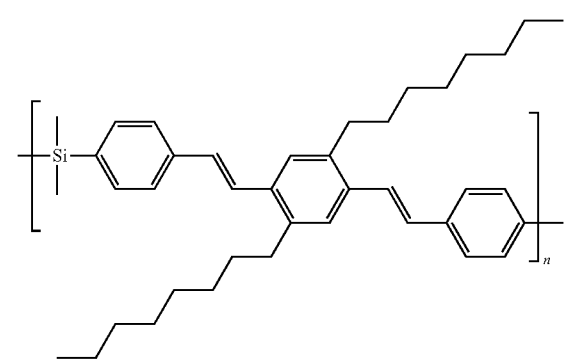

-continued
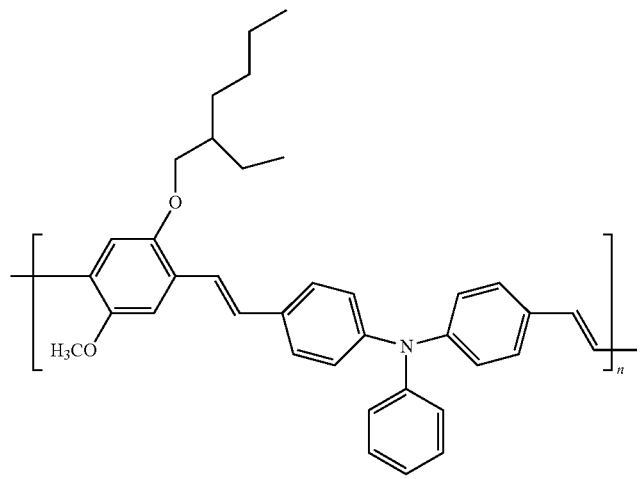
PP9
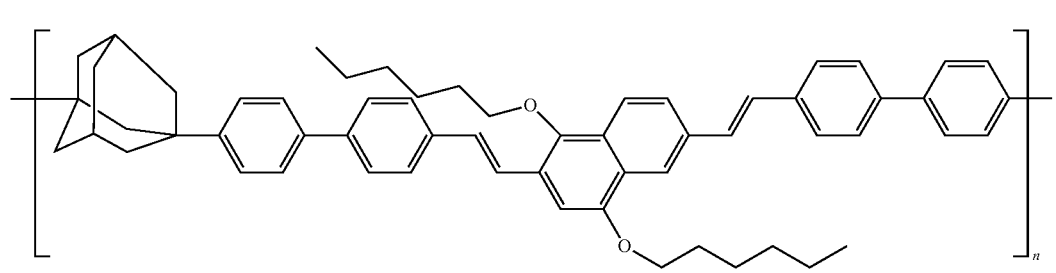
PP10
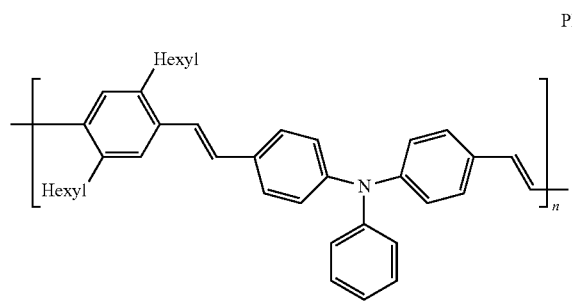
PP11
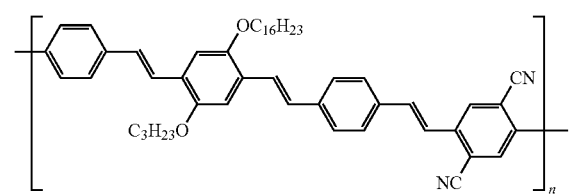
PP12
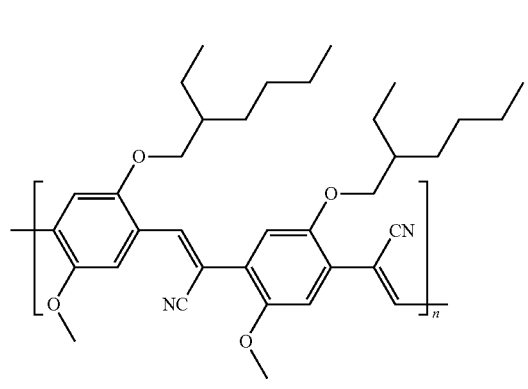
PP13
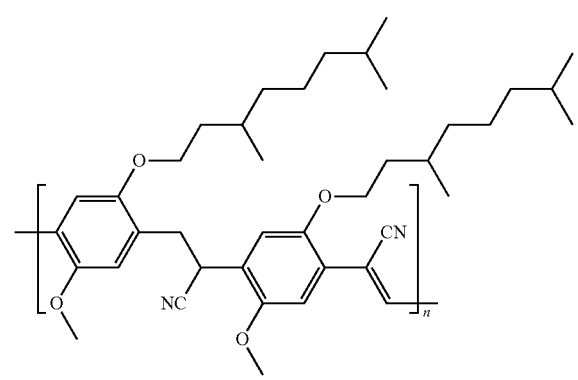
PP14

-continued
PP15
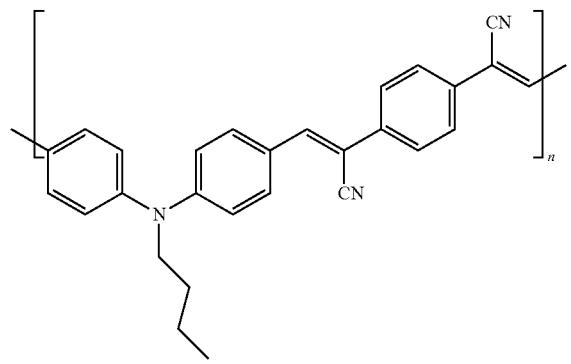
PP16
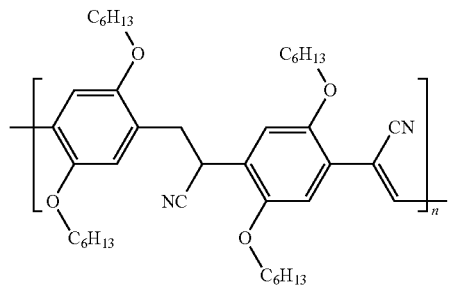
PP17
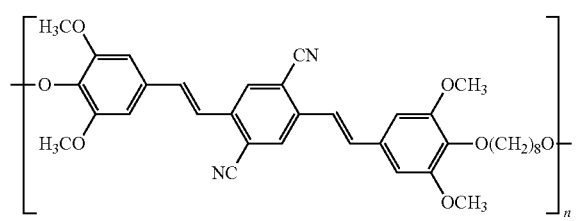
PP18
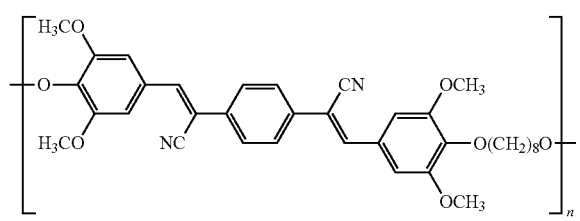
PP19
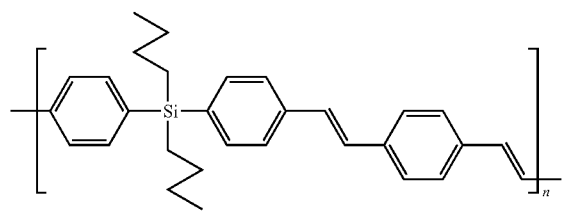
PP20
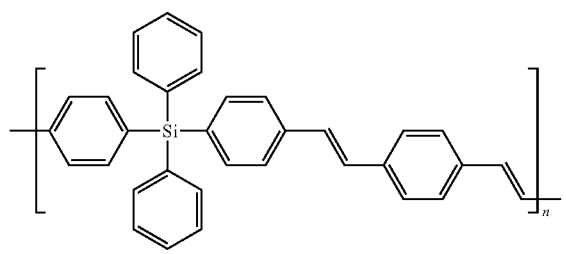
PP21
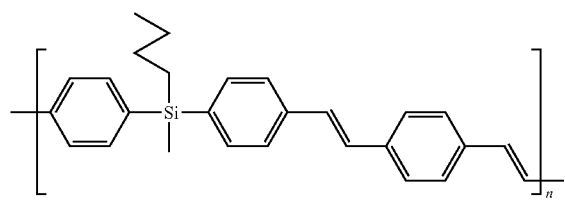
PP22
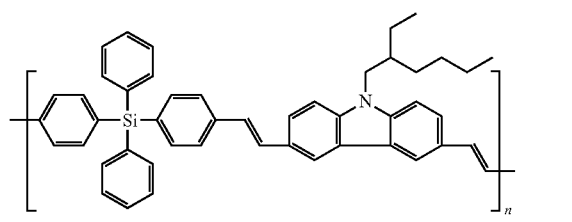
PP23
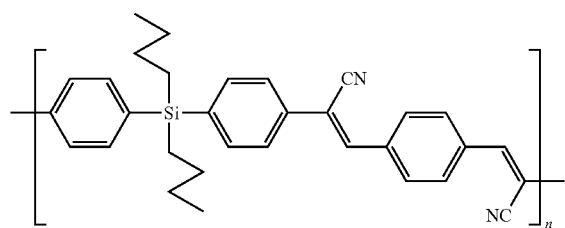
PP24
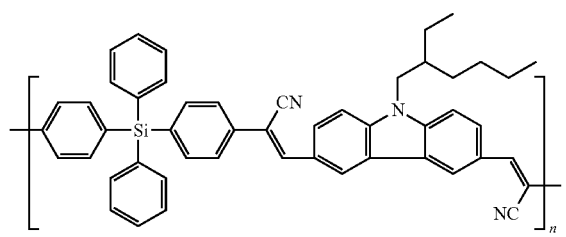
PP25
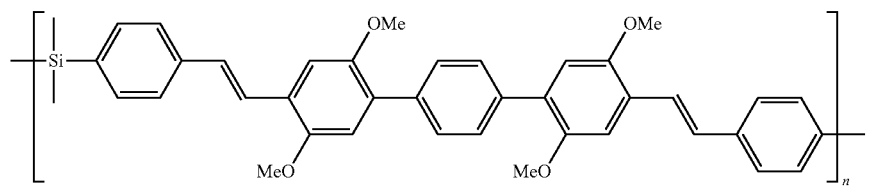

In each of PP1 to PP25, n may be an integer of 4000 to 7000.

In an embodiment, the polyphenylene vinylene-based compound may be included in at least one of the emission layer EML-R (FIG. 3) of the first light emitting element ED-1 (FIG. 3) emitting red light, the emission layer EML-G (FIG. 3) of the second light emitting element ED-2 (FIG. 3) emitting green light, or the emission layer EML-B (FIG. 3) of the third light emitting element ED-3 (FIG. 3) emitting blue light. A light emitting polymer compound derived from a mixture of a polyphenylene vinylene-based compound and an organic compound may be included in at least one emission layer and utilized as a light emitting material. The emission layer EML may include only a light emitting polymer compound derived from a mixture of a polyphenylene vinylene-based compound and an organic compound as a light emitting material, or may further include a suitable (e.g., a known) light emitting material.

The emission layer EML may further include, in addition to a light emitting material polymer compound according to an embodiment, a compound represented by Formula E-1 below. The compound represented by Formula E-1 below may be utilized as a fluorescent host material.

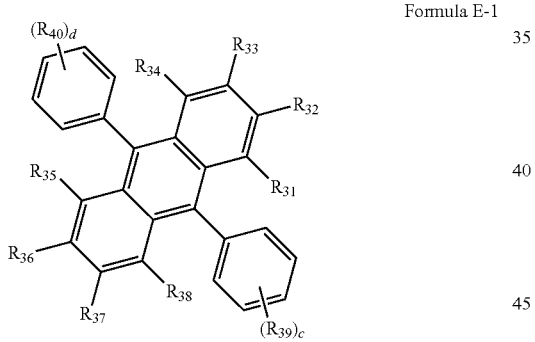

Formula E-1

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring. In some embodiments, $R_{31}$ to $R_{40}$ may be bonded to an adjacent group to form a saturated hydrocarbon ring or unsaturated hydrocarbon ring.

In Formula E-1, c and d may be each independently an integer of 0 to 5.

The compound represented by Formula E-1 may be represented by any one among compounds E1 to E19 below.

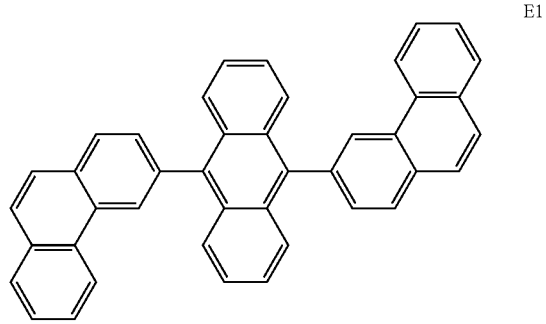

E1

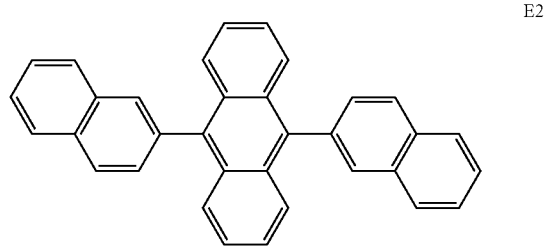

E2

E3

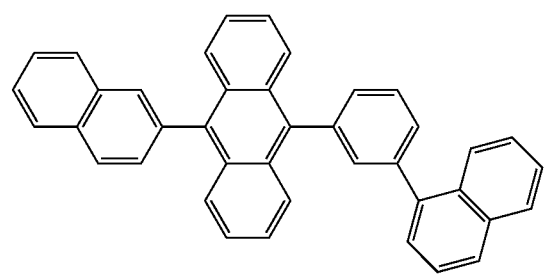

E4

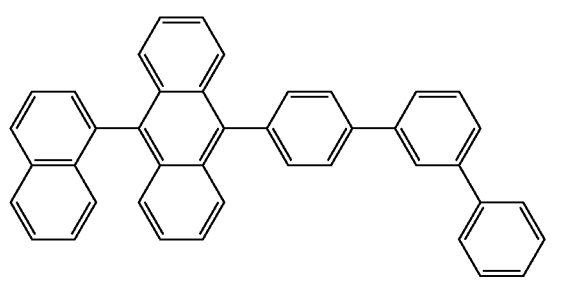

E5

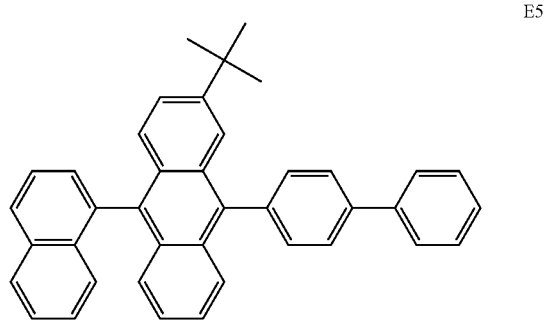

-continued
E6
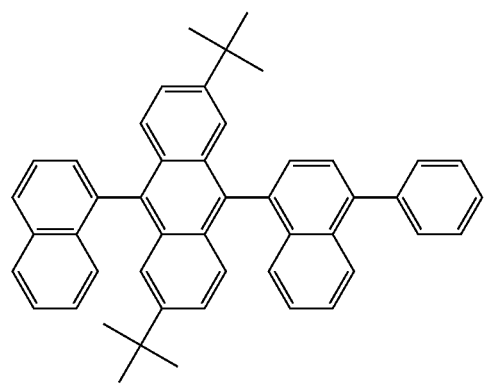
E7
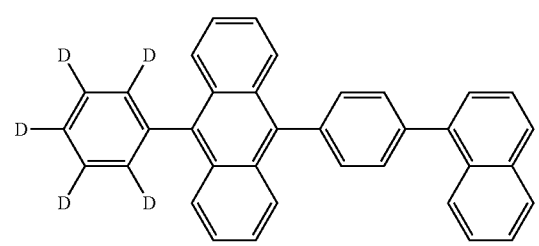
E8
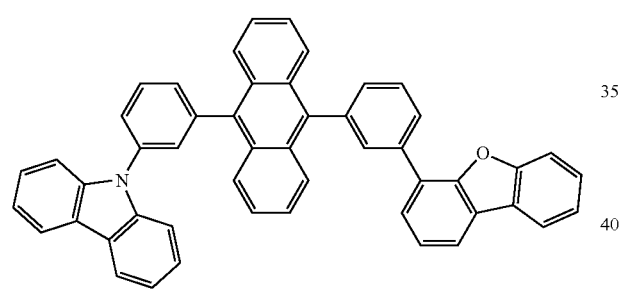
E9
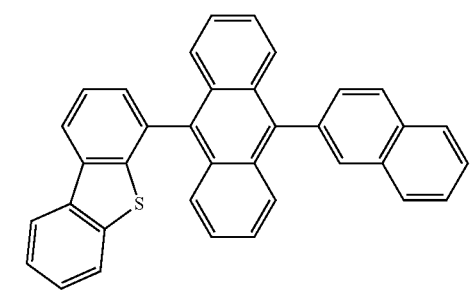
E10
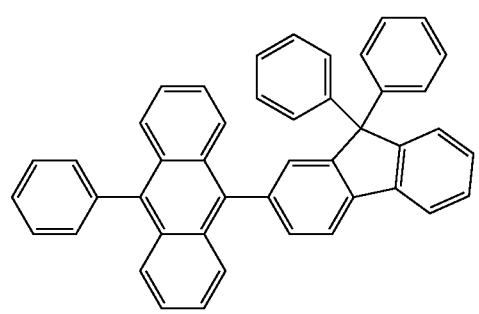
-continued
E11
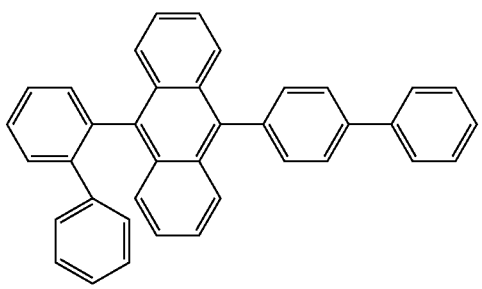
E12
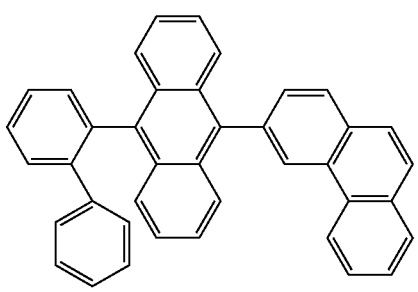
E13
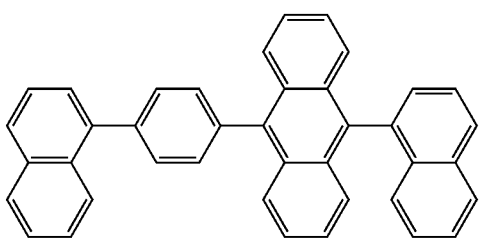
E14
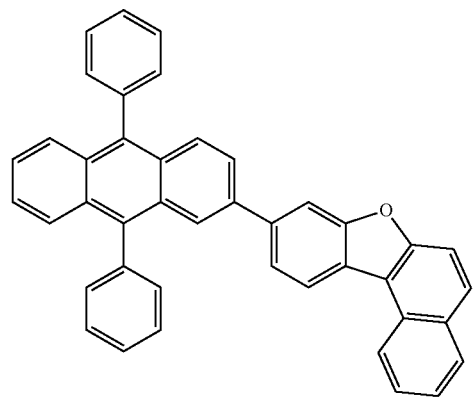

E15

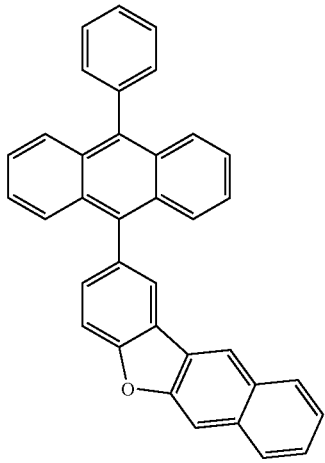

E19

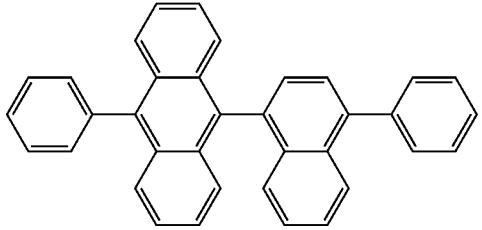

In an embodiment, the emission layer EML may further include a compound represented by Formula E-2a or Formula E-2b below. The compound represented by Formula E-2a or Formula E-2b may be utilized as a phosphorescent host material.

E16

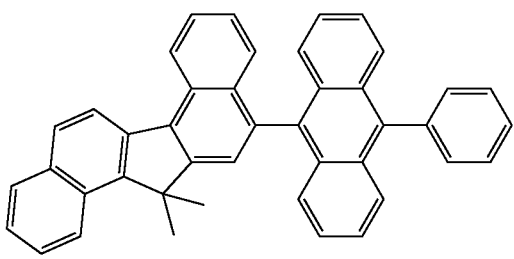

Formula E-2a

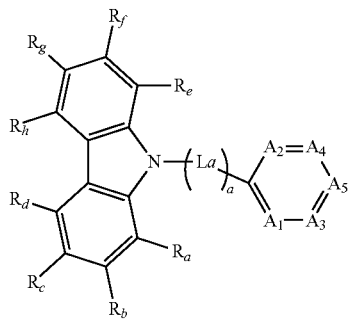

E17

In Formula E-2a, a may be an integer of 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. Meanwhile, when a is an integer of 2 or greater, a plurality of Las may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_j$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring. In some embodiments, $R_a$ to $R_i$ may be bonded to an adjacent group to form a hydrocarbon ring or a heterocycle containing N, O, S, etc. as a ring-forming atom.

Meanwhile, in Formula E-2a, two or three selected from $A_1$ to $A_5$ may be N, and the rest (e.g., the remainder thereof) may each independently be $CR_i$.

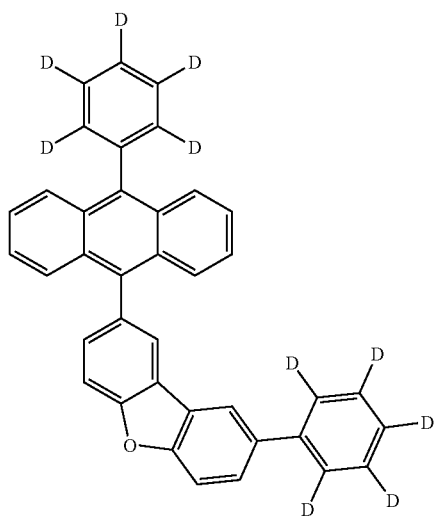

E18

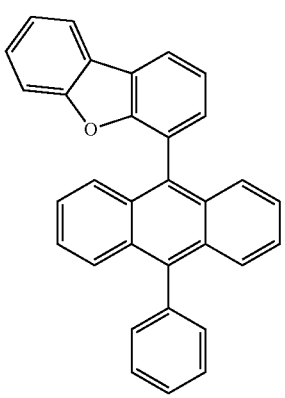

Formula E-2b (Cbz1)—(L$_b$)$_b$—(Cbz2)

In Formula E-2b, Cbz1 and Cbz2 may be each independently an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. b may be an integer of 0 to 10, and when b is an integer of 2 or greater, a plurality of $L_b$s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may include any one of the compounds from Compound Group E-2 below. However, the compounds listed in Compound Group E-2 below are presented as an example, and the compound represented by Formula E-2a or Formula E-2b is not limited to those listed in Compound Group E-2 below.

Compound Group E-2

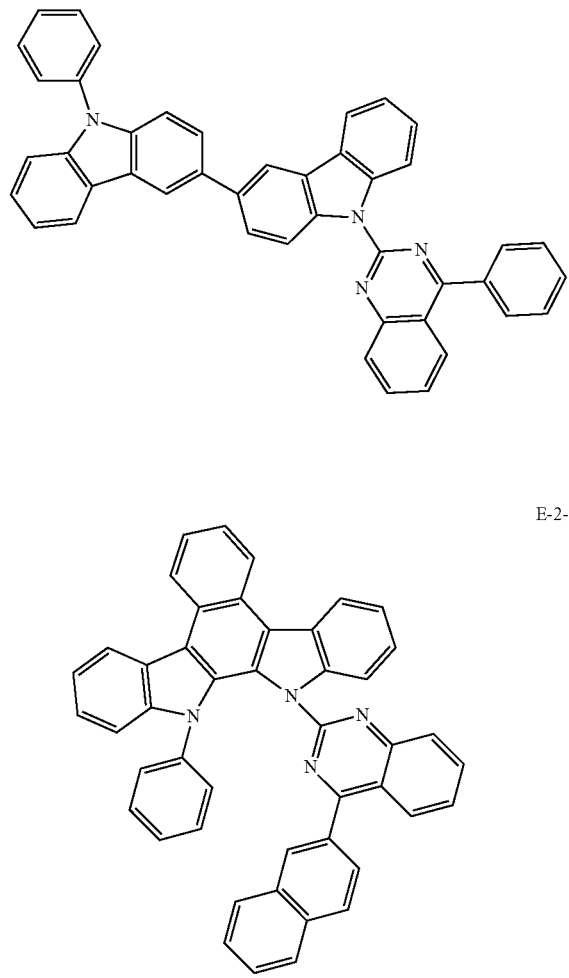

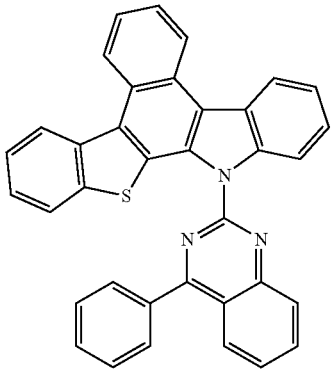

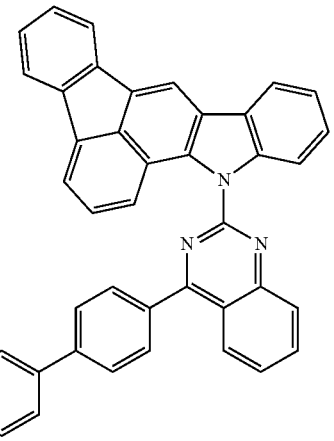

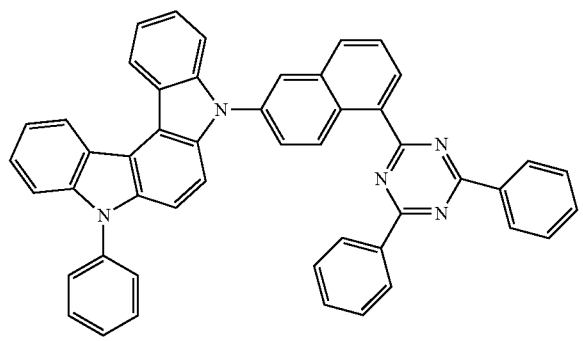

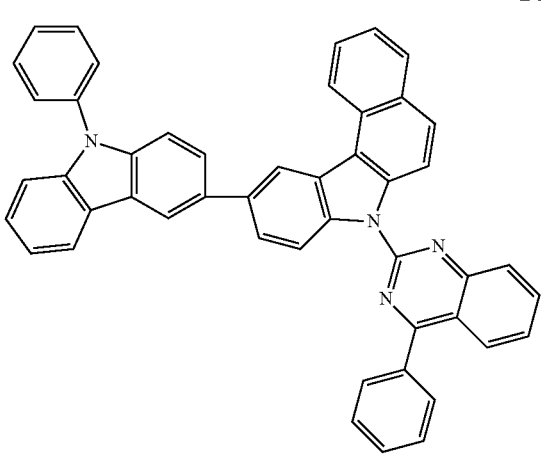

E-2-7
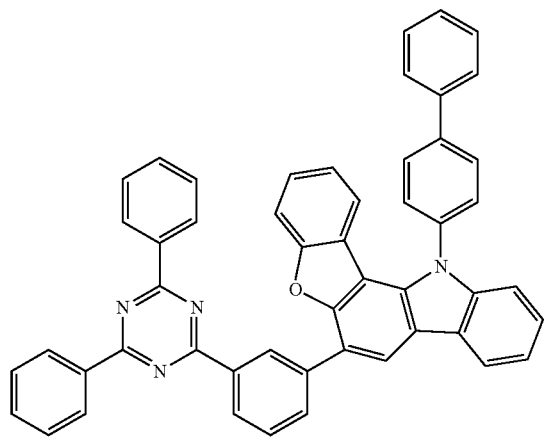
E-2-10
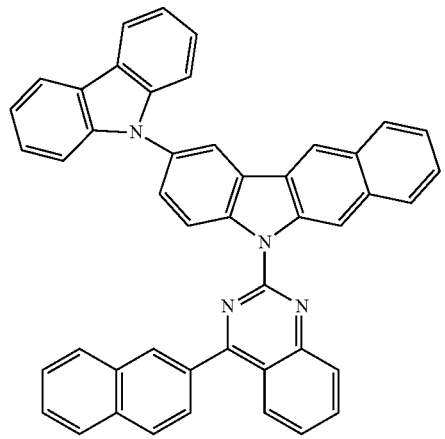
E-2-8
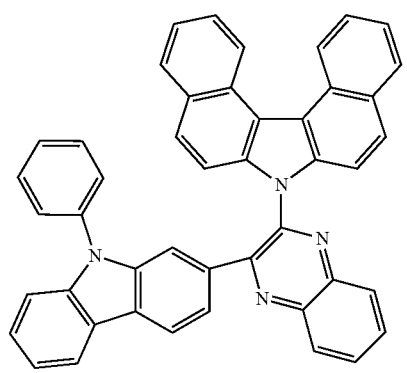
E-2-11
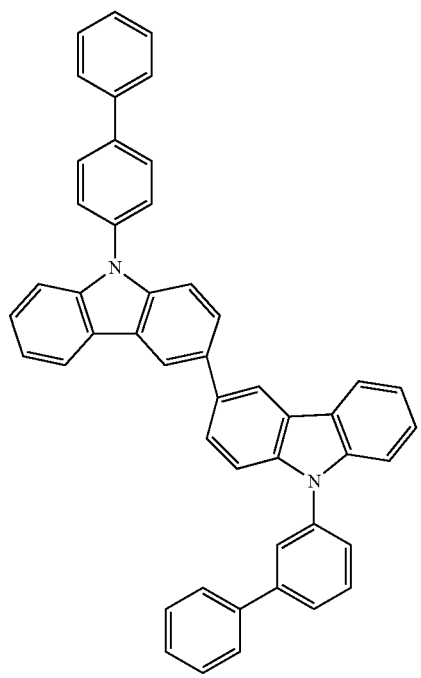
E-2-9
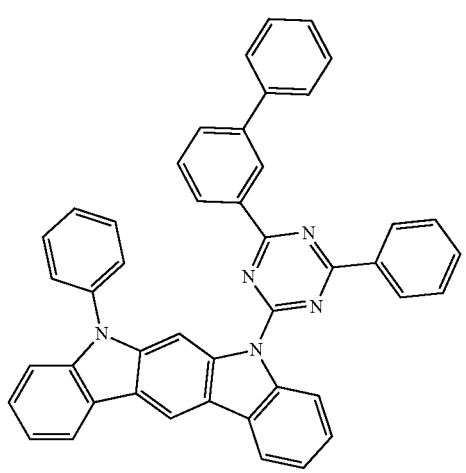
E-2-12
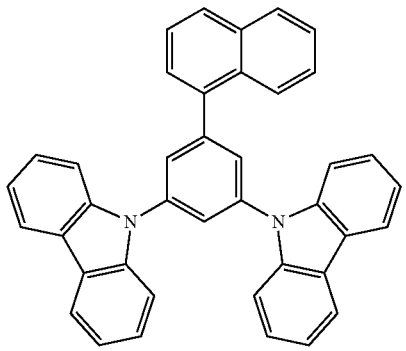

E-2-13
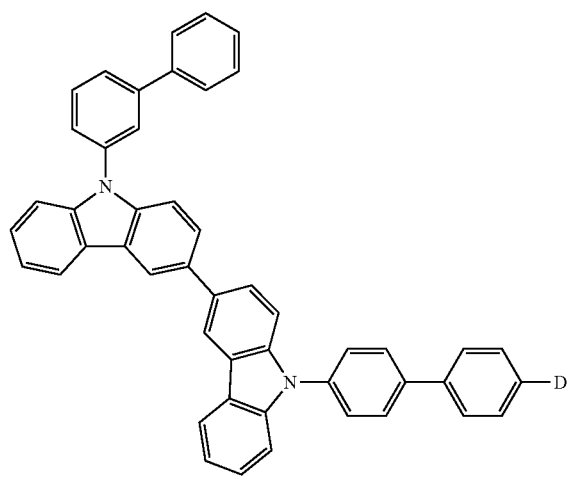
E-2-14
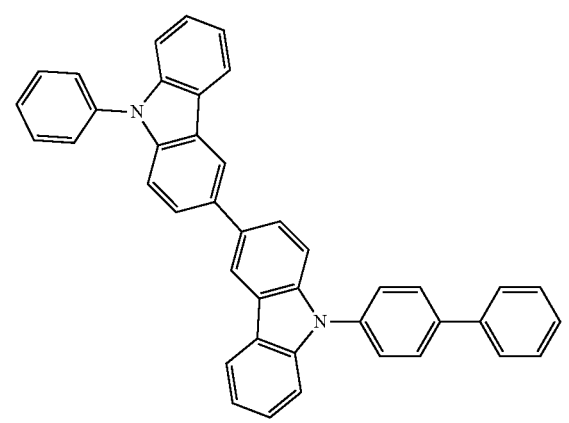
E-2-15
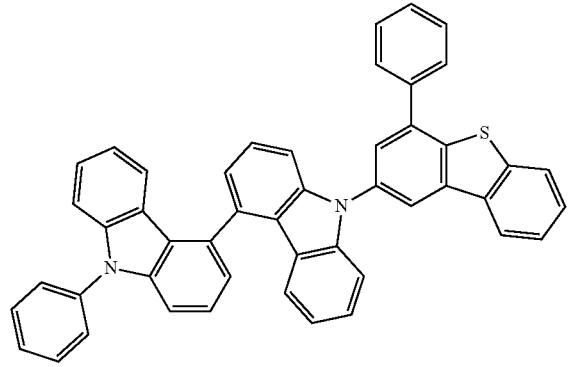
E-2-16
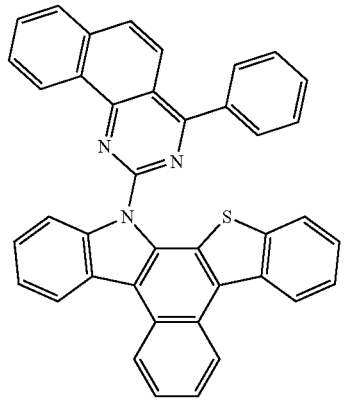
E-2-17
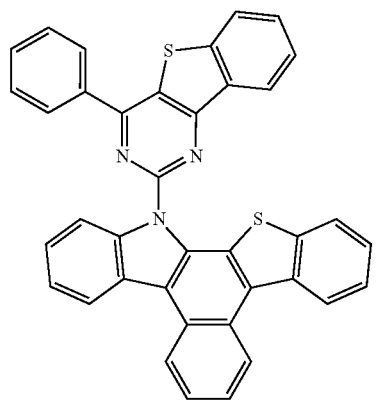
E-2-18
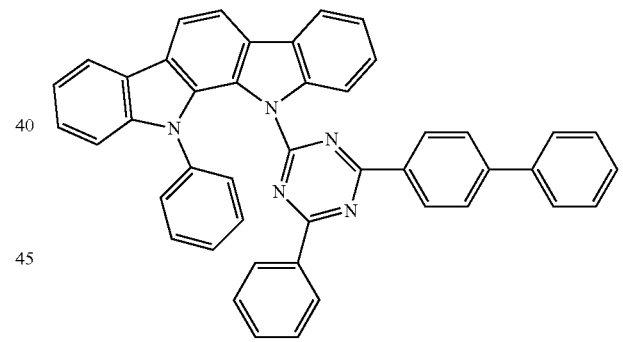
E-2-19
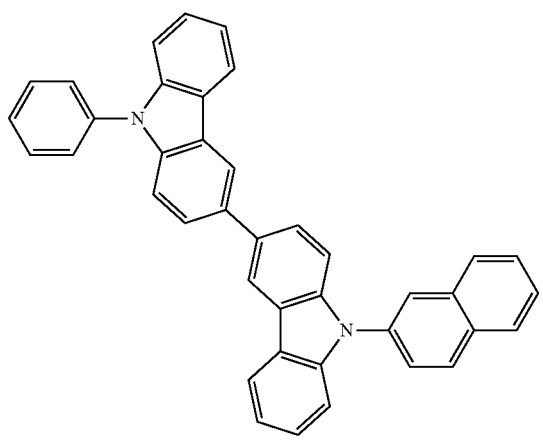

E-2-20
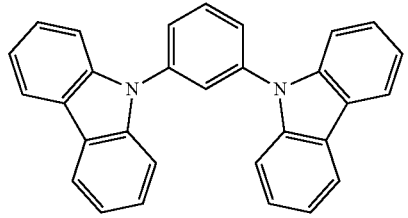

E-2-21
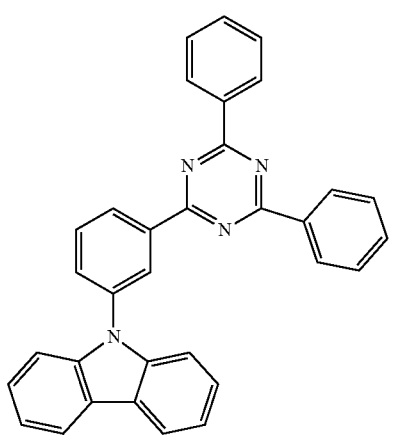

E-2-22
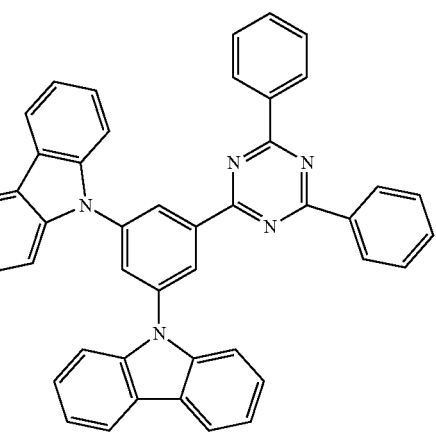

E-2-23
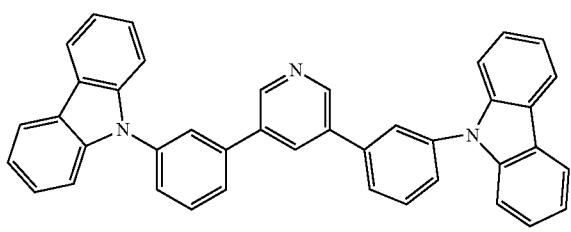

E-2-24
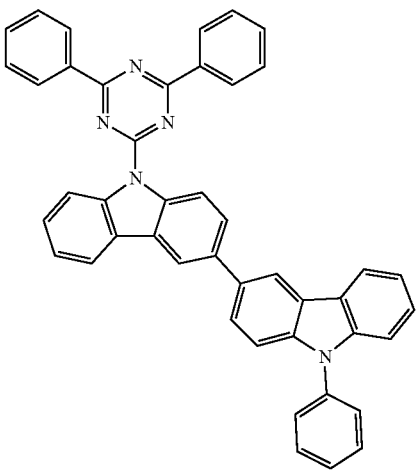

The emission layer EML may further include a general material known in the art as a host material. For example, the emission layer EML may include, as a host material, at least one among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl)benzene (TPBi). However, the present disclosure is not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be utilized as a host material.

The emission layer EML may further include, in addition to a light emitting polymer compound according to an embodiment, a compound represented by Formula M-a or Formula M-b below. The compound represented by the Formula M-a or Formula M-b below may be utilized as a phosphorescent dopant material.

Formula M-a
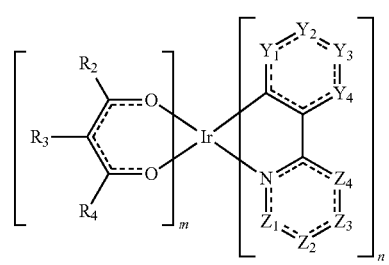

In Formula M-a above, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring. In Formula M-a, m is 0 or 1, and n is 2 or 3. In Formula M-a, when m is 0, n is 3, and when m is 1, n is 2.

The compound represented by Formula M-a may be utilized as a phosphorescent dopant.

The compound represented by Formula M-a may include any one of compounds M-a1 to M-a25 below. However, the compounds M-a1 to M-a21 below are presented as an example, and the compound represented by Formula M-a is not limited to those represented by the compounds M-a1 to M-a21 below.

M-a1

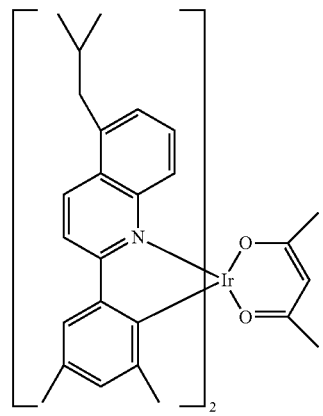

M-a2

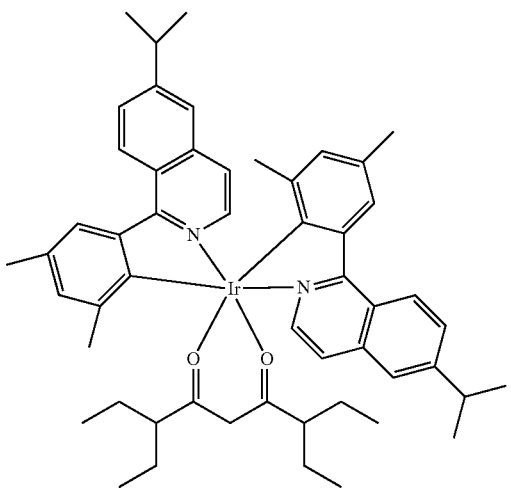

M-a3

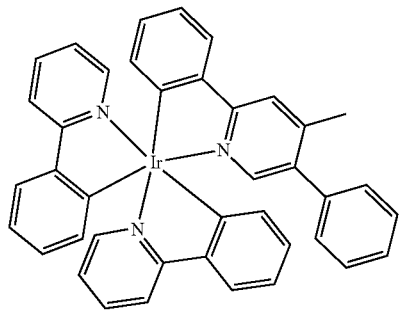

M-a4

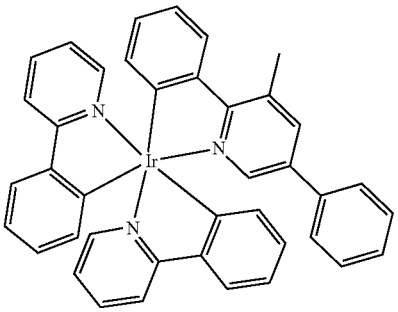

M-a5

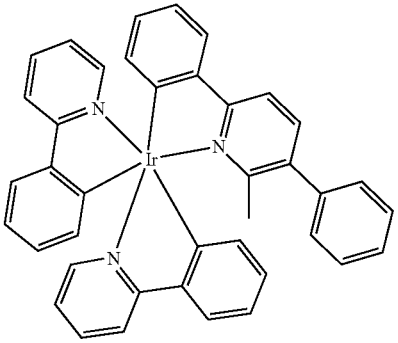

M-a6

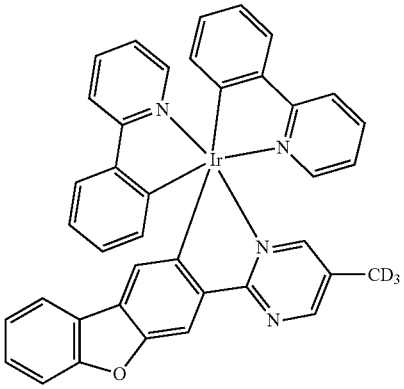

M-a7

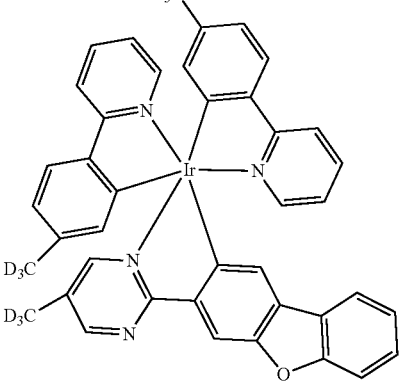

M-a8
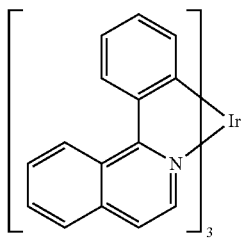
M-a9
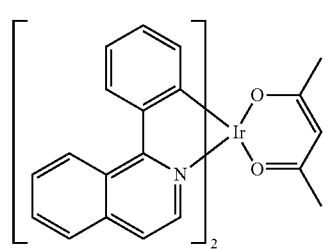
M-a10
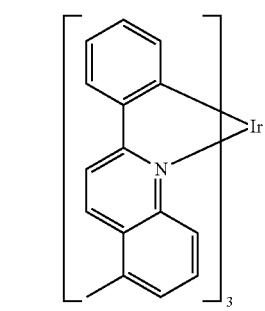
M-a11
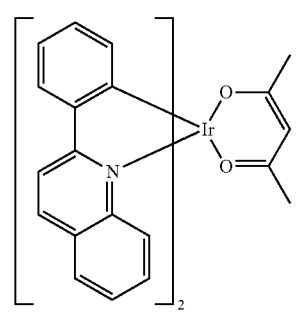
M-a12
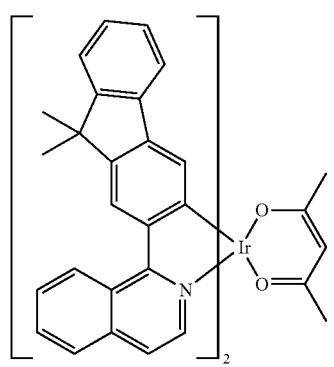
M-a13
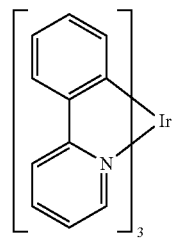
M-a14
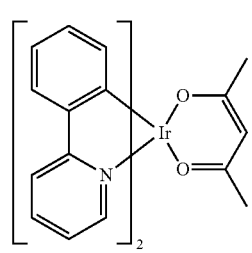
M-a15
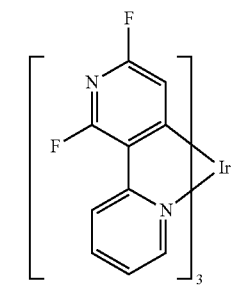
M-a16
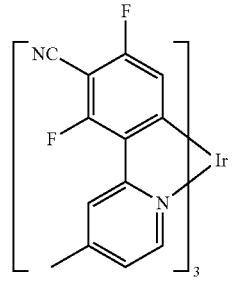
M-a17
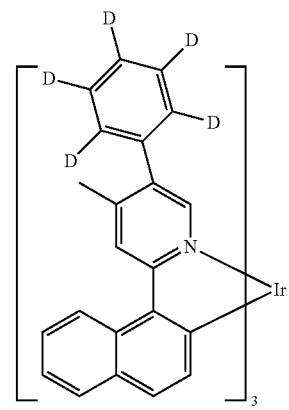

M-a18
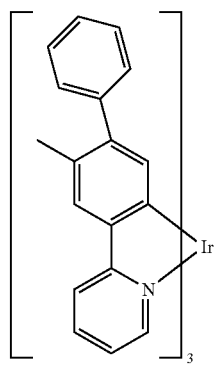
M-a19
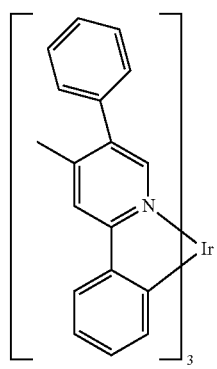
M-a20
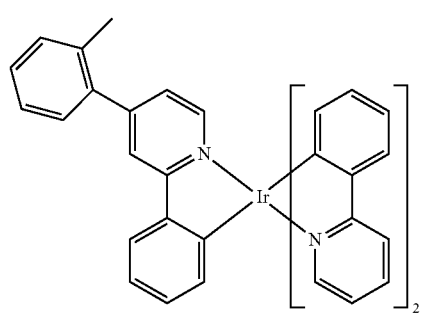
M-a21
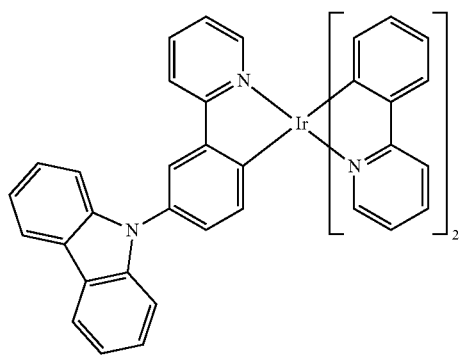
M-a22
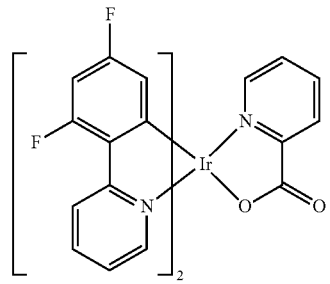
M-a23
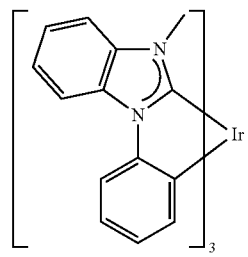
M-a24
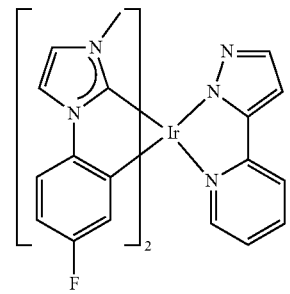
M-a25
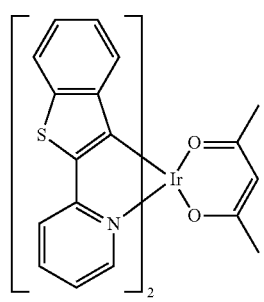
The compounds M-a1 and M-a2 may be utilized as a red dopant material, and the compounds M-a3 to M-a7 may be utilized as a green dopant material.

Formula M-b

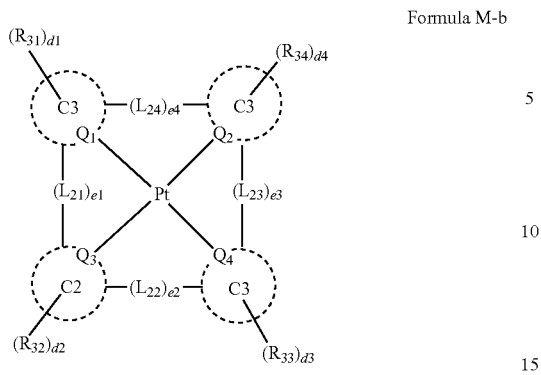

M-b-1

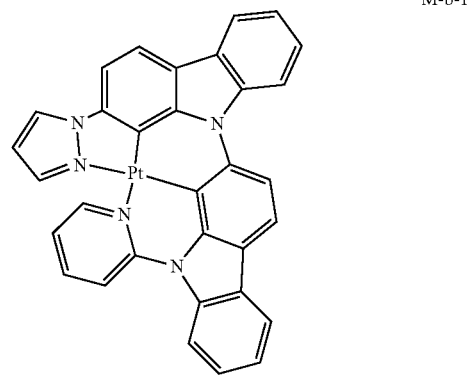

In Formula M-b, $Q_1$ to $Q_4$ may be each independently C or N, and C1 to C4 may be each independently a substituted or unsubstituted hydrocarbon ring having 5 to 30 ring-forming carbon atoms, or a substituted or unsubstituted heterocycle having 2 to 30 ring-forming carbon atoms. L21 to L24 may be each independently a direct linkage, M-b-2

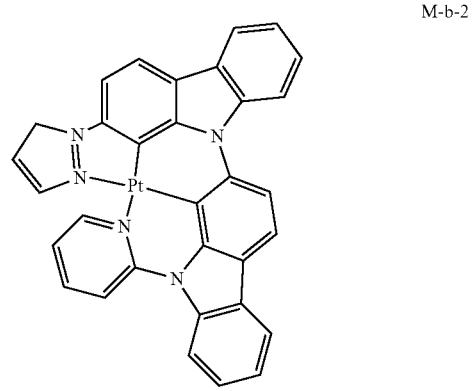

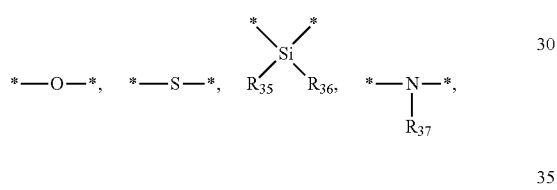

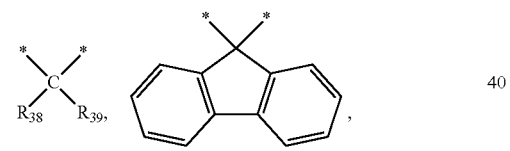

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may be each independently 0 or 1. $R_{31}$ to $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring, and d1 to d4 may be each independently an integer of 0 to 4.

The compound represented by Formula M-b may be utilized as a blue phosphorescent dopant and/or a green phosphorescent dopant.

The compound represented by Formula M-b may include any one of the compounds below. However, the compounds below are presented as an example, and the compound represented by Formula M-b is not limited to those represented by the compounds below.

M-b-3

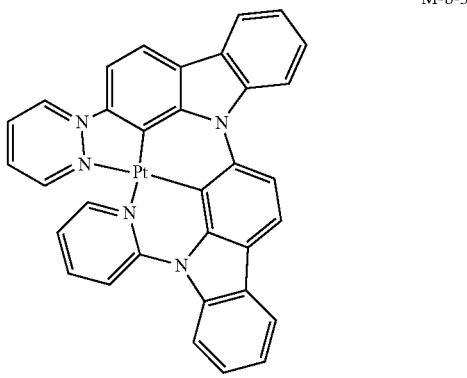

M-b-4

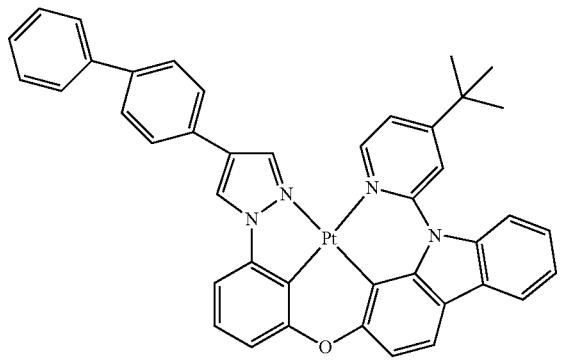

M-b-5

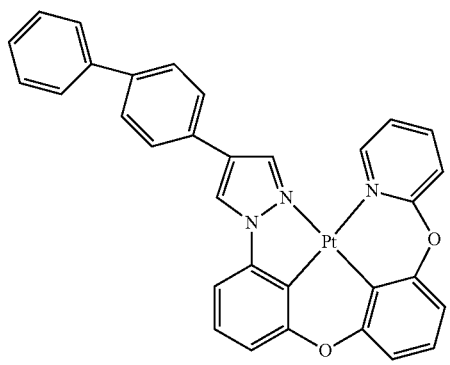

M-b-9

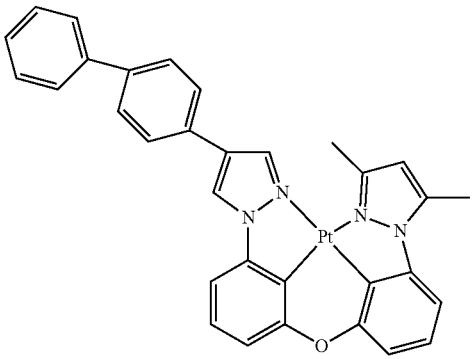

M-b-6

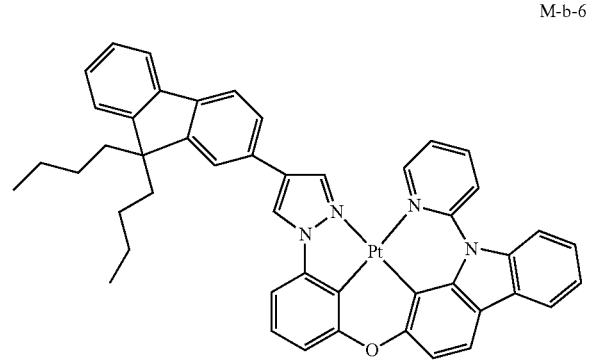

M-b-10

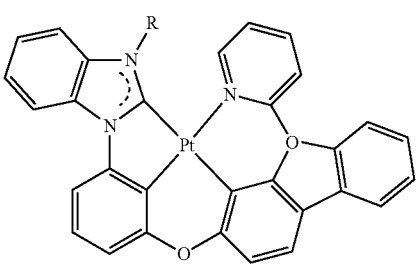

M-b-11

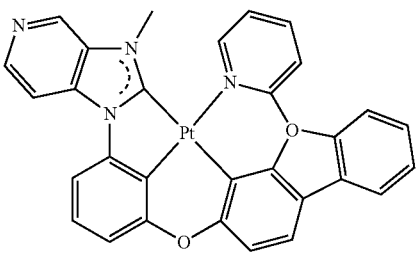

M-b-7

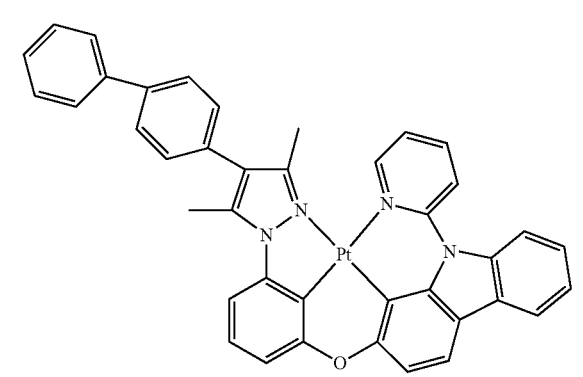

M-b-12

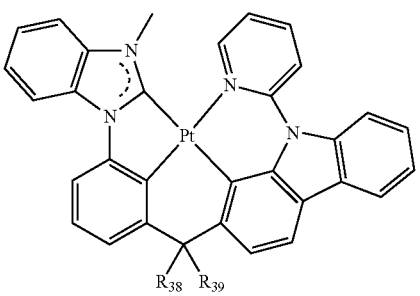

M-b-8

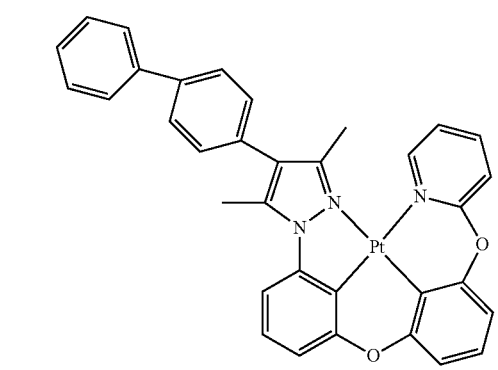

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include, in addition to a light emitting polymer compound according to an embodiment, a compound represented by any one of Formulas F-a to F-c below. The compounds represented by Formulas F-a to F-c below may be utilized as a fluorescent dopant material.

Formula F-a

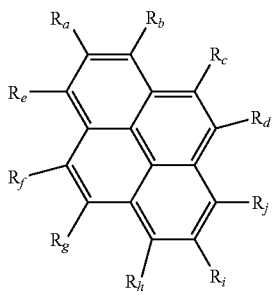

In Formula F-a above, two selected from $R_a$ to $R_j$ may be each independently represented by (e.g., substituted with) *—$NAr_1Ar_2$. The rest of $R_a$ to $R_j$ which are not substituted with *—$NAr_1Ar_2$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing 0 or S as a ring-forming atom.

Formula F-b

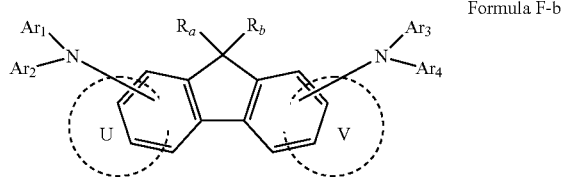

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring. $Ar_1$ to $Ar_4$ may be independently the same as $Ar_1$ described above in connection with Formula F-a.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, In Formula F-b, when the number of U or V is 1, one ring forms a condensed ring in a portion (e.g., position) indicated by U or V, and when the number of U or V is 0, it suggests that no ring in the position indicated by U or V is present. For example, when the number of U is 0 and the number of V is 1, or when the number of U is 1 and the number of V is 0, a condensed ring having a fluorene core of Formula F-b may be a cyclic compound having four rings. In addition, when both U and V are 0, the condensed ring of Formula F-b may be a cyclic compound having three rings. Furthermore, when both U and V are 1, the condensed ring having a fluorene core of Formula F-b may be a cyclic compound having five rings.

Formula F-c

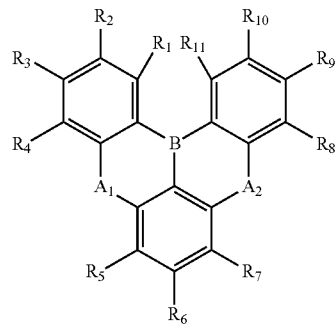

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may be each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; or bonded to an adjacent group to form a ring.

In Formula F-c, $A_1$ and $A_2$ may be each independently bonded to substituents of neighboring rings to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

The emission layer EML may further include, in addition to a light emitting polymer compound according to an embodiment, as a suitable (e.g., known) dopant material, styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and/or N-(4((E)-2-(6-((E)-4-(diphenylamino)styryl)naphthalen-2-Avinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, and/or 1,4-bis(N,N-diphenylamino) pyrene), etc.

The emission layer EML may further include a suitable (e.g., known) phosphorescent dopant material in addition to the light emitting polymer compound according to an embodiment. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), and/or thulium (Tm) may be utilized. For example, iridium(III) bis(4,6-difluorophenylpyridinato-N,C2'), (Flrpic), bis(2,4-difluorophenylpyridinato)-tetrakis(1-pyrazolyl)borate iridium (III) (Fir6), platinum octaethyl porphyrin (PtOEP), etc. may be utilized as a phosphorescent dopant. However, the present disclosure is not limited thereto.

The hole transport region HTR is disposed between the first electrode EL1 and the emission layer EML. The hole transport region HTR may include at least one among a hole injection layer HIL, a hole transport layer HTL, a buffer layer, a light emitting auxiliary layer, and an electron blocking layer EBL. The hole transport region HTR may have, for example, a thickness of about 50 Å to about 15,000 Å.

The hole transport region HTR may have a single layer formed of a single material, a single layer formed of a plurality of different materials, or a multilayer structure having a plurality of layers formed of a plurality of different materials.

For example, the hole transport region HTR may have a single-layer structure formed of the hole injection layer HIL or the hole transport layer HTL, or a single-layer structure formed of a hole injection material or a hole transport material. For example, the hole transport region HTR may have a single-layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in the respective stated order from the first electrode EL1, but the present disclosure is not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

In an embodiment, the hole transport region HTR may include a hole transport polymer compound derived from a mixture of a hole-transporting polymer and an organic compound. The organic compound may be a crosslinking agent. The hole-transporting polymer may be crosslinked by the organic compound. The organic compound may enhance flexibility and strength of the hole transport region HTR by crosslinking the hole-transporting polymer included in the hole transport region HTR.

The organic compound may be a crosslinking agent. In an embodiment, the hole-transporting polymer may include a polyphenylene vinylene-based compound. The vinylene of the polyphenylene vinylene-based compound may be bonded to carbon atoms to which the azide of the organic compound is bonded. A plurality of polyphenylline vinylene-based compounds may be bonded to one organic compound. That is, the polyphenylene vinylene-based compound and the organic compound may be crosslinked. The polyphenylene vinylene-based compound and the organic compound may be cross-linked to enhance the flexibility and strength of the hole transport region HTR.

In the mixture of an embodiment, the polyphenylene vinylene-based compound and the organic compound may have a molar ratio of about 9:1 to about 8:2. When the organic compound in the mixture has a molar ratio of less than 1, crosslinking between the polyphenylene vinylene-based compound and the organic compound is insufficient, and the hole transport region HTR may thus secure (e.g., have suitable) flexibility, but fail to secure (e.g., may not have) satisfactory strength. When the organic compound in the mixture has a molar ratio of greater than 2, crosslinking between the polyphenylene vinylene-based compound and the organic compound may be overly performed, and the hole transport region HTR may thus secure (e.g., have suitable) strength, but fail to secure (e.g., may not have suitable) flexibility.

The hole transport region HTR may include the polymer compound of the hole transport region according to an embodiment described above in at least one among the hole injection layer HIL, the hole transport layer HTL, and the electron blocking layer EBL.

The hole transport region HTR may further include a compound represented by Formula H-1 below in addition to the hole transport polymer compound according to an embodiment.

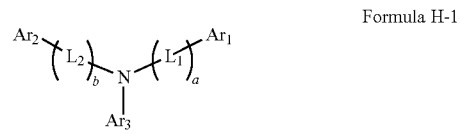

Formula H-1

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. Meanwhile, when a or b is an integer of 2 or greater, a plurality of $L_1$s and $L_2$s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

A compound represented by Formula H-1 above may be a monoamine compound. In some embodiments, the compound represented by Formula H-1 may be a diamine compound in which at least one of $Ar_1$ to $Ar_3$ includes an amine group as a substituent. In addition, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene-based group in at least one of $Ar_1$ or $Ar_2$.

The compound represented by Formula H-1 may include any one of the compounds from Compound Group H below. However, the compounds listed in Compound Group H below are presented as an example, and the compound represented by Formula H-1 is not limited to those listed in Compound Group H below.

Compound Group H
H-1-1
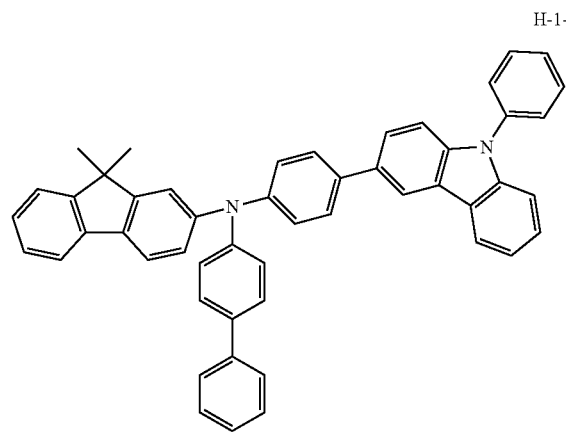
H-1-2
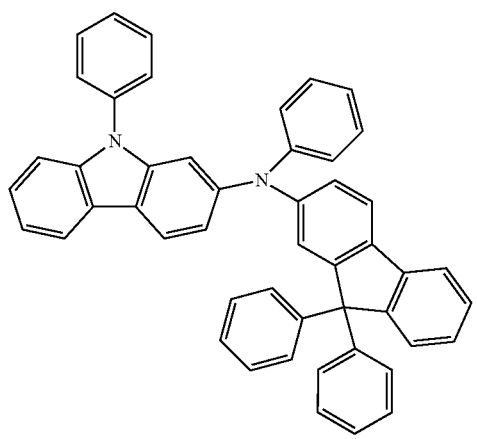
H-1-3
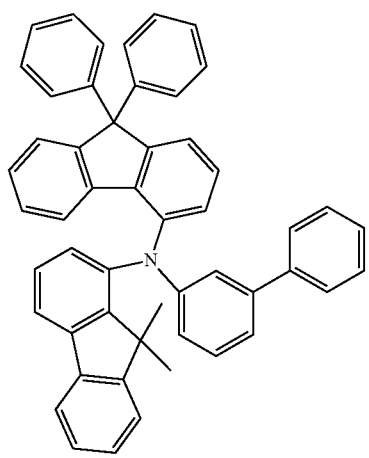
H-1-4
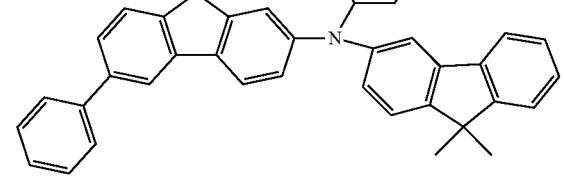
H-1-5
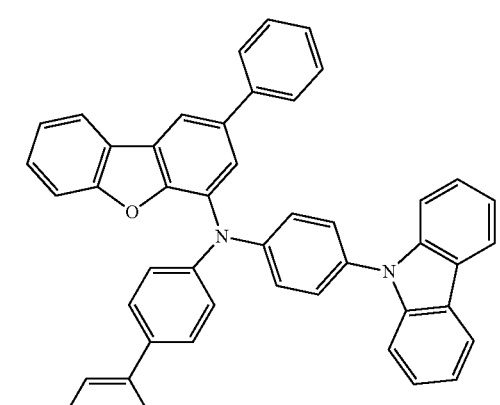
H-1-6
H-1-7
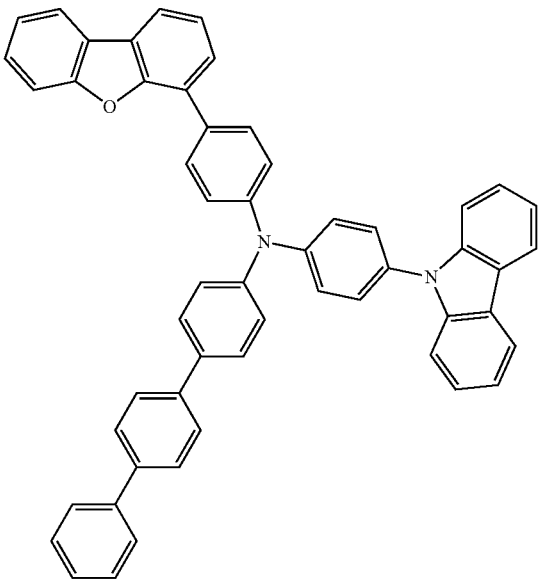

H-1-8
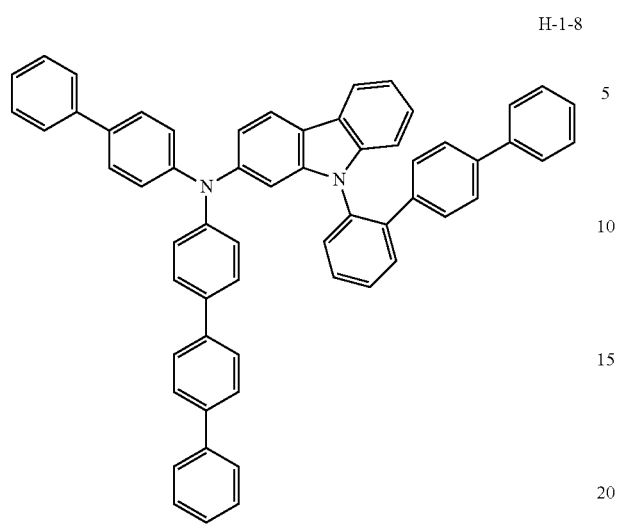
H-1-11
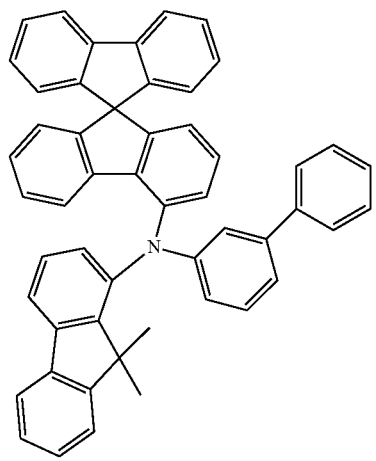
H-1-9
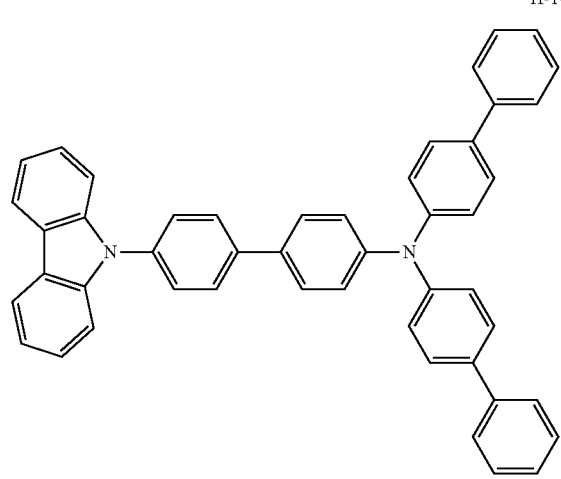
H-1-12
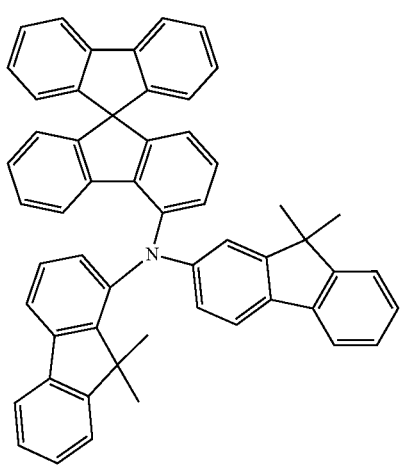
H-1-10
H-1-13
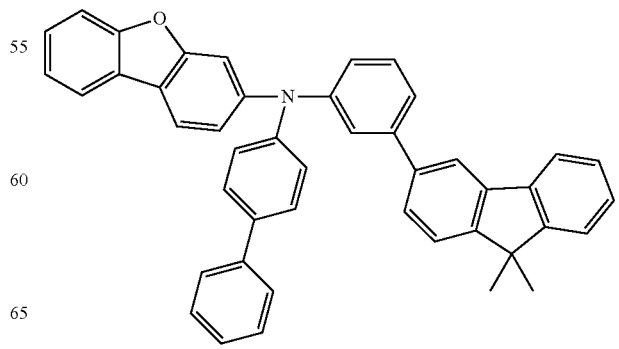

H-1-14

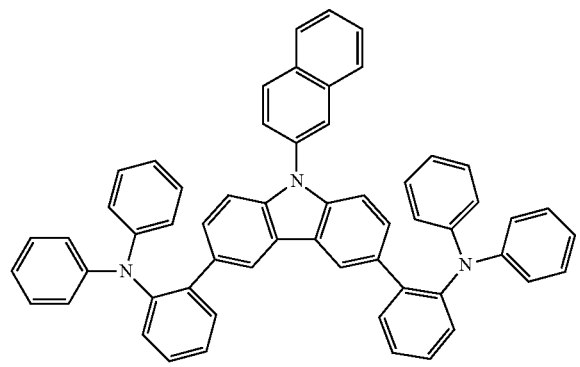

H-1-15

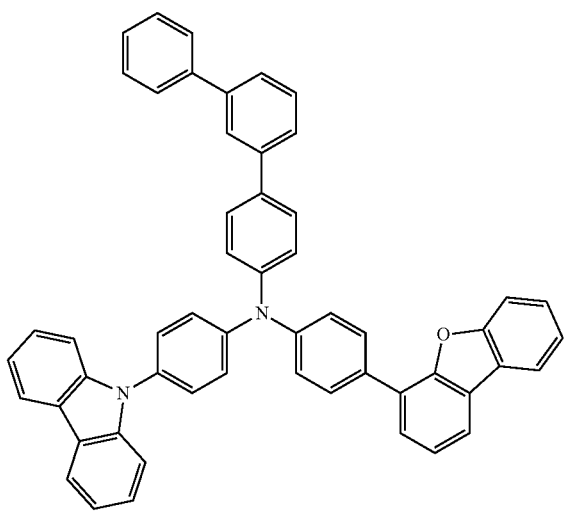

H-1-16

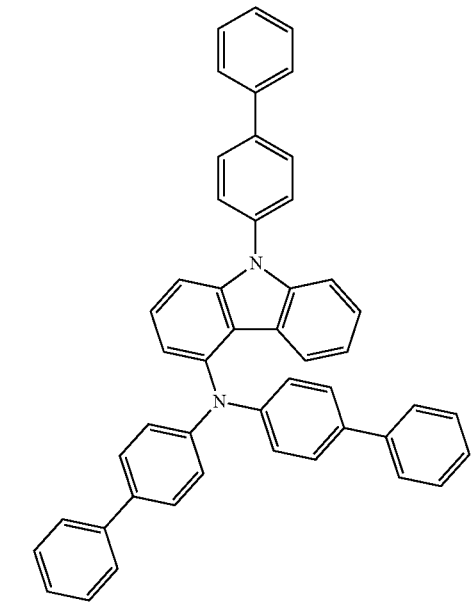

H-1-17

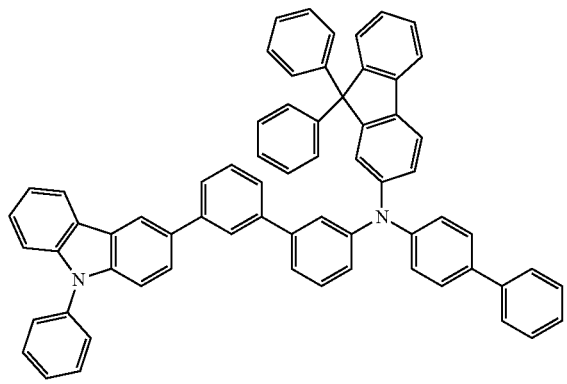

H-1-18

H-1-19

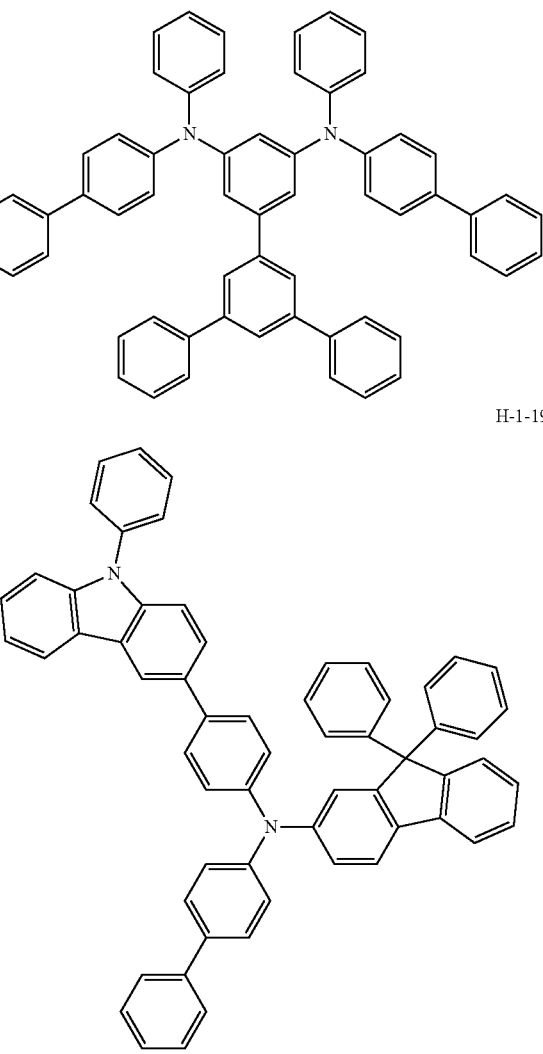

The hole transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N'-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HATCN), etc.

The hole transport region HTR may include one or more carbazole-based derivatives such as N-phenyl carbazole and/or polyvinyl carbazole, one or more fluorene-based derivatives, N,N'-bis(3-methylphenyl)-N,N'-diphenyl-[1,1-biphenyl]-4,4'-diamine (TPD), one or more triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), etc.

In addition, the hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one among the hole injection layer HIL, the hole transport layer HTL, and the electron blocking layer EBL.

The hole transport region HTR may have a thickness of about 100 Å to about 10000 Å, for example, about 100 Å to about 5000 Å. When the hole transport region HTR includes the hole injection layer HIL, the hole injection layer HIL may have a thickness of, for example, about 30 Å to about 1000 Å. When the hole transport region HTR includes the electron blocking layer EBL, the electron blocking layer EBL may have a thickness of, for example, about 10 Å to about 1000 Å. When the thicknesses of the hole transport region HTR, the hole injection layer HIL, the hole transport layer HTL, and the electron blocking layer EBL satisfy the above-described respective ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but the present disclosure is not limited thereto. For example, the p-dopant may include halogenated metal compounds such as CuI and/or RbI, quinone derivatives such as tetracyanoquinodimethane (TCNQ) and/or 2,3,5,6-tetrafluoro-7,7,8,8-tetracyanoquinodimethane (F4-TCNQ), metal oxides such as tungsten oxides and/or molybdenum oxides, cyano group-containing compounds such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but the present disclosure is not limited thereto.

As described above, the hole transport region HTR may further include at least one of a buffer layer or an electron blocking layer EBL in addition to the hole injection layer HIL and the hole transport layer HTL. The buffer layer may compensate a resonance distance according to wavelengths of light emitted from the emission layer EML, and may thus increase luminous efficiency. Materials which may be included in the hole transport region HTR may be utilized as materials included in the buffer layer. The electron blocking layer EBL is a layer that serves to prevent or substantially prevent electrons from being injected from the electron transport region ETR to the hole transport region HTR.

In the light emitting element ED of an embodiment illustrated in FIGS. 4 to 7, an electron transport region ETR is provided on the emission layer EML. The electron transport region ETR may include at least one among a hole blocking layer HBL, an electron transport layer ETL, and an electron injection layer EIL, but the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL are stacked in the respective stated order from the emission layer EML, but the present disclosure is not limited thereto. The electron transport region ETR may have a thickness of, for example, about 1000 Å to about 1500 Å.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

In an embodiment, the electron transport region ETR may include an electron transport polymer compound derived from a mixture of an electron-transporting polymer and an organic compound.

The organic compound may be a crosslinking agent. The electron-transporting polymer may be crosslinked by the organic compound. The organic compound may provide flexibility and strength of the electron transport region ETR by crosslinking the electron-transporting polymer included in the electron transport region ETR.

In the mixture of an embodiment, the electron-transporting polymer and the organic compound may have a molar ratio of about 9:1 to about 8:2. When the organic compound in the mixture has a molar ratio of less than 1, crosslinking between the electron-transporting polymer and the organic compound is insufficient, and the electron transport region ETR may thus secure (e.g., have suitable) flexibility, but fail to secure strength. When the organic compound in the mixture has a molar ratio of greater than 2, crosslinking between the electron-transporting polymer and the organic compound is overly performed, and the electron transport region ETR may thus secure (e.g., have suitable) strength, but fail to secure (e.g., may not have suitable) flexibility.

The electron transport region ETR may include an electron transport polymer compound according to an embodiment described above in at least one among the electron injection layer EIL, the electron transport layer ETL, and the electron blocking layer EBL.

The electron transport region ETR may further include a compound represented by Formula ET-1 below in addition to the electron transport polymer compound according to an embodiment.

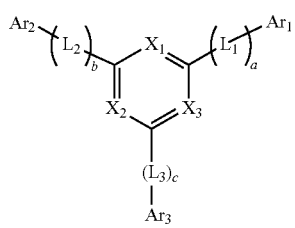

Formula ET-1

In Formula ET-1, at least one of $X_1$ to $X_3$ is N and the rest (e.g., a remainder thereof) are each independently $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. Meanwhile, when a to c are an integer of 2 or greater, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may further include at least one of compounds ET1 to ET36 below.

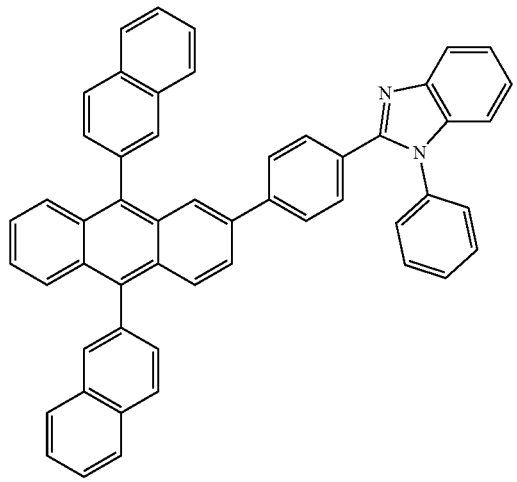

ET1

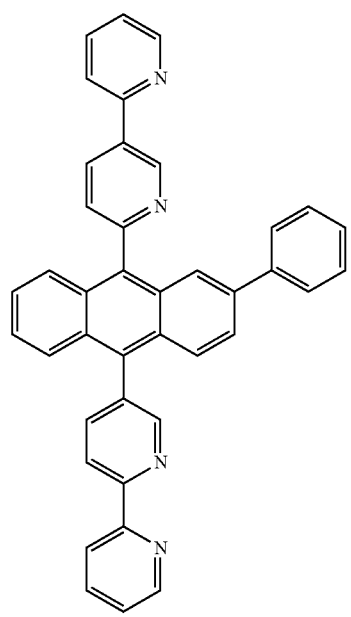

ET2

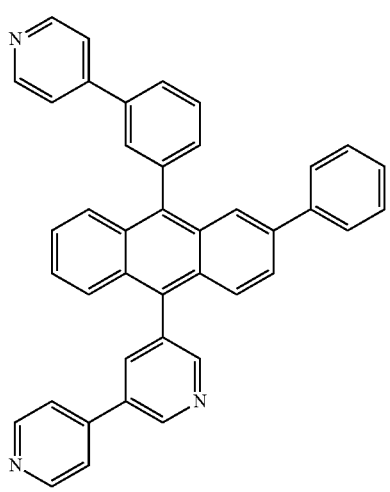

ET3

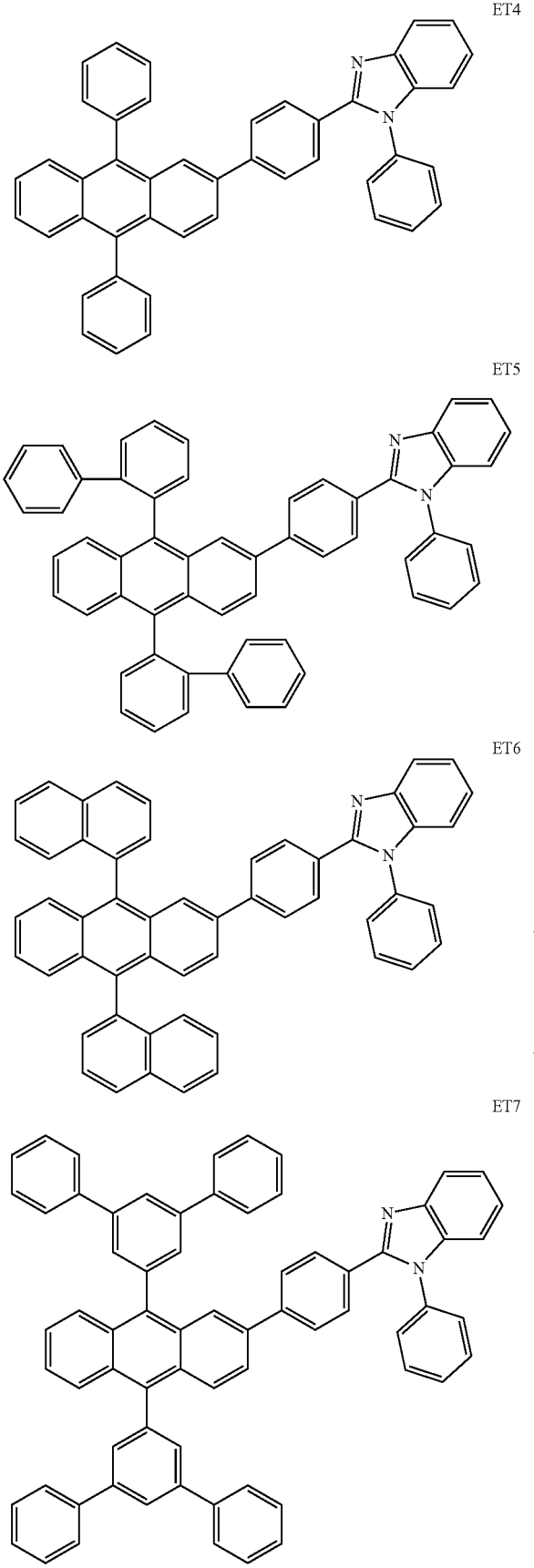
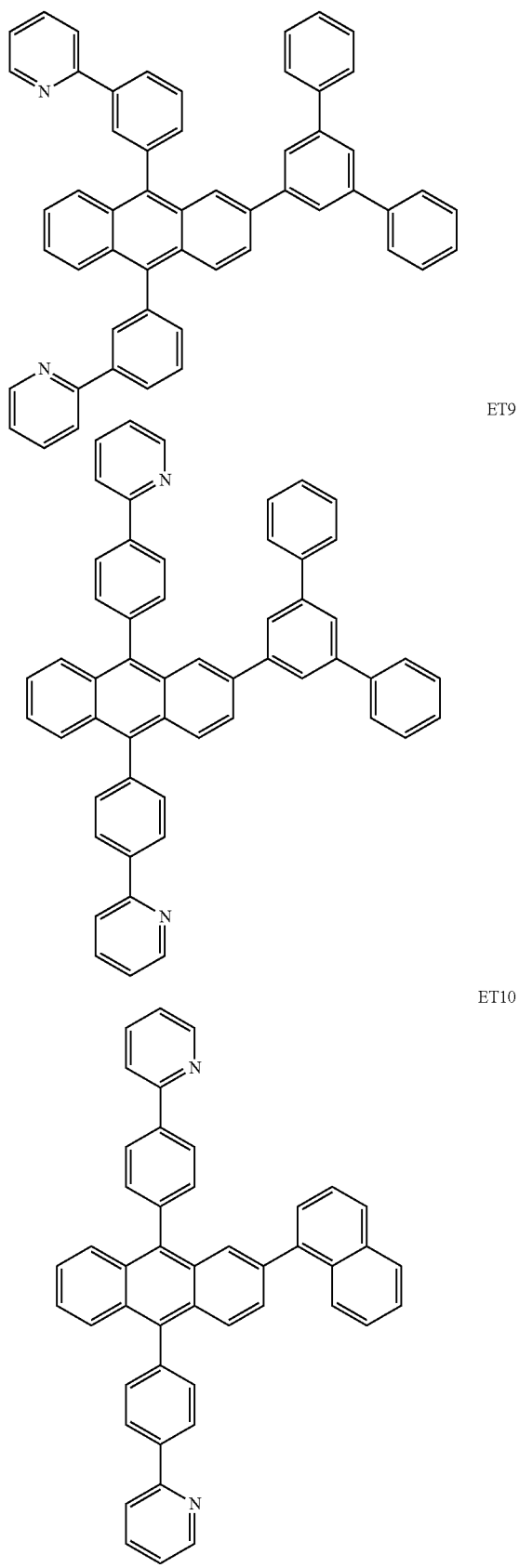

ET11
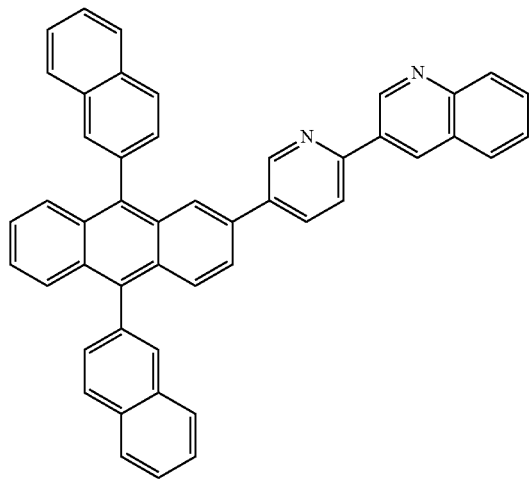
ET14
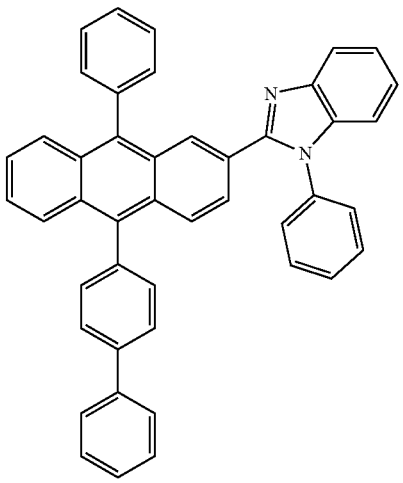
ET12
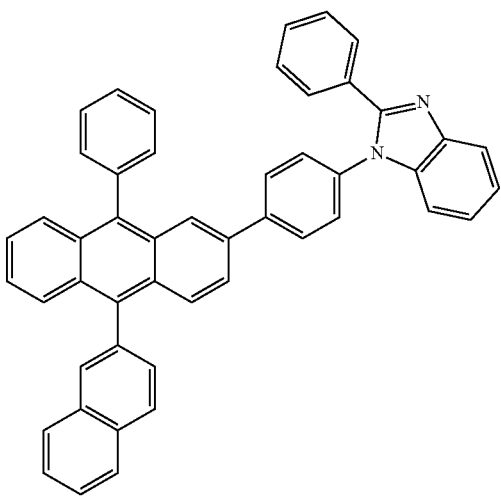
ET15
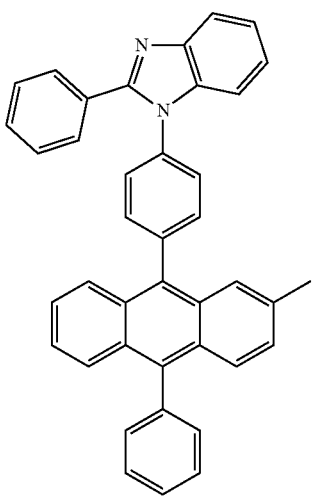
ET13
ET16
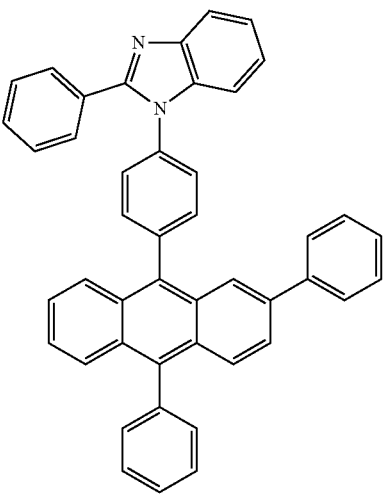

ET17
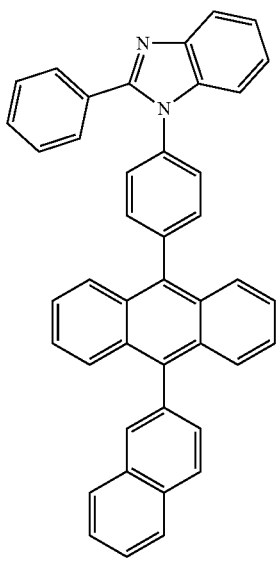
ET20
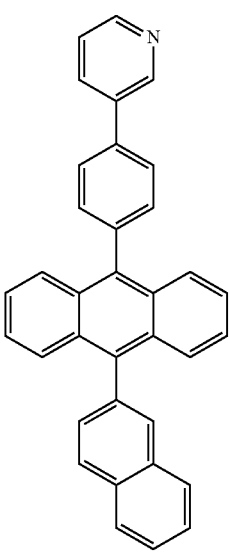
ET18
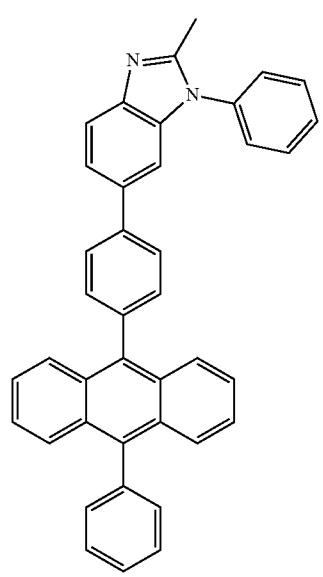
ET21
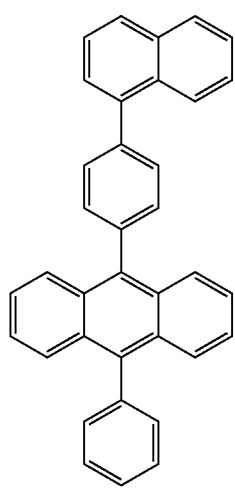
ET19
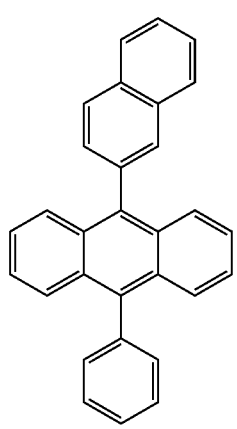
ET22
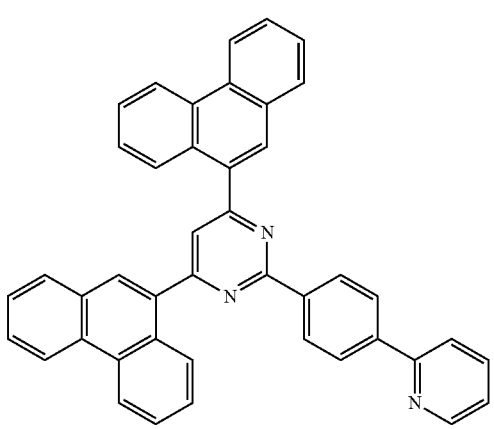

ET23
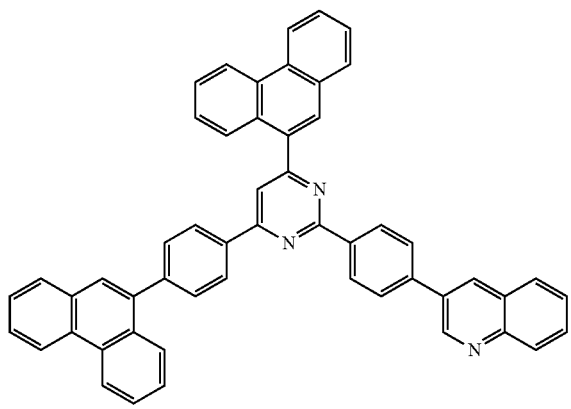
ET26
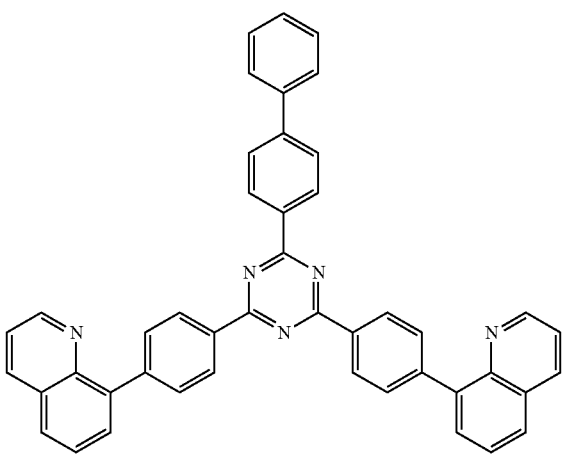
ET24
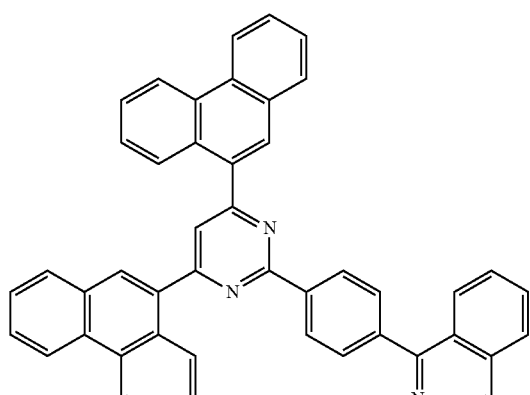
ET27
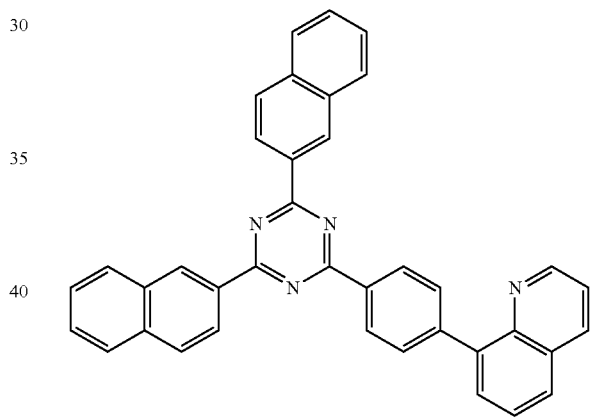
ET25
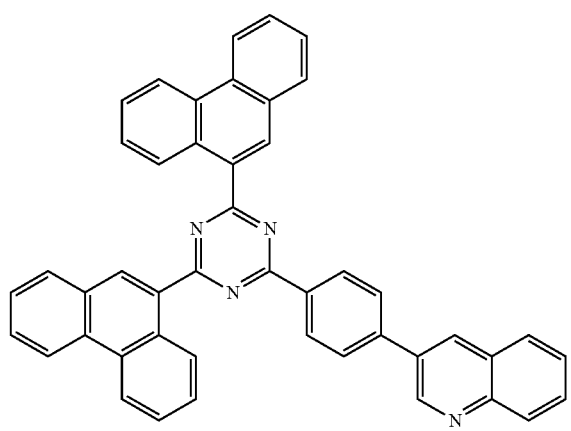
ET28
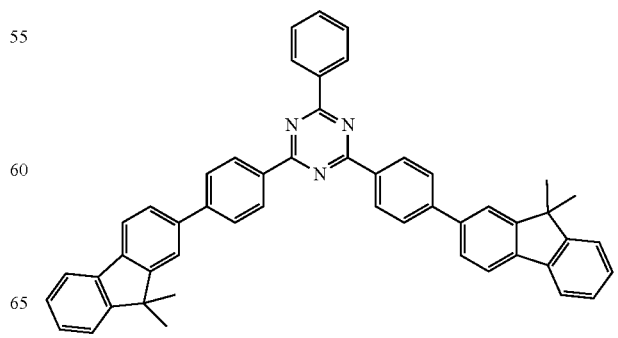

-continued
ET29
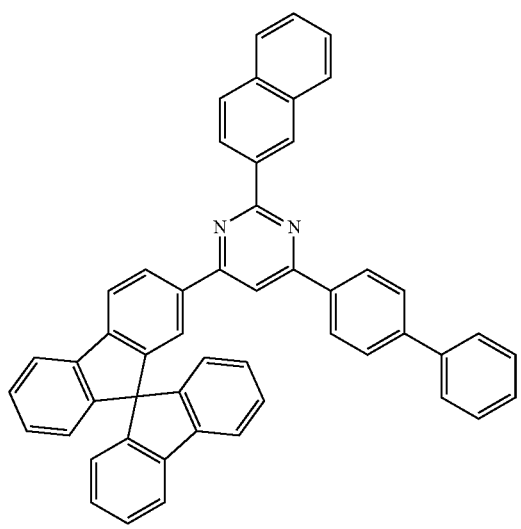
ET30
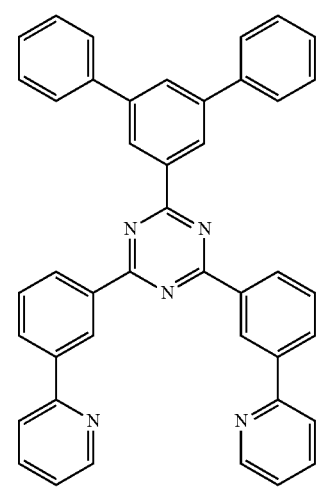
ET31
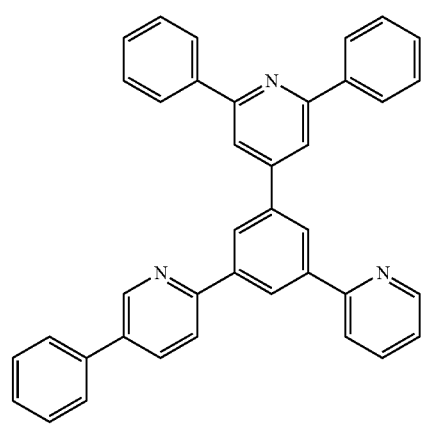
-continued
ET32
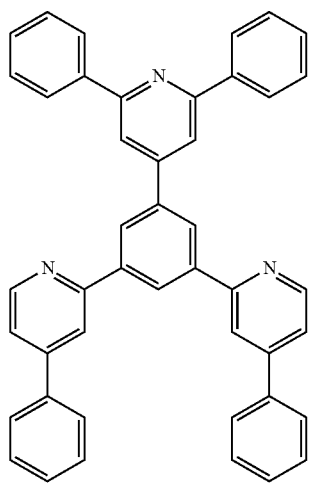
ET33
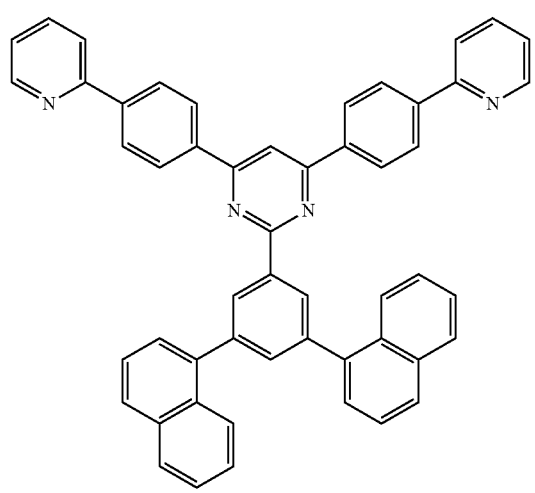
ET34
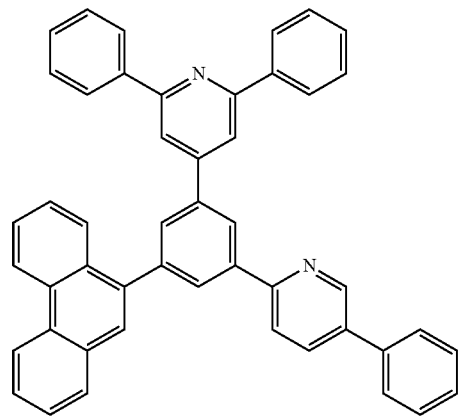

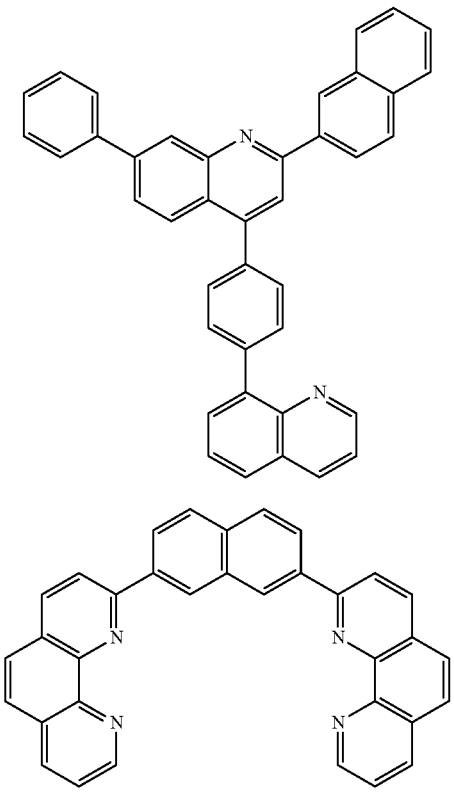

In addition, the electron transport region ETR may include one or more halogenated metals such as LiF, NaCl, CsF, RbCl, RbI, CuI, and/or KI, one or more lanthanide metals such as Yb, one or more co-deposition materials of a halogenated metal and a lanthanide metal. For example, the electron transport region ETR may include KI:Yb, RbI:Yb, etc. as a co-deposition material. In some embodiments, for the electron transport region ETR, a metal oxide such as $Li_2O$ and/or BaO, or 8-hydroxyl-lithium quinolate (Liq), etc. may be utilized, but the present disclosure is limited thereto. The electron transport region ETR may also be formed of a mixture material of an electron transport material and an insulating organo-metal salt. The organo-metal salt may be a material having an energy band gap of about 4 eV or greater. For example, the organo-metal salt may include, for example, one or more metal acetates, one or more metal benzoates, one or more metal acetoacetates, one or more metal acetylacetonates, and/or one or more metal stearates.

The electron transport region ETR may further include, for example, at least one of 2,9-dimethyl-4,7-diphenyl-1,10-phenanthroline (BCP) or 4,7-diphenyl-1,10-phenanthroline (Bphen) in addition to the materials described above, but the present disclosure is not limited thereto.

The electron transport region ETR may include the compounds of the electron transport region described above in at least one among the electron injection layer EIL, the electron transport layer ETL, and the hole blocking layer HBL.

When the electron transport region ETR includes the electron transport layer ETL, the electron transport layer ETL may have a thickness of about 100 Å to about 1000 Å, for example, about 150 Å to about 500 Å. When the thickness of the electron transport layer ETL satisfies the above-described ranges, satisfactory electron transport properties may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode, but the present disclosure is not limited thereto. For example, when the first electrode EU is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In some embodiments, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, and/or oxides of the above-described metal materials.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the light emitting element ED according to an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, and/or an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$ CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or may include epoxy resins and/or acrylates such as methacrylates. However, the present disclosure is not limited thereto, and the capping layer CPL may include at least one of compounds P1 to P5 below.

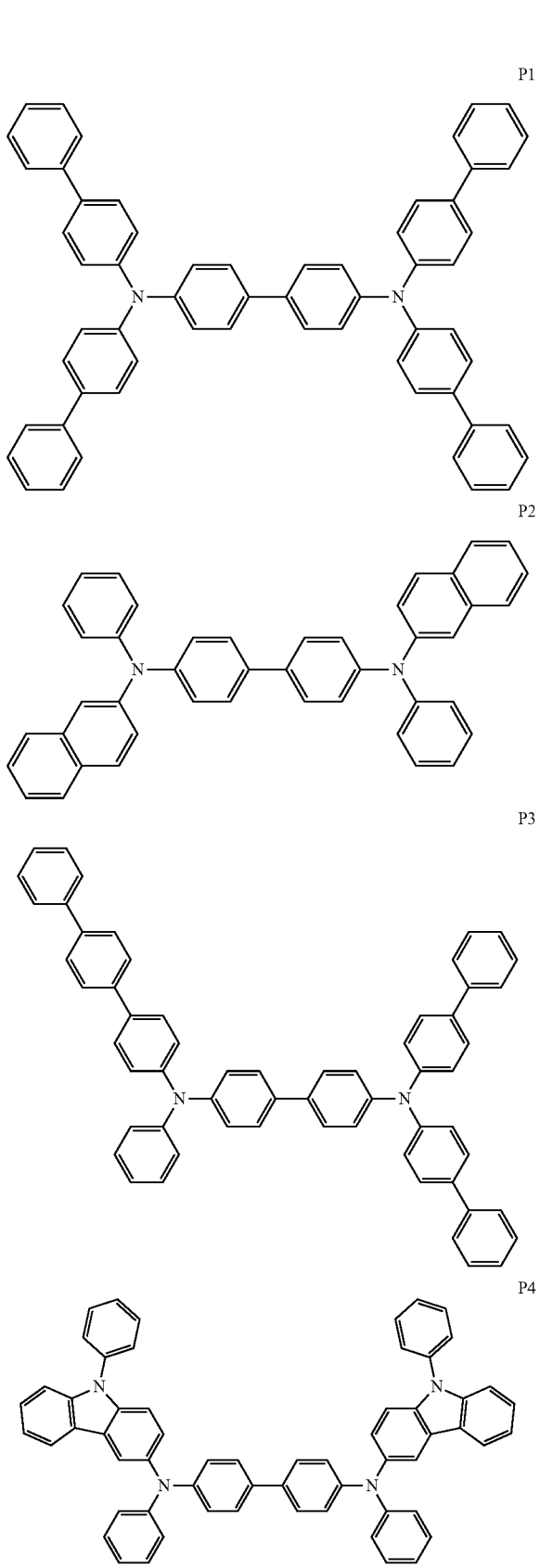

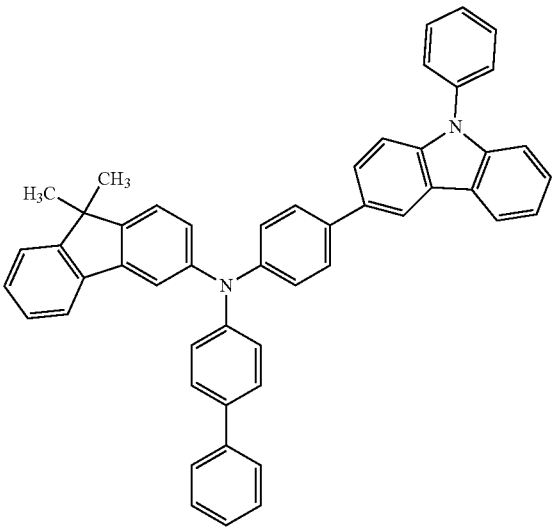

In some embodiments, the capping layer CPL may have a refractive index of about 1.6 or greater. For example, the capping layer CPL may have a refractive index of about 1.6 or greater in a wavelength range of about 550 nm to about 660 nm.

Figure 8:
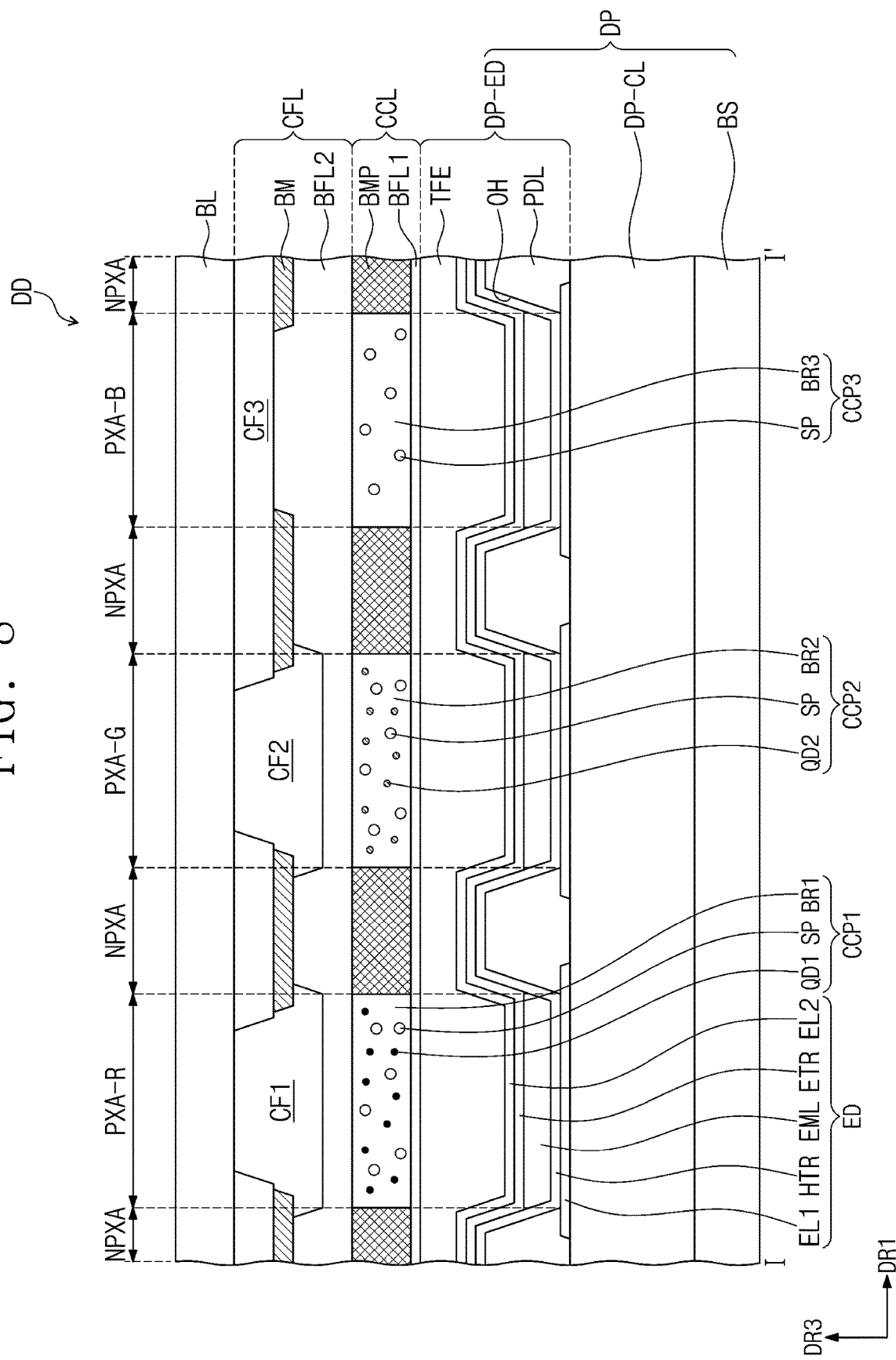
FIG. 8 is a cross-sectional view of a display device according to an embodiment.
Figure 9:
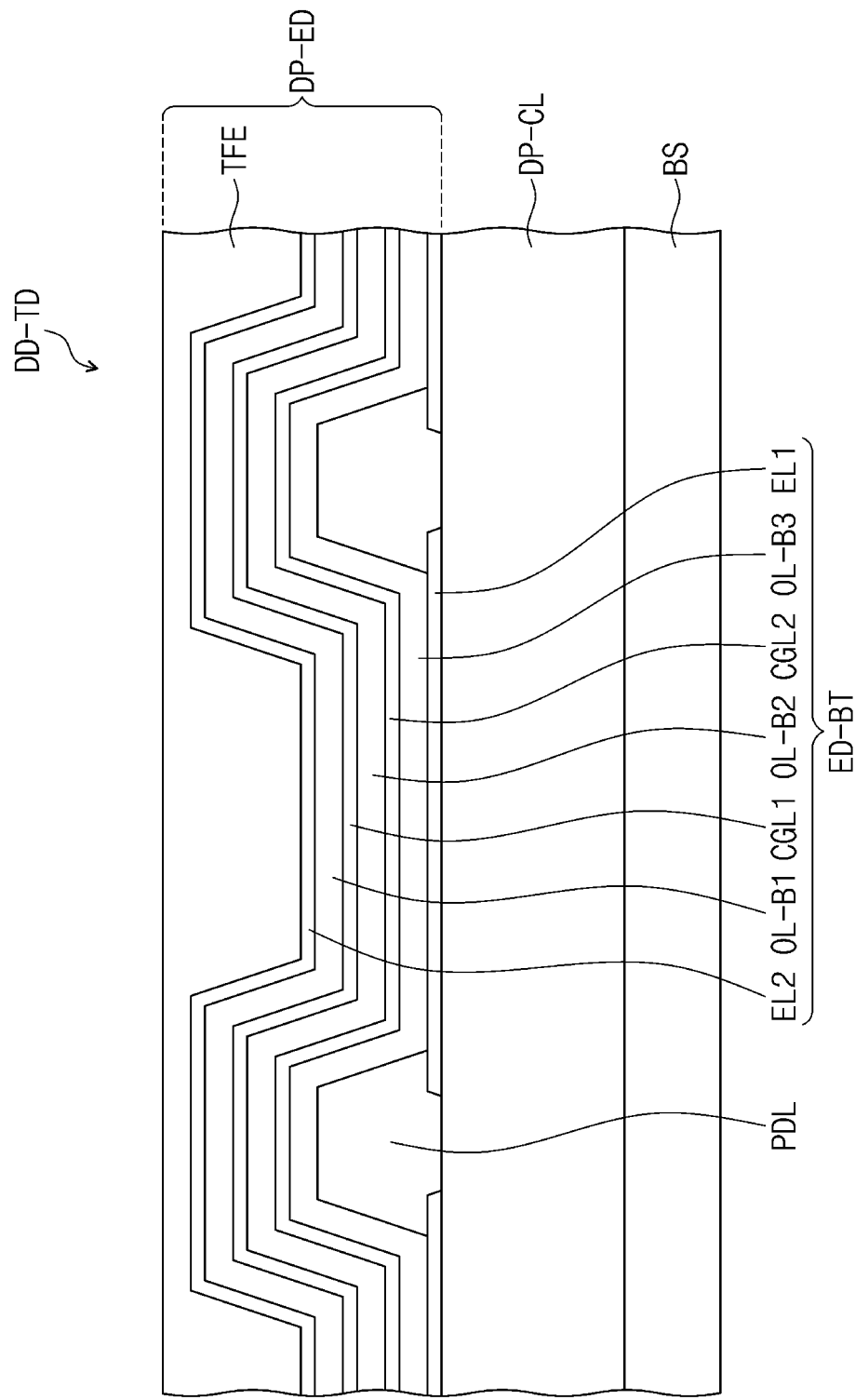
FIG. 9 is a cross-sectional view of a display device according to an embodiment.

FIGS. 8 and 9 each are cross-sectional views of a display device according to an embodiment. Hereinafter, in the description of the display device according to an embodiment with reference to FIGS. 8 and 9, content overlapping the one described above with reference to FIGS. 1A to 7 will not be described again, and the differences will be mainly described.

Referring to FIG. 8, a display device DD according to an embodiment may include a display panel DP having a display element layer DP-ED, a light control layer CCL disposed on the display panel DP, and a color filter layer CFL.

In an embodiment illustrated in FIG. 9, the display panel DP may include a base layer BS, a circuit layer DP-CL provided on the base layer BS, and a display element layer DP-ED, and the display element layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. Meanwhile, a structure of the light emitting element ED shown in FIG. 8 may be the same as the structure of the light emitting element of FIGS. 4 to 7 described above.

Referring to FIG. 8, the emission layer EML may be disposed in the opening OH defined in the pixel defining film PDL. For example, the emission layer EML separated by the pixel defining film PDL and provided corresponding to each of light emitting areas PXA-R, PXA-G, and PXA-B may emit light in the same wavelength ranges. In the display device DD of an embodiment, the emission layer EML may emit blue light. Meanwhile, unlike the one illustrated, in an embodiment, the emission layer EML may be provided as a common layer throughout the light emitting areas PXA-R, PXA-G, and PXA-B.

The light control layer CCL may be disposed on the display panel DP. The light control layer CCL may include a photoconverter. The photoconverter may be a quantum dot and/or a phosphor. The photoconverter may convert the wavelength of received light, and emit the resulting light. That is, the light control layer CCL may be a layer containing quantum dots and/or phosphors.

The light control layer CCL may include a plurality of light control units CCP1, CCP2, and CCP3. The light control units CCP1, CCP2, and CCP3 may be spaced apart from each other.

Referring to FIG. 8, a division pattern BMP may be disposed between the light control units CCP1, CCP2, and CCP3 spaced apart from each other, but the present disclosure is not limited thereto. In FIG. 7, the division pattern BMP is shown to not overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 for converting a first color light provided from the light emitting element ED into a second color light, a second light control unit CCP2 including a second quantum dot QD2 for converting the first color light into a third color light, and a third light control unit CCP3 for transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting element ED. For example, the first quantum dot QD1 may be a red quantum dot (e.g., red-light emitting quantum dot) and the second quantum dot QD2 may be a green quantum dot (e.g., green-light emitting quantum dot). The same descriptions above may be applied to the quantum dots QD1 and QD2.

In addition, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be an inorganic particle. For example, the scatterer SP may include at least one among $TiO_2$, $ZnO$, $Al_2O_3$, $SiO_2$, and hollow silica. The scatterer SP may include any one among $TiO_2$, $ZnO$, $Al_2O_3$, $SiO_2$, and hollow silica, or may be a mixture of two or more materials selected from $TiO_2$, $ZnO$, $Al_2O_3$, $SiO_2$, and hollow silica.

The first light control unit CCP1, the second light control unit CCP2, and the third light control unit CCP3 each may include base resins BR1, BR2, and BR3 respectively for dispersing the quantum dots QD1 and QD2 and the scatterer SP. In an embodiment, the first light control unit CCP1 may include the first quantum dot QD1 and the scatterer SP dispersed in the first base resin BR1, the second light control unit CCP2 may include the second quantum dot QD2 and the scatterer SP dispersed in the second base resin BR2, and the third light control unit CCP3 may include the scatterer SP dispersed in the third base resin BR3. The base resins BR1, BR2, and BR3 are each a medium in which the quantum dots QD1 and QD2 and the scatterer SP are respectively dispersed, and may be formed of various suitable resin compositions, which may be generally referred to as a binder. For example, the base resins BR1, BR2, and BR3 may be an acrylic-based resin, a urethane-based resin, a silicone-based resin, an epoxy-based resin, etc. The base resins BR1, BR2, and BR3 may be a transparent resin. In an embodiment, the first base resin BR1, the second base resin BR2, and the third base resin BR3 each may be the same as or different from each other.

The light control layer CCL may include a barrier layer BFL1. The barrier layer BFL1 may serve to prevent or substantially prevent moisture and/or oxygen (hereinafter referred to as "moisture/oxygen") from being introduced. The barrier layer BFL1 may be disposed on the light control units CCP1, CCP2, and CCP3 to prevent or substantially prevent the light control units CCP1, CCP2, and CCP3 from being exposed to moisture/oxygen. In some embodiments, the barrier layer BFL1 may cover the light control units CCP1, CCP2, and CCP3. In addition, a barrier layer BFL2 may be provided between the light control units CCP1, CCP2, and CCP3 and the color filter layer CFL.

The barrier layers BFL1 and BFL2 may include at least one inorganic layer. That is, the barrier layers BFL1 and BFL2 may be formed of an inorganic material. For example, the barrier layers BFL1 and BFL2 may be formed to include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or a metal thin film in which light transmittance is secured (e.g., suitable), etc. That is, the barrier layers BFL1 and BFL2 may further include an organic film. The barrier layers BFL1 and BFL2 may be formed of a single layer or a plurality of layers.

In the display device DD of an embodiment, the color filter layer CFL may be disposed on the light control layer CCL. For example, the color filter layer CFL may be directly disposed on the light control layer CCL. In this case, the barrier layer BFL2 may be omitted.

The color filter layer CFL may include a light blocking unit BM and filters CF-B, CF-G, and CF-R. That is, the color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymer photosensitive resin, a pigment and/or a dye. The first filter CF1 may include a red pigment and/or a red dye, the second filter CF2 may include a green pigment and/or a green dye, and the third filter CF3 may include a blue pigment and/or a blue dye. Meanwhile, the present disclosure is not limited thereto, and the third filter CF3 may not include a pigment and/or a dye. The third filter CF3 may include a polymer photosensitive resin, but may not include a pigment and/or a dye. The third filter CF3 may be transparent. The third filter CF3 may be formed of a transparent photosensitive resin.

In addition, in an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may be formed including an organic light blocking material and/or an inorganic light blocking material, both including a black pigment and/or a black dye. The light blocking unit BM may prevent or reduce light leakage, and separate boundaries between the adjacent filters CF1, CF2, and CF3. In addition, in an embodiment, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

The base substrate BL may be disposed on the color filter layer CFL. The base substrate BL may be a member providing a base surface on which the color filter layer CFL and the light control layer CCL are disposed. The base substrate BL may be a glass substrate, a metal substrate, a plastic substrate, etc. However, the present disclosure is not limited thereto, and the base substrate BL may be an inorganic layer, an organic layer, or a composite material layer. In addition, unlike the one shown, the base substrate BL may be omitted in an embodiment.

FIG. 9 is a cross-sectional view showing a portion of a display device according to an embodiment; FIG. 9 illustrates a cross-sectional view of a portion corresponding to the display panel DP of FIG. 8. In a display device DD-TD of an embodiment, a light emitting element ED-BT may include a plurality of light emitting structures OL-B1, OL-B2, and OL-B3. The light emitting element ED-BT may include the first electrode EU and the second electrode EL2 facing each other, and the plurality of light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include the emission layer EML (FIG. 8), a hole transport region HTR and an electron transport region ETR disposed with the emission layer EML (FIG. 8) therebetween.

That is, the light emitting element ED-BT included in the display device DD-TD according to an embodiment may be a light emitting element having a tandem structure including a plurality of emission layers.

In an embodiment illustrated in FIG. 9, light emitted from each of the light emitting structures OL-B1, OL-B2, and OL-B3 may all be blue light. However, the present disclosure is not limited thereto, and wavelength ranges of light emitted from each of the light emitting structures OL-B1, OL-B2, and OL-B3 may be different from each other. For example, the light emitting element ED-BT including the plurality of light emitting structures OL-B1, OL-B2, and OL-B3 emitting light in different wavelength ranges may emit white light.

A charge generation layer CGL (CGL1 and CGL2) may be disposed between neighboring light emitting structures OL-B1, OL-B2, and OL-B3. The charge generation layer CGL may include a p-type charge generation layer and/or an n-type charge generation layer.

Hereinafter, a method for manufacturing a light emitting element according to an embodiment will be described in more detail with reference to FIGS. 10 to 13B. The structural features of the above-described light emitting element will not be described again, and features of the manufacturing method will be described in more detail.

Figure 10:
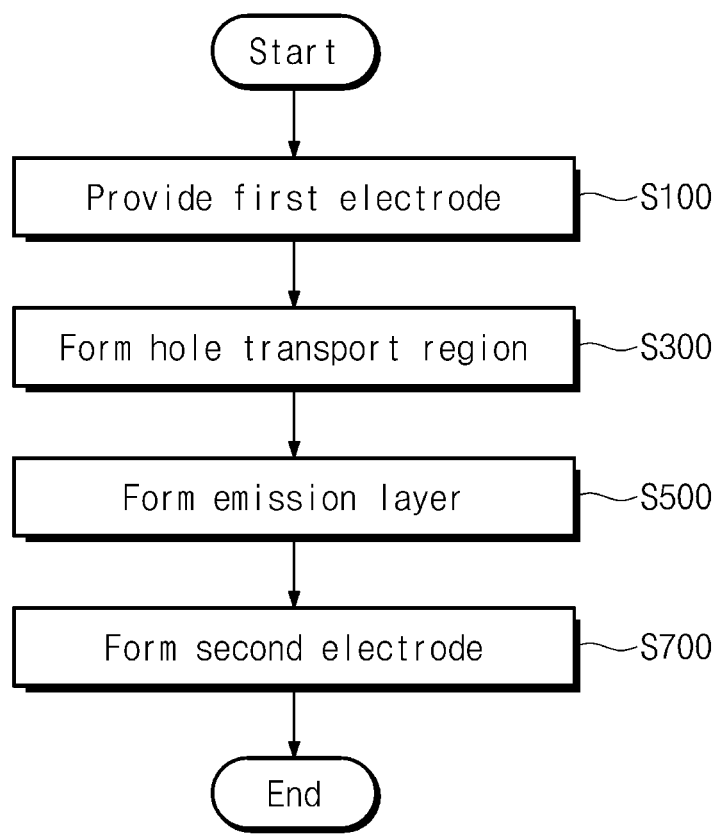
FIG. 10 is a flowchart illustrating a method for manufacturing a light emitting element according to an embodiment.
Figure 11:
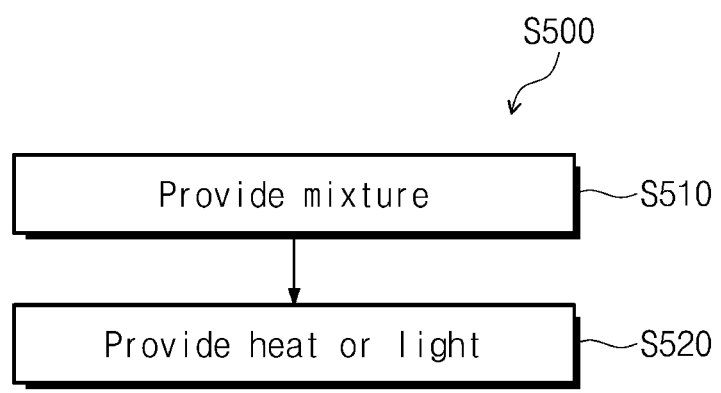
FIG. 11 is a flowchart illustrating in more detail one process (e.g., step) in a method for manufacturing a light emitting element according to an embodiment.
Figure 12:
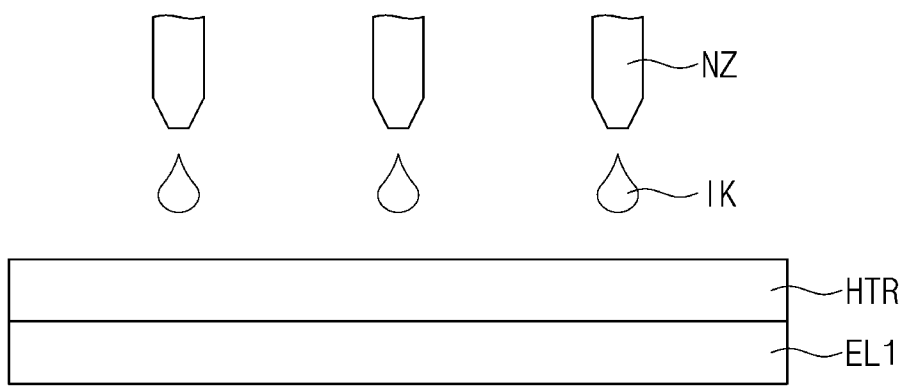
FIG. 12 is a view schematically illustrating one process (e.g., step) in a method for manufacturing a light emitting element according to an embodiment.

FIG. 10 is a flowchart of a method for manufacturing a light emitting element according to an embodiment. FIG. 11 is a flowchart illustrating in more detail one process (e.g., step) in a method for manufacturing a light emitting element according to an embodiment. FIGS. 12 to 13B are views each schematically illustrating one process (e.g., step) in a method for manufacturing a light emitting element according to an embodiment.

Referring to FIG. 10, a method for manufacturing a light emitting element according to an embodiment includes providing a first electrode S100, forming a hole transport region S300, forming an emission layer S500, and forming a second electrode S700. The forming of a hole transport region S300 may refer to forming a hole transport region on the first electrode. The forming of an emission layer S500 may refer to forming an emission layer on the hole transport region. The forming of a second electrode S700 may refer to forming a second electrode on the emission layer.

FIG. 11 is a flowchart illustrating in more detail the forming of an emission layer S500. Referring to FIG. 11, the forming of an emission layer S500 may include providing a mixture S510, and providing heat and/or light S520.

FIG. 12 is a view schematically illustrating providing a mixture S510 according to an embodiment. Referring to FIG. 12, the providing of a mixture S510 according to an embodiment may refer to providing a mixture IK on the hole transport region HTR, utilizing a nozzle NZ. The providing of a mixture S510 may be performed through inkjet printing.

The mixture IK may contain a polyphenylene vinylene-based compound and an organic compound. The mixture IK may contain a polyphenylene vinylene-based compound and an organic compound in a molar ratio of 9:1 to 8:1.

Figure 13A:
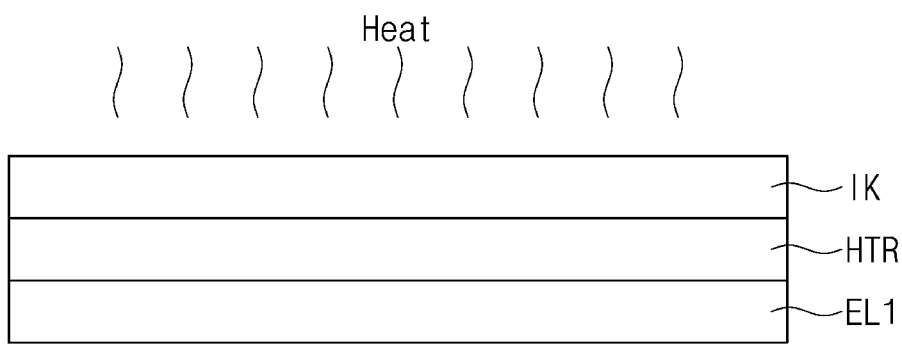
FIG. 13A is a view schematically illustrating one process (e.g., step) in a method for manufacturing a light emitting element according to an embodiment.
Figure 13B:
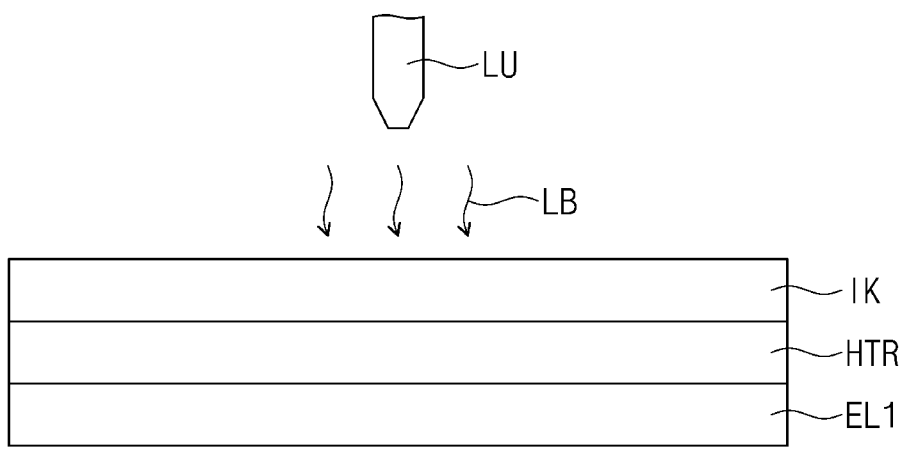
FIG. 13B is a view schematically illustrating one process (e.g., step) in a method for manufacturing a light emitting element according to an embodiment.

FIG. 13A is a view schematically illustrating providing heat S520. The providing of heat S520 may refer to providing heat to the provided mixture IK. Referring to FIG. 13A, the providing of heat S520 may refer to providing heat to the provided mixture IK to crosslink the polyphenylene vinylene-based compound and the organic compound. When the polyphenylene vinylene compound and the organic compound are crosslinked, the mixture IK may have increased flexibility and strength.

FIG. 13B is a view schematically illustrating providing light S520. The providing of light S520 may refer to providing light to the provided mixture IK. Referring to FIG. 13B, the providing of light S520 may refer to providing light to the provided mixture IK to crosslink the polyphenylene vinylene-based compound and the organic compound. When the polyphenylene vinylene compound and the organic compound are crosslinked, the mixture IK may have increased flexibility and strength.

Hereinafter, embodiments of the present disclosure will be described in more detail through specific Examples and Comparative Examples. Examples shown below are illustrated only for the understanding of the present disclosure, and the scope of the present disclosure is not limited thereto.

Preparation of Thin Film

1. Example 1-Preparation of Thin Film 1

1,1,7,7-tetraazidoheptane and poly(1,4-phenylene vinylene) were mixed in a molar ratio of 1:9, and then the mixture was added to a THF solvent to prepare a 0.5% mixture. The prepared 0.5% mixture was provided on a flexible polydimethylsiloxane (PDMS) film, utilizing a spin coater, to form a coating layer, and the resultant was dried and heat treated at 230° C. for 30 minutes utilizing a hotplate to form a flexible single film. The heat-treated single film was post-baked at 180° C. for 30 minutes in a heating oven in a nitrogen atmosphere to prepare a 200 nm thick thin film 1.

2. Example 2-Preparation of Thin Film 2

Thin film 2 was prepared in the same manner as thin film 1, except that 1,1,7,7-tetraazidoheptane and poly(1,4-phenylene vinylene) were mixed in a molar ratio of 2:8.

3. Example 3-Preparation of Thin Film 3

Thin film 3 was prepared in the same manner as thin film 1, except that 1,1,7,7-tetraazidoheptane and poly(1,4-phenylene vinylene) were mixed in a molar ratio of 3:7.

4. Comparative Example—Preparation of Thin Film 4

Thin film 4 was prepared in the same manner as thin film 1, except that 1,1,7,7-tetraazidoheptane was not added, and only the remaining materials were utilized.
Evaluation of Flexibility Characteristics
1. (Characteristic Evaluation 1)

After increasing the strain from 0% to 10% or to 20% for thin films 1 to 4, the strain was reduced back to 0% and the cycle was repeated 10 times, and then the presence or absence of cracks in the thin films was checked utilizing a microscope to evaluate flexibility characteristics. The crack generation was determined based on whether 10 or more cracks of 0.1 μm or greater were generated in a 5 μm×5 μm thin film, and the results are shown in Table 1 below.

TABLE 1

| Sample | 10% | 20% |
|---|---|---|
| Thin film 1 | X | X |
| Thin film 2 | X | X |
| Thin film 3 | X | X |
| Thin film 4 (Comparative Example) | X | ○ |

Referring to Table 1, the results of evaluating the characteristics based on the strain 20% showed that cracks were generated only in Comparative Example 4. In this regard, it is confirmed that when 1,1,7,7-tetraazidoheptane was added to the thin films, the flexibility increased compared to the case where 1,1,7,7-tetraazidoheptane was not added to the thin films.

2. (Characteristic Evaluation 2)

After increasing the strain from 0% to 10% or to 20% for thin films 1 to 4, the strain was reduced back to 0% and the cycle was repeated 100 times, and then the presence or absence of cracks in the thin films was checked using a microscope to evaluate flexibility characteristics. The crack generation was determined based on whether 10 or more cracks of 0.1 μm or greater were caused in a 5 μm×5 μm thin film, and the results are shown in Table 2 below.

TABLE 2

| Sample | 10% | 20% |
|---|---|---|
| Thin film 1 | X | X |
| Thin film 2 | X | X |
| Thin film 3 | ○ | ○ |
| Thin film 4 (Comparative Example) | ○ | ○ |

Referring to Table 2, the results of evaluating the characteristics based on the strain 10% and 20% showed that cracks were caused only in Thin Films 3 and 4. In this regard, it is confirmed that when 1,1,7,7-tetraazidoheptane was added to the thin films in a molar ratio of 20% or less, the flexibility increased compared to the case where 1,1,7,7-tetraazidoheptane was not added to the thin films or was added in a molar ratio of greater than 20%.

An embodiment may provide a light emitting element including an emission layer containing a crosslinked polymer to have improved flexibility and strength, and a display device including the same.

An embodiment may provide a method for manufacturing a light emitting element including an emission layer having improved flexibility and strength by including forming an emission layer using a mixture of a crosslinking agent and a polymer.

An embodiment may provide a light emitting element including an emission layer containing a crosslinked polymer to have improved flexibility and strength, and a display device including the same.

An embodiment may provide a method for manufacturing a light emitting element including an emission layer having improved flexibility and strength by including forming an emission layer containing a crosslinked polymer.

Although the present disclosure has been described with reference to a preferred embodiment of the present disclosure, it will be understood that the present disclosure should not be limited to these preferred embodiments but various suitable changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:
1. A light emitting element comprising:
a first electrode;
a hole transport region on the first electrode;
an emission layer on the hole transport region and comprising a light emitting polymer compound derived from a first mixture of a polyphenylene vinylene-based compound having a weight average molecular weight of about $1.3 \times 10^6$ to about $1.6 \times 10^6$ and an organic compound represented by Formula 1; and
a second electrode on the emission layer,
wherein, in the first mixture, the polyphenylene vinylene-based compound and the organic compound have a molar ratio of about 9:1 to about 8:2,
wherein the polyphenylene vinylene-based compound is poly(1,4-phenylene vinylene),

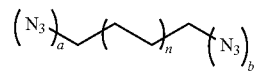

Formula 1 wherein in Formula 1,
n is an integer of 5 to 20, and
a and b are each independently 2, and
wherein the hole transport region comprises a hole transport polymer compound derived from a crosslinking reaction of a second mixture of a hole-transporting polymer and an organic compound, the organic compound being a crosslinking agent for the hole-transporting polymer.

2. The light emitting element of claim 1, wherein the light emitting polymer compound is formed when the polyphenylene vinylene-based compound is cross-linked with the organic compound.

3. The light emitting element of claim 1, wherein
the hole transport region comprises a hole injection layer, and a hole transport layer on the hole injection layer, and
at least one of the hole injection layer or the hole transport layer comprises the hole transport polymer compound.

4. The light emitting element of claim 1, further comprising an electron transport region between the emission layer and the second electrode,
wherein the electron transport region comprises an electron transport polymer compound derived from a crosslinking reaction of a mixture of an electron-transporting polymer and an organic compound, the organic compound being a crosslinking agent for the electron-transporting polymer.

5. The light emitting element of claim 4, wherein the electron transport region comprises an electron injection layer, and an electron transport layer on the electron injection layer, and
at least one of the electron injection layer or the electron transport layer comprises the electron transport polymer compound.

6. A display device comprising:
a base layer; and
a light emitting element on the base layer,
wherein the light emitting element comprises:
a first electrode;
a hole transport region on the first electrode;
an emission layer on the hole transport region and comprising a light emitting polymer compound derived from a first mixture of a polyphenylene vinylene-based compound having a weight average molecular weight of about $1.3 \times 10^6$ to about $1.6 \times 10^6$ and an organic compound represented by Formula 1; and
a second electrode on the emission layer,
wherein in the first mixture, the polyphenylene vinylene-based compound and the organic compound have a molar ratio of about 9:1 to about 8:2,
wherein the polyphenylene vinylene-based compound is poly(1,4-phenylene vinylene),

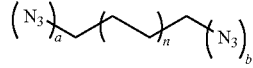

Formula 1 wherein in Formula 1,
n is an integer of 5 to 20, and
a and b are each independently 2, and
wherein the hole transport region comprises a hole transport polymer compound derived from a crosslinking reaction of a second mixture of a hole-transporting polymer and an organic compound, the organic compound being a crosslinking agent for the hole-transporting polymer.

7. The display device of claim 6, wherein the light emitting polymer compound is formed when the polyphenylene vinylene-based compound and the organic compound are cross-linked.

8. The display device of claim 6, wherein
the hole transport region comprises a hole injection layer, and a hole transport layer on the hole injection layer, and
at least one of the hole injection layer or the hole transport layer comprises the hole transport polymer compound.

9. The display device of claim 6, wherein the display device comprises:
a first state having a first area on a plane; and
a second state having a second area larger than the first area on the plane.

10. The display device of claim 6, wherein
the display device has a folded state and a non-folded state, and
in the folded state, the display device comprises a folding area that is folded with respect to a folding axis, which is a virtual line extending in a first direction, and a first non-folding area and a second non-folding area spaced apart from each other in a second direction crossing the first direction with respect to the folding area.

11. The display device of claim 6, wherein the emission layer has flexibility.

12. A method for manufacturing a light emitting element, the method comprising:
forming a hole transport region on a first electrode;
providing a first mixture containing a polyphenylene vinylene-based compound and an organic compound represented by Formula 1 in a molar ratio of about 9:1 to about 8:2 on the hole transport region to form an emission layer; and
forming a second electrode on the emission layer,
wherein the polyphenylene vinylene-based compound is poly(1,4-phenylene vinylene),

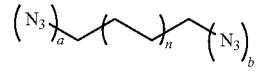

Formula 1 wherein in Formula 1,
n is an integer of 5 to 20, and
a and b are each independently 2, and
wherein the hole transport region comprises a hole transport polymer compound derived from a crosslinking reaction of a second mixture of a hole-transporting polymer and an organic compound, the organic compound being a crosslinking agent for the hole-transporting polymer.

13. The method of claim 12, wherein the forming of the emission layer comprises depositing the first mixture through inkjet printing.

14. The method of claim 12, wherein the forming of the emission layer comprises:
depositing the first mixture; and
providing heat or ultraviolet light to the first mixture.

15. The method of claim 14, wherein the providing of heat or ultraviolet light to the first mixture comprises crosslinking the polyphenylene vinylene-based compound and the organic compound.

* * * * *